(12) United States Patent
Omi et al.

(10) Patent No.: US 10,910,684 B2
(45) Date of Patent: Feb. 2, 2021

(54) MACHINE TEMPERATURE CONTROL DEVICE

(71) Applicant: DENSO CORPORATION, Kariya (JP)

(72) Inventors: Yasumitsu Omi, Kariya (JP); Takeshi Yoshinori, Kariya (JP); Masayuki Takeuchi, Kariya (JP); Koji Miura, Kariya (JP)

(73) Assignee: DENSO CORPORATION, Kariya (JP)

( * ) Notice: Subject to any disclaimer, the term of this patent is extended or adjusted under 35 U.S.C. 154(b) by 83 days.

(21) Appl. No.: 16/373,683

(22) Filed: Apr. 3, 2019

(65) Prior Publication Data

US 2019/0226767 A1 Jul. 25, 2019

Related U.S. Application Data

(63) Continuation of application No. PCT/JP2017/026349, filed on Jul. 20, 2017.

(30) Foreign Application Priority Data

Oct. 6, 2016 (JP) ................................ 2016-198094

(51) Int. Cl.
*H01M 10/613* (2014.01)
*H01L 23/427* (2006.01)
(Continued)

(52) U.S. Cl.
CPC ...... *H01M 10/613* (2015.04); *B60H 1/00278* (2013.01); *F28D 15/0275* (2013.01);
(Continued)

(58) Field of Classification Search
CPC .. F28D 15/02; F28D 15/0275; H01M 10/613; H01M 10/625; H01L 23/427; B60H 1/00278
See application file for complete search history.

(56) References Cited

U.S. PATENT DOCUMENTS

2007/0234741 A1  10/2007 Lee et al.
2011/0000241 A1* 1/2011 Favaretto ............ H01M 10/613
                                               62/244
(Continued)

FOREIGN PATENT DOCUMENTS

| JP | 2012009646 A | 1/2012 |
| JP | 2014047962 A | 3/2014 |
| JP | 5942943 B2 | 6/2016 |

*Primary Examiner* — Devon Russell
(74) *Attorney, Agent, or Firm* — Harness, Dickey & Pierce, P.L.C.

(57) ABSTRACT

A first thermosiphon circuit includes a first evaporator configured to cool a first target device by a latent heat of evaporation of a working fluid that absorbs a heat from the first target device, and a first passage communicating with the first evaporator. A second thermosiphon circuit includes a second evaporator configured to cool a second target device by a latent heat of evaporation of a working fluid that absorbs a heat from the second target device, and a second passage communicating with the second evaporator. A main condenser includes a first heat exchanger provided in the first passage and a second heat exchanger provided in the second passage, and is configured to allow the working fluid flowing through the first heat exchanger, the working fluid flowing through the second heat exchanger, and a predetermined cold energy supply medium to exchange heat with each other.

9 Claims, 32 Drawing Sheets

(51) Int. Cl.
*H01M 10/625* (2014.01)
*B60H 1/00* (2006.01)
*F28D 15/02* (2006.01)
*H01L 23/46* (2006.01)

(52) U.S. Cl.
CPC ........ *H01L 23/427* (2013.01); *H01M 10/625* (2015.04); *F28D 15/02* (2013.01); *H01L 23/46* (2013.01)

(56) References Cited

U.S. PATENT DOCUMENTS

| | | | |
|---|---|---|---|
| 2011/0138849 A1* | 6/2011 | Hirano | F28D 15/0266 |
| | | | 62/513 |
| 2011/0232873 A1* | 9/2011 | Seki | F25D 11/025 |
| | | | 165/104.21 |
| 2012/0003510 A1* | 1/2012 | Eisenhour | H01M 10/613 |
| | | | 429/50 |
| 2012/0003515 A1* | 1/2012 | Eisenhour | H01M 10/6555 |
| | | | 429/62 |
| 2014/0326010 A1* | 11/2014 | Kawakami | F25B 41/04 |
| | | | 62/222 |
| 2015/0266392 A1* | 9/2015 | Arai | H01M 10/615 |
| | | | 320/150 |
| 2016/0204488 A1* | 7/2016 | Arai | H01M 10/613 |
| | | | 429/62 |
| 2016/0268655 A1* | 9/2016 | Takamatsu | H01M 10/6554 |
| 2017/0179551 A1* | 6/2017 | Shepard | H01G 11/82 |
| 2018/0006347 A1* | 1/2018 | Porras | H01M 10/633 |
| 2018/0097266 A1* | 4/2018 | Jalilevand | B60H 1/3205 |
| 2018/0194197 A1* | 7/2018 | Kozasa | F25B 1/04 |

* cited by examiner

MACHINE TEMPERATURE CONTROL DEVICE

CROSS REFERENCE TO RELATED APPLICATION

The present application is a continuation application of International Patent Application No. PCT/JP2017/026349 filed on Jul. 20, 2017, which designated the United States and claims the benefit of priority from Japanese Patent Application No. 2016-198094 filed on Oct. 6, 2016. The entire disclosures of all of the above applications are incorporated herein by reference.

TECHNICAL FIELD

The present disclosure relates to a machine temperature control device that controls a temperature of a target device.

BACKGROUND ART

In recent years, a technique using a thermosiphon circuit as a machine temperature control device has been studied for controlling a temperature of an electric device such as an electric storage device mounted on an electric drive vehicle such as an electric vehicle or a hybrid vehicle.

SUMMARY

According to an aspect of the present disclosure, a machine temperature control device for controlling a temperature of a plurality of target devices, the machine temperature control device includes:

a first thermosiphon circuit that includes a first evaporator configured to cool a first target device by a latent heat of evaporation of a working fluid that absorbs a heat from the first target device, and a first passage communicating with the first evaporator;

a second thermosiphon circuit that includes a second evaporator configured to cool a second target device by a latent heat of evaporation of a working fluid that absorbs a heat from the second target device, and a second passage communicating with the second evaporator; and a main condenser that includes a first heat exchanger provided in the first passage and a second heat exchanger provided in the second passage, to allow the working fluid flowing through the first heat exchanger, the working fluid flowing through the second heat exchanger, and a predetermined cold energy supply medium to exchange heat with each other.

DESCRIPTION OF EMBODIMENTS

Figure 1:
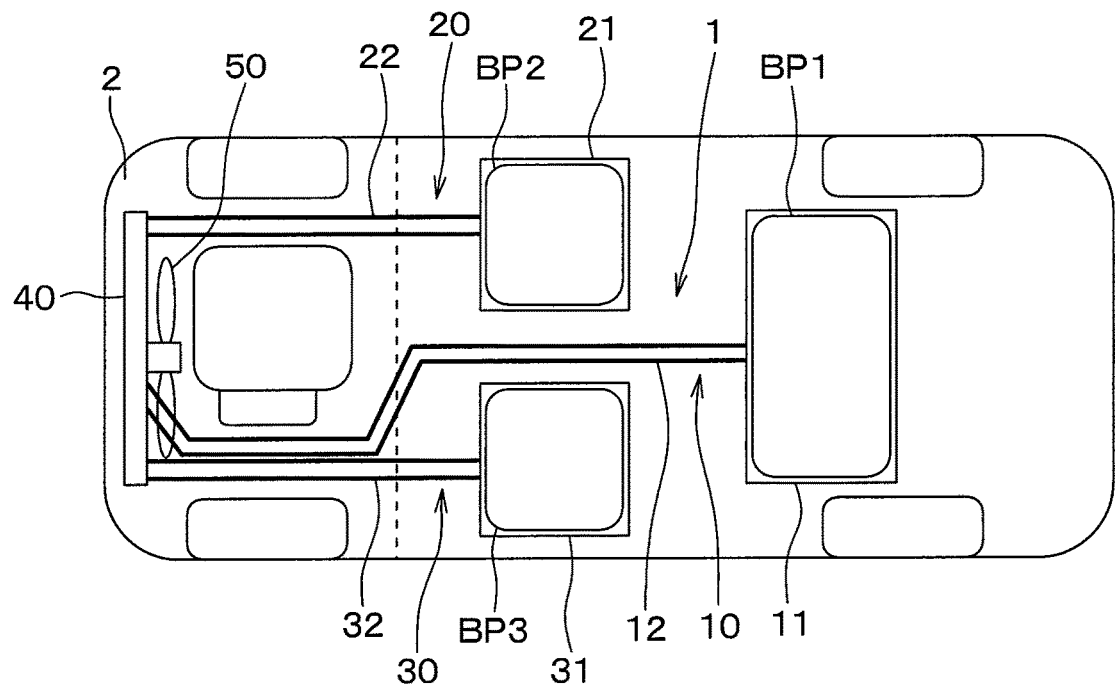
FIG. 1 is a schematic view illustrating a vehicle including a machine temperature control device according to a first embodiment, seen from an upper side.

To begin with, examples of relevant techniques will be described.

A machine temperature control device includes a thermosiphon circuit in which a working fluid is sealed. An evaporator provided on a side surface of a battery as a target device to be subjected to a temperature control and a condenser provided above the evaporator are connected to each other by a pipe. In the thermosiphon circuit, when the battery generates a heat, the working fluid in the evaporator boils, and the battery is cooled by a latent heat of evaporation at that time. A gas phase working fluid boiled in the evaporator rises in the pipe and flows into the condenser. The condenser condenses the gas phase working fluid by a heat exchange with a predetermined cold energy supply medium. The working fluid in the liquid phase condensed in the condenser descends in the pipe by its own weight and flows into the evaporator. Such natural circulation of the working fluid cools the battery, which is the target device.

Incidentally, a battery mounted on an electric vehicle or a hybrid vehicle has a large body size and weight, and therefore may be disposed in multiple places of a vehicle body, such as under a floor, under a seat, or under a baggage compartment. In this case, multiple thermosiphon circuits are mounted on the vehicle in order to cool the batteries mounted at multiple locations. In this case, since there is a difference in height of the batteries mounted in the multiple places of the vehicle, if the evaporators or the condensers of the multiple thermosiphon circuits are connected in series with each other, a difference in height occurs in the pipe around the vehicle body, such that the circulation of the working fluid is deteriorated.

On the other hand, if the multiple thermosiphon circuits are individually disposed at the multiple positions of the vehicle body, the following issues arise. First, a space for mounting the multiple condensers provided in the multiple thermosiphon circuits is required in an engine compartment, and multiple facilities for supplying the cold energy supply medium for exchanging a heat with the working fluid flowing through the multiple condensers are required. Further, the pipe for connecting the evaporator and the condenser in the thermosiphon circuit becomes long, and the pipe also becomes complicated. In particular, in the thermosiphon circuit, since the working fluid in the liquid phase flows from the condenser to the evaporator by its own weight, it is difficult to dispose the pipe in consideration of a vertical positional relationship.

Further, if the number of batteries mounted on the vehicle increases or decreases according to the vehicle type, the number of components and design workloads of the multiple thermosiphon circuits may increase accordingly. Therefore, in the machine temperature control device using the multiple thermosiphon circuits, it is required to improve the vehicle mountability and the flexibility in vehicle mounting by reducing the number of components and simplifying the configuration.

The present disclosure provides a machine temperature control device capable of reducing the number of components, improving vehicle mountability, and improving the flexibility of vehicle mounting.

According to an aspect of the present disclosure, a machine temperature control device for controlling a temperature of a plurality of target devices, the machine temperature control device includes:

a first thermosiphon circuit that includes a first evaporator configured to cool a first target device by a latent heat of evaporation of a working fluid that absorbs a heat from the first target device, and a first passage communicating with the first evaporator;

a second thermosiphon circuit that includes a second evaporator configured to cool a second target device by a latent heat of evaporation of a working fluid that absorbs a heat from the second target device, and a second passage communicating with the second evaporator; and a main condenser that includes a first heat exchanger provided in the first passage and a second heat exchanger provided in the second passage, to allow the working fluid flowing through the first heat exchanger, the working fluid flowing through the second heat exchanger, and a predetermined cold energy supply medium to exchange heat with each other.

According to the above configuration, the main condenser functions as the condenser both in the first and second thermosiphon circuits. This makes it possible to reduce the facilities for supplying the cold energy supply medium for exchanging the heat with the working fluid flowing through the first and second passages. Therefore, the machine temperature control device can have a simple configuration.

In addition, since the condenser functions of the first and second thermosiphon circuits are integrated by the main condenser, a space utilization efficiency is improved as compared with the case where the respective condensers are installed at different locations. Therefore, the above machine temperature control device can improve the vehicle mountability and the flexibility of the vehicle mounting.

Further, the condensing functions of the first and second thermosiphon circuits are integrally configured by the main condenser, as a result of which a temperature of the working fluid flowing through the first passage and a temperature of the working fluid flowing through the second passage can be brought close to each other. Therefore, the machine temperature control device can control the temperatures of the multiple target devices substantially uniformly.

According to another aspect, a machine temperature control device for controlling a temperature of a plurality of target devices, the machine temperature control device includes:

a first thermosiphon circuit that includes a first evaporator configured to cool a first target device by a latent heat of evaporation of a working fluid that absorbs a heat from the first target device, and a first passage communicating with the first evaporator;

a second thermosiphon circuit that includes a second evaporator configured to cool a second target device by a latent heat of evaporation of a working fluid that absorbs a heat from the second target device, and a second passage communicating with the second evaporator;

a main condenser that includes a first heat exchanger provided in the first passage to exchange heat between the working fluid flowing through the first heat exchanger and a predetermined cold energy supply medium; and a sub condenser disposed below the main condenser in the gravitational direction. The sub condenser includes a lower heat exchanger in the first passage, and the lower heat exchanger is located below the first heat exchanger in the gravitational direction. The sub condenser includes a second heat exchanger provided in the second passage, to exchange heat between the working fluid flowing through the lower heat exchanger and the working fluid flowing through the second heat exchanger.

According to the above configuration, in the main condenser, the working fluid of the first thermosiphon circuit is condensed by the cold energy of the predetermined cold energy supply medium. In the sub condenser, the working fluid of the second thermosiphon circuit is condensed by the cold energy of the working fluid in the first thermosiphon circuit which has exchanged heat with a predetermined cold energy supply medium. This makes it possible to easily mount multiple thermosiphon circuits in a vehicle without providing a facility for supplying a cold energy supply medium to the second thermosiphon circuit. In other words, even when the number of batteries mounted on the vehicle increases or decreases according to the vehicle type and the number of thermosiphon circuits increases or decreases according to the number of batteries, passages provided in the thermosiphon circuits whose number is increased or decreased are installed in the sub condenser, thereby being capable of reducing the design workload and the number of components according to the vehicle type. Therefore, the machine temperature control device can improve the vehicle mountability and the flexibility of mounting.

Further, the cold energy to be supplied from the cold energy supply medium of the main condenser to the working fluid of the first thermosiphon circuit is distributed by the sub condenser to the working fluid of the multiple thermosiphon circuits, thereby being capable of cooling the multiple target devices. Therefore, the number of components of the machine temperature control device can be reduced, and the configuration can be simplified.

Further, the sub condenser makes it possible to bring the temperature of the working fluid flowing through the lower heat exchanger and the temperature of the working fluid flowing through the second heat exchanger close to each other. Therefore, the temperatures of the multiple target devices can be regulated to substantially uniform values.

In the present specification, the first, second, third, and the like are merely described for convenience of description, and their configurations have substantially the same function. Further, when the description of the present disclosure includes the first and second configurations, a third configuration or more configurations are included in the technical scope of the present disclosure.

Hereinafter, embodiments will be described according to the drawings. Same or equivalent portions among respective embodiments below are labeled with same reference numerals in the drawings.

First Embodiment

The machine temperature control device according to the present embodiment is mounted on an electric drive vehicle (hereinafter, simply referred to as a "vehicle") such as an electric vehicle or a hybrid vehicle. As shown in FIGS. 1 to 4, a machine temperature control device 1 functions as a cooling device for cooling secondary batteries BP mounted on a vehicle 2. In the drawing, the batteries BP placed at the respective locations of the vehicle 2 are denoted by symbols BP1, BP2, and BP3.

First, the batteries BP as a target device to be cooled by the machine temperature control device 1 will be described.

In the vehicle 2 in which the machine temperature control device 1 is mounted, an electric power stored in electric storage devices (in other words, battery packs) including the batteries BP as main components is supplied to a vehicle traveling motor through an inverter or the like. The batteries BP generate self-heat when the vehicle is in use, for example, while the vehicle is traveling. Further, when the temperature of the batteries BP becomes high, not only a sufficient function cannot be exhibited, but also deterioration and damage are caused, so that a cooling device for maintaining the batteries BP at a predetermined temperature or lower is required.

In addition, in a season in which an outside air temperature is high, such as the summer season, a temperature of the batteries BP rises not only while the vehicle is traveling but also while the vehicle is parked and left. Further, the batteries BP are often disposed under a floor or a trunk room of the vehicle 2, and although the amount of heat per unit time given to the batteries BP is small, the temperature of the batteries BP gradually rises by leaving the batteries BP for a long time. Since a life of the batteries BP is shortened when the batteries BP are left at a high temperature state, it is desired to maintain the temperature of the batteries BP at a low temperature by cooling the batteries BP even while the vehicle 2 is left undisturbed.

Furthermore, although each battery BP is configured as an assembled battery BP including a plurality of battery cells BC, if there is a variation in the temperature of each battery cell BC, a deviation occurs in the deterioration of the battery cells BC, and a power storage performance of the batteries BP deteriorates. This is because input/output characteristics of the electric storage device are determined in accordance with the characteristics of the most deteriorated battery cell BC. For that reason, in order for the batteries BP to exhibit a desired performance over a long period of time, it is important to equalize the temperature of the multiple battery cells BC so as to reduce the temperature variation among the multiple battery cells BC.

As another cooling device for cooling the batteries BP, air blowing using a blower, air cooling or a water cooling using a refrigeration cycle, or a direct refrigerant cooling system is generally employed. However, since the blower only blows an air in a vehicle interior, a cooling capacity is low. In addition, since the batteries BP are cooled by a sensible heat of the air in blowing by the blower, a temperature difference between upstream and downstream of an air flow becomes large, and the temperature variation among the multiple battery cells BC cannot be sufficiently reduced. Further, since the batteries BP are cooled by the sensible heat of the air or water in either of air cooling or water cooling, the temperature variation among the battery cells BC cannot be sufficiently reduced. Further, although the refrigeration cycle system has a high cooling capacity, it is not preferable to drive a compressor or a cooling fan of the refrigeration cycle while the vehicle 2 is parked because of an increase in power consumption, noise, and the like.

From the viewpoints of the above backgrounds, the machine temperature control device 1 according to the present embodiment adopts a thermosiphon device in which the temperature of the batteries BP is regulated by natural circulation of the working fluid, rather than by forced circulation of the working fluid by the compressor.

Next, a configuration of the machine temperature control device 1 will be described.

Figure 2:
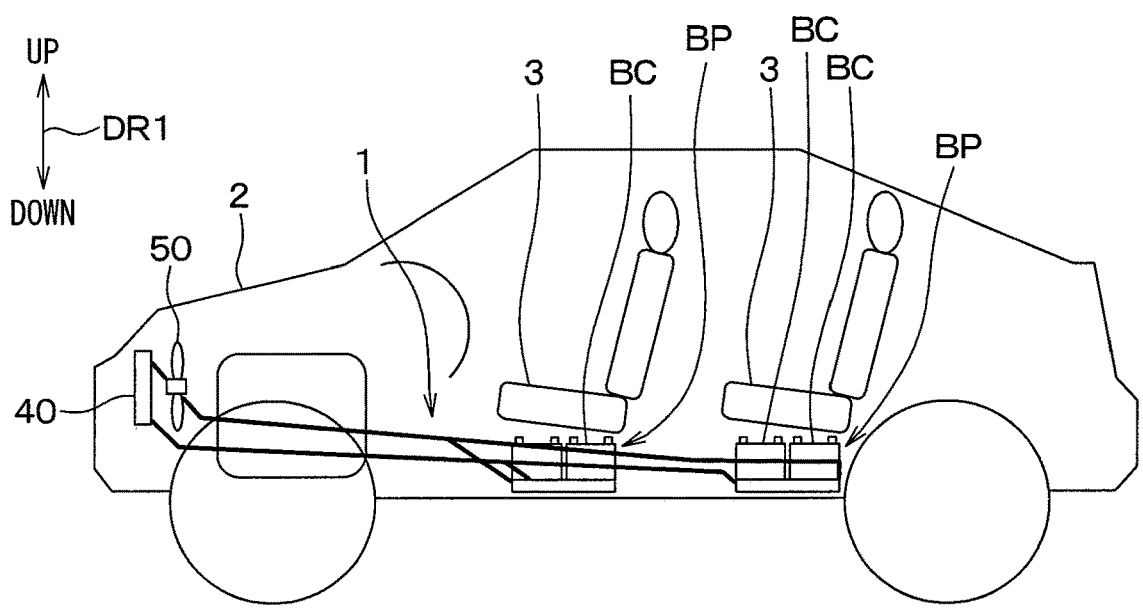
FIG. 2 is a schematic view illustrating the vehicle in FIG. 1, seen from a lateral side.

The machine temperature control device 1 according to the present embodiment regulates the temperatures of the multiple batteries BP. As shown in FIGS. 1 and 2, the multiple batteries BP are disposed under the floor of the vehicle 2, under seats 3, or under a baggage compartment. In the following description, the multiple batteries BPs disposed at each location of the vehicle 2 are referred to as a first battery BP1, a second battery BP2, and a third battery BP3.

The machine temperature control device 1 includes a first thermosiphon circuit 10 for cooling the first battery BP1, a second thermosiphon circuit 20 for cooling the second battery BP2, and a third thermosiphon circuit 30 for cooling the third battery BP3. Since the first thermosiphon circuit 10, the second thermosiphon circuit 20, and the third thermosiphon circuit 30 have the same basic configuration, the basic configuration of those thermosiphon circuits will be described by taking the first thermosiphon circuit 10 as an example.

Figure 3:
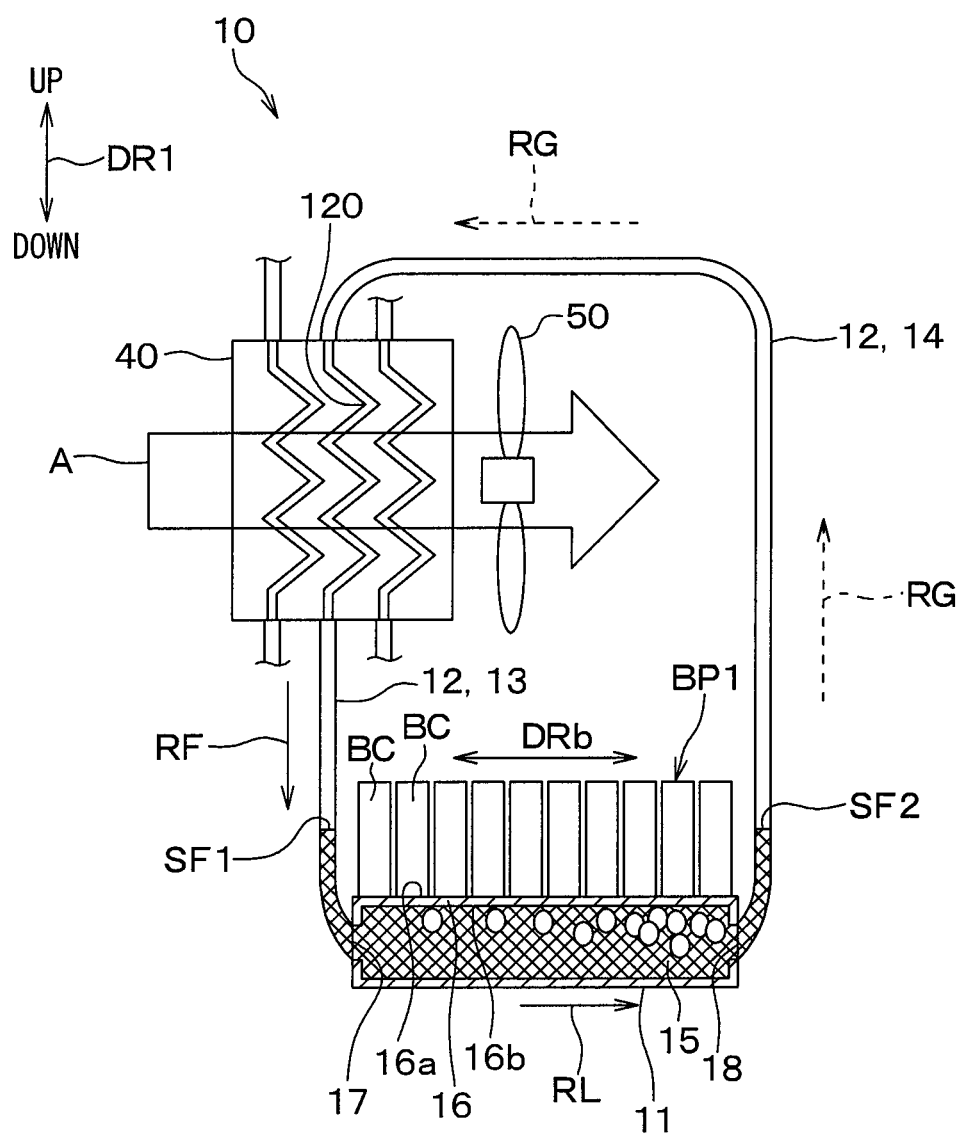
FIG. 3 is a schematic view illustrating a first thermosiphon circuit of the machine temperature control device of the first embodiment, and a battery to be cooled.

As shown in FIG. 3, the first thermosiphon circuit 10 includes a first evaporator 11, a first passage 12 communicating with the first evaporator 11, and the like. The first evaporator 11 cools the first battery BP1 by a latent heat of evaporation of the working fluid that absorbs and evaporates a heat from the first battery BP1.

A first heat exchanger 120 provided in the middle of the first passage 12 passes through a main condenser 40 and configures a part of the main condenser 40. The main condenser 40 performs a heat exchange between the working fluid flowing through the first heat exchanger 120 and a predetermined cold energy supply medium. Details of the main condenser 40 will be described later.

The first passage 12 includes a first forward passage 13 through which the working fluid of a liquid phase condensed in the first heat exchanger 120 in the main condenser 40 flows to the first evaporator 11, and a first return passage 14 through which the working fluid of a gas phase evaporated in the first evaporator 11 flows to the first heat exchanger 120 in the main condenser 40. Therefore, the first forward passage 13, the first heat exchanger 120, and the first return passage 14 of the first passage 12 are annularly connected to the first evaporator 11.

Figure 4:
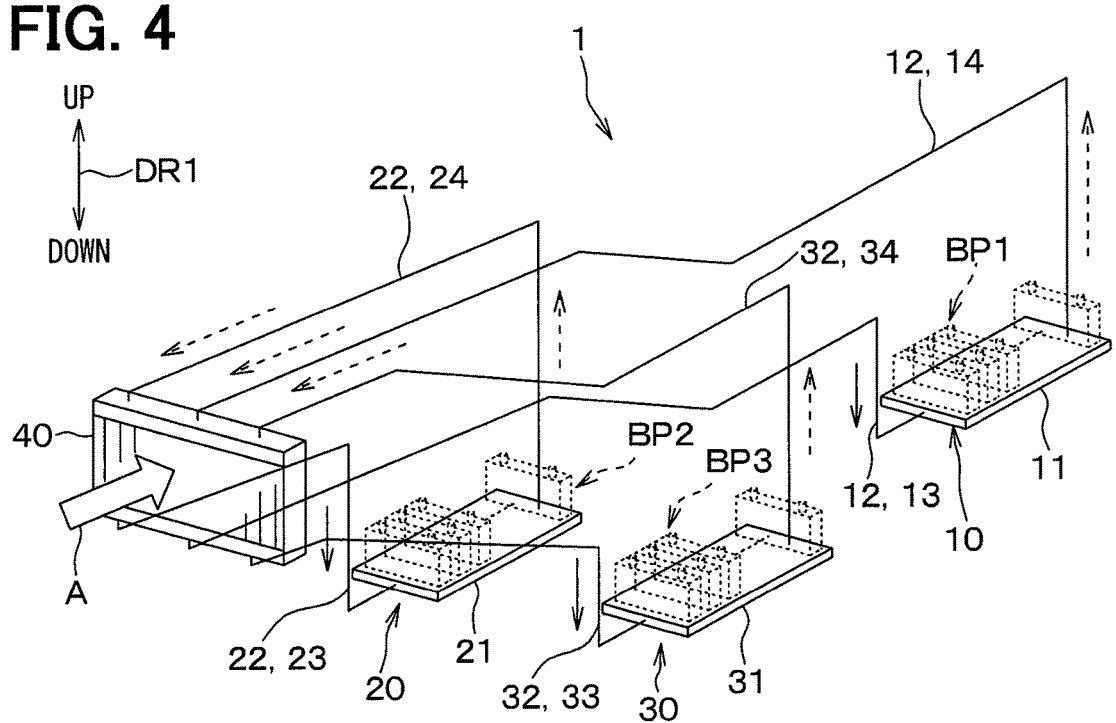
FIG. 4 is a perspective view illustrating the machine temperature control device of the first embodiment.
Figure 5:
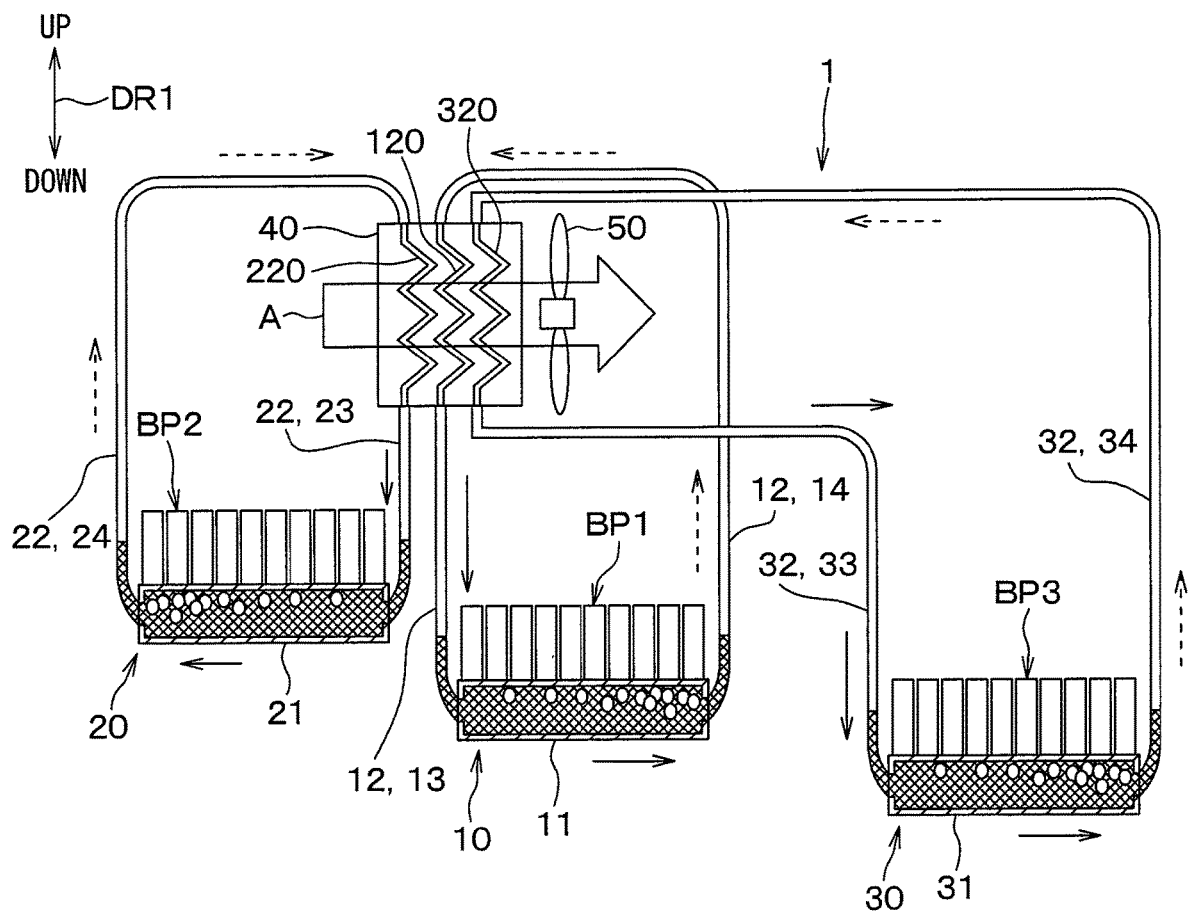
FIG. 5 is a schematic view illustrating the machine temperature control device of the first embodiment.

The first thermosiphon circuit 10 is a heat pipe that performs a heat transfer by evaporation and condensation of the working fluid. The first thermosiphon circuit 10 is configured to be a loop-type thermosiphon circuit in which the first forward passage 13 through which the liquid phase working fluid flows and the first return passage 14 through which the gas phase working fluid flows are separated from each other. In FIG. 2, an arrow DR1 indicates a vehicle vertical direction DR1. In FIGS. 3 to 5, the arrow DR1 indicates a gravitational up and down direction in the first to third thermosiphon circuits 10, 20, and 30, and does not indicate the gravitational up and down direction in other configurations except for the first, second, and third thermosiphon circuits 10, 20, and 30.

The working fluid is encapsulated in the first thermosiphon circuit 10. The first thermosiphon circuit 10 is filled with the working fluid. The working fluid filled in the first thermosiphon circuit 10 is, for example, a fluorocarbon refrigerant such as HFO-1234yf or HFC-134a. The working fluid circulates through the first thermosiphon circuit 10. The first thermosiphon circuit 10 cools the first battery BP1 by a phase change between the liquid phase and the gas phase of the working fluid. In FIG. 3, a direction in which the working fluid in the liquid phase flows is indicated by a solid arrow RL, and a direction in which the working fluid in the gas phase flows is indicated by a broken arrow RG. In the drawings after FIG. 4, the reference numerals RL and RG respectively attached to the solid line arrow and the broken line arrow in FIG. 3 are omitted.

The first evaporator 11 included in the first thermosiphon circuit 10 is a battery cooling unit that absorbs a heat from the first battery BP1 into the working fluid. The first evaporator 11 cools the first battery BP1 by transferring the heat from the first battery BP1 to the working fluid. The first evaporator 11 is made of metal having high thermal conductivity, for example. A fluid chamber 15 for storing the working fluid is provided inside the first evaporator 11. The first evaporator 11 evaporates the working fluid in the fluid chamber 15 by absorbing the heat from the first battery BP1 into the working fluid in the fluid chamber 15.

The first battery BP1 cooled by the first evaporator 11 includes the multiple battery cells BC electrically connected in series with each other. The multiple battery cells BC are stacked in a battery stacking direction DRb, and the battery stacking direction DRb becomes a horizontal direction in a vehicle horizontal state in which the vehicle 2 is horizontally placed.

In the present embodiment, the batteries BP are disposed under the floor of the vehicle 2, under the seats 3, or under the baggage compartment. For that reason, similarly, the first evaporator 11 is also disposed under the floor of the vehicle 2, under the seat 3, or under the baggage compartment. It should be noted that, although it is described confirmatively, each of the drawings is a schematic diagram, and does not show a shape of each configuration, and does not show specific connection points of the first forward passage 13 and the first return passage 14 connected to the first evaporator 11 and the main condenser 40, respectively.

The first evaporator 11 has, for example, a rectangular parallelepiped shape, and is formed so as to extend in the battery stacking direction DRb. The first evaporator 11 has an upper surface portion 16 on which an upper surface 16a of the first evaporator 11 is formed. In other words, an upper inner wall surface 16b forming an upper side of the fluid chamber 15 is formed on a side of the upper surface portion 16 opposite to the upper surface 16a.

The amount of the working fluid filled in the first thermosiphon circuit 10 is such that the fluid chamber 15 is filled with the working fluid of the liquid phase in the vehicle horizontal state when the working fluid of the liquid phase accumulated in the fluid chamber 15 does not contain bubbles due to boiling or the like. For that reason, a liquid level of the liquid phase working fluid is formed in the first forward passage 13 and the first return passage 14, and is positioned above an upper inner wall surface 16b of the first evaporator 11. In FIG. 3, in a state in which the first thermosiphon circuit 10 is not cooling the batteries BP, a liquid level position of the liquid phase working fluid in the first forward passage 13 is indicated by SF1, and the liquid level position of the liquid phase working fluid in the first return passage 14 is indicated by SF2.

The multiple battery cells BC are disposed side by side on the upper surface 16a of the first evaporator 11. Each of the multiple battery cells BC is thermally connected to the upper surface 16 of the first evaporator 11 so as to be able to be thermally conductive with the upper surface portion 16. With the above configuration, the upper surface 16a of the first evaporator 11 functions as a battery cooling surface for cooling the batteries BP, and the upper surface portion 16 of the first evaporator 11 functions as a cooling surface formation portion for forming the battery cooling surface.

The first evaporator 11 is formed with an inflow port 17 and a discharge port 18. The inflow port 17 is formed, for example, at one end portion of the first evaporator 11 in the battery stacking direction DRb. The inflow port 17 communicates the first forward passage 13 with the fluid chamber 15. The first forward passage 13 is a flow channel and a pipe for allowing the working fluid to flow from the main condenser 40 to the first evaporator 11. When the working fluid circulates in the first thermosiphon circuit 10, the liquid phase working fluid flowing down through the first forward passage 13 by its own weight flows into the fluid chamber 15 from the inflow port 17.

The discharge port 18 of the first evaporator 11 communicates the first return passage 14 with the fluid chamber 15. The discharge port 18 is provided, for example, at the other end portion of the first evaporator 11 in the battery stacking direction DRb. The first return passage 14 is a flow channel and a pipe for allowing the working fluid to flow from the first evaporator 11 to the main condenser 40. When the working fluid circulates in the first thermosiphon circuit 10, the gas phase working fluid evaporated in the fluid chamber 15 flows out from the discharge port 18 to the first return passage 14.

The main condenser 40 is disposed above the first evaporator 11. The first heat exchanger 120 provided in the first passage 12 passes through the main condenser 40 and configures a part of the main condenser 40. The main condenser 40 performs a heat exchange between the working fluid flowing through the first heat exchanger 120 and a predetermined cold energy supply medium. In the first embodiment, the predetermined cold energy supply medium is air that passes through the main condenser 40 due to the rotation of a fan 50. In FIG. 3 and the like, a flow of the air is indicated by an arrow A. As will be described later in embodiments, the predetermined cold energy supply medium is not limited to the air, and may be, for example, a refrigerant, a coolant water, or the like. The gas phase working fluid flowing from the first return passage 14 to the first heat exchanger 120 in the main condenser 40 radiates the heat to the air as a predetermined cold energy supply medium when flowing through the first heat exchanger 120 in the main condenser 40, and condenses the working fluid to become the liquid phase working fluid. The liquid phase working fluid flows from the first heat exchanger 120 in the main condenser 40 to the first forward passage 13 by its own weight. The working fluid flowing through the first forward passage 13 flows into the fluid chamber 15 from the inflow port 17 of the first evaporator 11.

In the first thermosiphon circuit 10 configured as described above, when the batteries BP generates a heat, for example, during traveling of the vehicle, the heat is transmitted to the upper surface portion 16 of the first evaporator 11 through lower surfaces of the battery cells BC, and the liquid phase working fluid in the fluid chamber 15 boils by the heat. Each battery cell BC is cooled by a latent heat of evaporation due to boiling of the working fluid. The working fluid boiled in the fluid chamber 15 moves upward as a gas. The gaseous working fluid travels through the first return passage 14 to the main condenser 40.

The gas phase working fluid flowing into the main condenser 40 is cooled and liquefied by the main condenser 40, and flows again into the first evaporator 11 through the first forward passage 13. As described above, when a thermosiphon circuit phenomenon is started in the first thermosiphon circuit 10, the working fluid circulates as indicated by arrows RG and RL. In the first thermosiphon circuit 10, those operations are performed by natural circulation of the working fluid without requiring a drive device such as a compressor.

As shown in FIGS. 4 and 5, the second thermosiphon circuit 20 includes a second evaporator 21 for cooling the second battery BP2 and a second passage 22 communicating with the second evaporator 21. The second evaporator 21 cools the second battery BP2 by the latent heat of evaporation of the working fluid which absorbs the heat from the second battery BP2 and evaporates. Like the first heat exchanger 120, a second heat exchanger 220 provided in the second passage 22 also passes through the main condenser 40 and configures a part of the main condenser 40. The second passage 22 includes a second forward passage 23 through which the working fluid of the liquid phase condensed in the second heat exchanger 220 in the main condenser 40 flows to the second evaporator 21, and a second return passage 24 through which the working fluid of the gas phase evaporated in the second evaporator 21 flows to the second heat exchanger 220 in the main condenser 40. In other words, the second forward passage 23, the second heat exchanger 220, and the second return passage 24 of the second passage 22 are annularly connected to the second evaporator 21.

The third thermosiphon circuit 30 includes a third evaporator 31 for cooling the third battery BP3 and a third passage 32 communicating with the third evaporator 31. The third evaporator 31 cools the third battery BP3 by the latent heat of evaporation of the working fluid which absorbs heat from the third battery BP3 and evaporates. A third heat exchanger 320 provided in the third passage 32 also passes through the main condenser 40 like the first and second heat exchangers 120 and 220, and configures a part of the main condenser 40. The third passage 32 includes a third forward passage 33 through which the working fluid of the liquid phase condensed by the third heat exchanger 320 in the main condenser 40 flows to the third evaporator 31, and a third return passage 34 through which the working fluid of the gas phase evaporated by the third evaporator 31 flows to the third heat exchanger 320 in the main condenser 40. In other words, the third forward passage 33, the third heat exchanger 320, and the third return passage 34 included in the third passage 32 are annularly connected to the third evaporator 31.

As described above, the machine temperature control device 1 according to the first embodiment includes the main condenser 40 configured to exchange the heat between the working fluid flowing through the first to third heat exchangers 120, 220, and 320 and the air as a predetermined cold energy supply medium. The main condenser 40 includes first to third heat exchangers 120, 220, and 320, and is integrally formed with the first to third heat exchangers 120, 220, and 320. The main condenser 40 is provided in front of the vehicle 2, and with the rotation of the fan 50, an outside air can flow to the first to third heat exchangers 120, 220, and 320. The main condenser 40 is made of a metal having a high thermal conductivity such as aluminum or copper. In the main condenser 40, the first to third heat exchangers 120, 220, and 320 are disposed so as to be thermally conductive. For that reason, the working fluid flowing through the first to third heat exchangers 120, 220, and 320 can exchange a heat with the outside air, and the working fluids flowing through the first to third heat exchangers 120, 220, and 320 can also exchange the heat with each other.

In the first embodiment described above, the machine temperature control device 1 for controlling the temperature of the multiple batteries BP includes the main condenser 40 configured to exchange the heat between the working fluid flowing through the first to third heat exchangers 120, 220, and 320 and the air which is a predetermined cold energy supply medium.

As a result, since the condenser functions of the first to third thermosiphon circuits 10, 20, and 30 are integrated by the main condenser 40, the facility for supplying the cold energy supply medium for exchanging the heat with the working fluid flowing through the first to third passages 12, 22, and 32 can be reduced. Therefore, the machine temperature control device 1 can have a simple configuration.

In addition, since the condenser functions of the first to third thermosiphon circuits 10, 20, and 30 are integrated by the main condenser 40, a space utilization efficiency is improved as compared with the case where the respective condensers are installed at different locations. Therefore, the machine temperature control device 1 can improve the vehicle mountability and the flexibility in mounting the vehicle.

Further, since the condenser functions of the first to third thermosiphon circuits 10, 20, and 30 are integrally configured by the main condenser 40, the temperatures of the working fluids flowing through the first to third passages 12, 22, and 32 can be brought close to each other. Therefore, the machine temperature control device 1 can adjust the temperatures of the multiple batteries BP1, BP2, and BP3 substantially uniformly.

Second Embodiment

The second embodiment will be described. In the second embodiment, the configuration of the main condenser 40 is changed from that of the first embodiment, and the other configurations are the same as those of the first embodiment, and therefore, only portions different from those of the first embodiment will be described.

Figure 6:
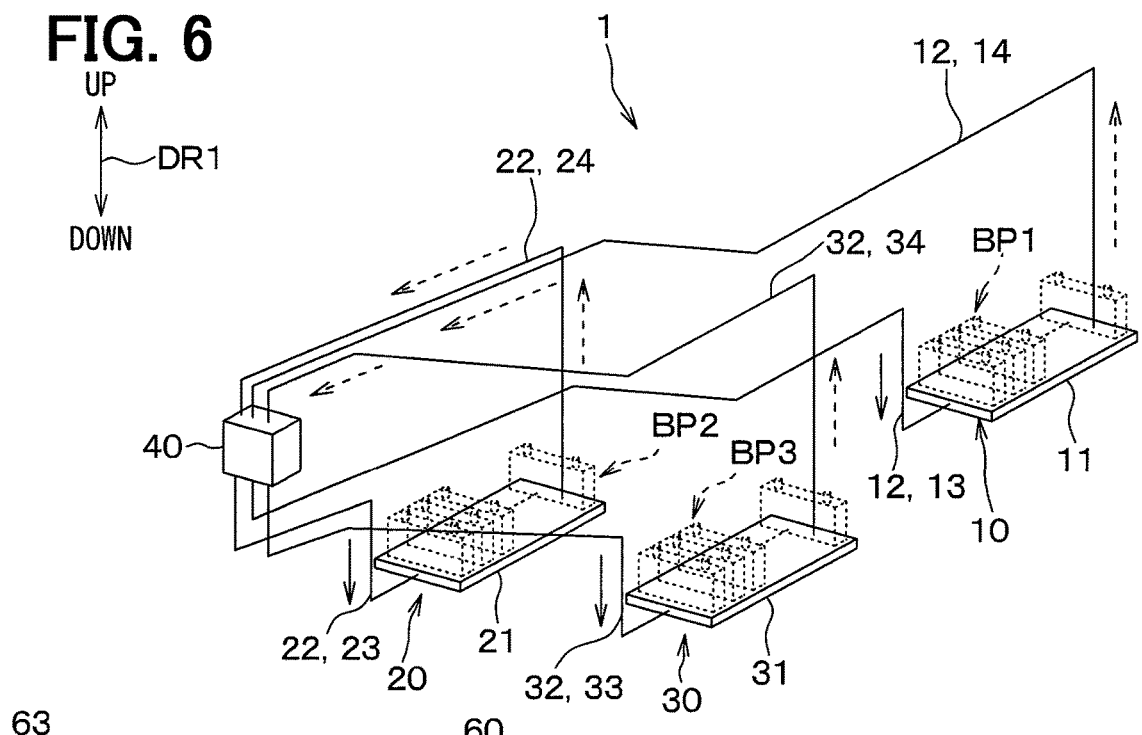
FIG. 6 is a perspective view illustrating a machine temperature control device according to a second embodiment.
Figure 7:
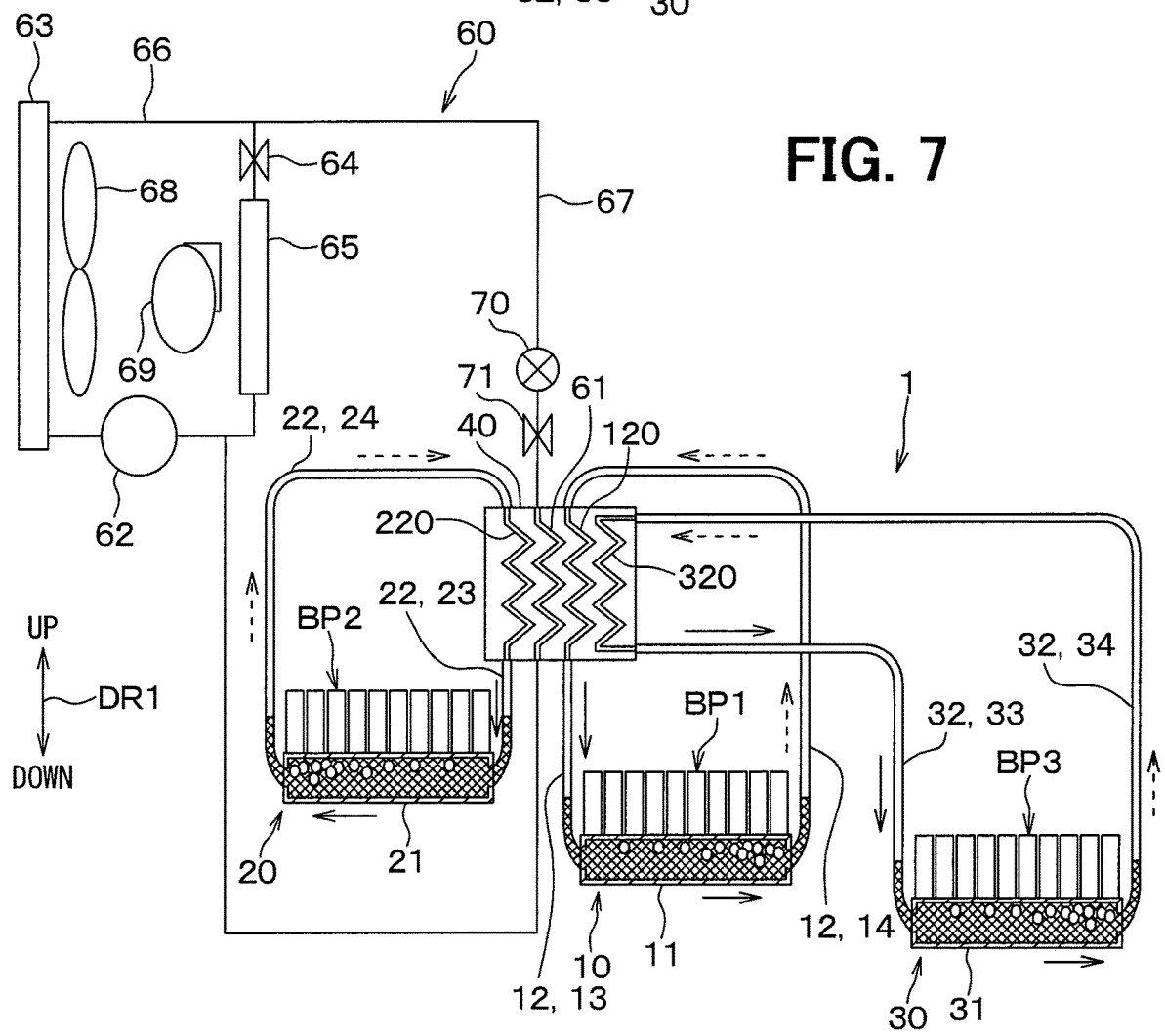
FIG. 7 is a schematic view illustrating the machine temperature control device of the second embodiment.

As shown in FIG. 6 and FIG. 7, a main condenser 40 according to the second embodiment includes first to third heat exchangers 120, 220, and 320 provided in first to third thermosiphon circuits 10, 20, and 30, respectively, and an evaporator 61 provided in a refrigeration cycle 60, which are integrated with each other. The main condenser 40 is configured to exchange a heat between a working fluid flowing through the first to third heat exchangers 120, 220, and 320 and a refrigerant circulating in the refrigeration cycle 60. In other words, in the second embodiment, a predetermined cold energy supply medium that exchanges a heat with the working fluid flowing through the first to third heat exchangers 120, 220, and 320 is a refrigerant circulating in the refrigeration cycle 60. The main condenser 40 is made of a metal having a high thermal conductivity such as aluminum or copper. In the main condenser 40, the working fluid flowing through the first to third heat exchangers 120, 220, 320 can exchange the heat with the refrigerant circulating in the refrigeration cycle 60, and the working fluid flowing through the first to third heat exchangers 120, 220, 320 can also exchange the heat with each other.

The refrigeration cycle 60 is used for an air conditioner (not shown) included in the vehicle 2. The refrigeration cycle 60 includes a compressor 62, a condenser 63, a first expansion valve 64, a first evaporator 65, a second evaporator 61, and the like. Those components are connected to each other by a pipe 66 and a branch circuit 67.

The compressor 62 draws and compresses the refrigerant from the first evaporator 65 side. The compressor 62 is driven by a power transmitted from a vehicle traveling engine or an electric motor (not shown). A high-pressure gas-phase refrigerant discharged from the compressor 62 flows into the condenser 63. The high-pressure gas-phase refrigerant flowing into the condenser 63 is cooled and condensed by the heat exchange with the outside air blown by a fan 68 when flowing through a refrigerant flow channel of the condenser 63. The liquid phase refrigerant condensed by the condenser 63 is decompressed when passing through the first expansion valve 64, and enters an atomized gas-liquid two-phase state. The first expansion valve 64 is configured by a fixed throttle such as an orifice or a nozzle, or an appropriate variable throttle or the like.

The low-pressure refrigerant reduced in pressure flows into the first evaporator 65. The first evaporator 65 is disposed in an air conditioning case (not shown) provided in the air conditioner. The low-pressure refrigerant flowing inside the first evaporator 65 absorbs the heat from the air blown by a blower 69 and evaporates. The first evaporator 65 cools the air flowing in the air conditioning case by the latent heat of evaporation of the low-pressure refrigerant. The temperature of the air is regulated by an air heater (not shown) and blown out into a vehicle interior. The refrigerant having passed through the first evaporator 65 is drawn into the compressor 62 through an accumulator (not shown).

The refrigeration cycle 60 includes the branch circuit 67 branched from a circulation circuit for the air conditioner described above. The branch circuit 67 is connected in the middle of the pipe 66 whose one end connects the condenser 63 and the first expansion valve 64 and the other end of which is connected in the middle of the pipe 66 which connects the first evaporator 65 and the compressor 62. The branch circuit 67 is provided with an electromagnetic valve 70, a second expansion valve 71, and a second evaporator 61 in the main condenser 40. When the electromagnetic valve 70 provided in the branch circuit 67 is opened, the liquid phase refrigerant condensed by the condenser 63 flows through the branch circuit 67. The refrigerant is decompressed when passing through the second expansion valve 71, and enters an atomized gas-liquid two-phase state. The low-pressure refrigerant decompressed by the second expansion valve 71 flows into the second evaporator 61. The main condenser 40 and the second evaporator 61 of the machine temperature control device 1 are integrally formed. For that reason, in the main condenser 40, the low-pressure refrigerant flowing inside the second evaporator 61 absorbs the heat from the working fluid flowing through the first to third heat exchangers 120, 220, and 320 and evaporates. The refrigerant having passed through the second evaporator 61 is drawn into the compressor 62 through an accumulator (not shown). As a result, the working fluid flowing through the first to third heat exchangers 120, 220, and 320 in the main condenser 40 is cooled and condensed by radiating the heat to the refrigerant flowing through the second evaporator 61 of the refrigeration cycle 60.

In the second embodiment described above, the machine temperature control device 1 includes the main condenser 40 configured to exchange the heat between the working fluid flowing through the first to third heat exchangers 120, 220, 320 provided in the first to third passages 12, 22, 32 and the refrigerant circulating in the refrigeration cycle 60.

Since the first to third heat exchangers 120, 220, 320 and the second evaporator 61 are integrated by the main condenser 40, the configuration of the refrigeration cycle 60 can be simplified. In addition, the utilization efficiency of the space is improved, and the vehicle mountability and the flexibility of vehicle mounting in the machine temperature control device 1 can be improved.

Further, since the first to third heat exchangers 120, 220, and 320 and the second evaporator 61 are integrally formed by the main condenser 40, the temperatures of the working fluids flowing through the first to third heat exchangers 120, 220, and 320 can be brought close to each other. Therefore, the machine temperature control device 1 can substantially uniformly cool the first to third batteries BP1, BP2, and BP3 by the first to third thermosiphon circuits 10, 20, and 30.

Third Embodiment

A third embodiment will be described. The third embodiment also changes the configuration of the main condenser 40 from the first and second embodiments, and other configurations are the same as those of the first and second embodiments, and therefore only portions different from those of the first and second embodiments will be described.

Figure 8:
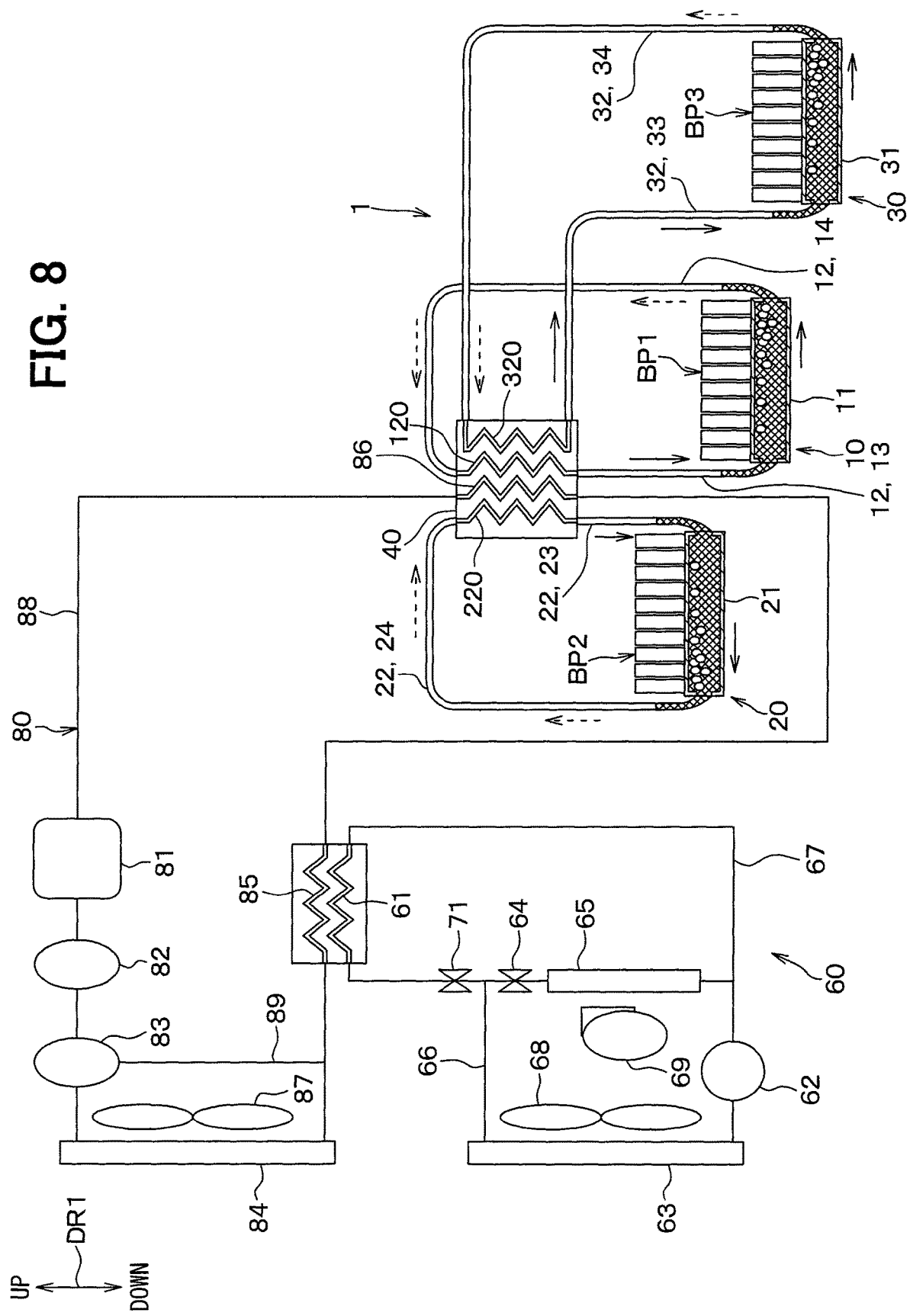
FIG. 8 is a schematic view illustrating a machine temperature control device according to a third embodiment.

As shown in FIG. 8, in a main condenser 40 according to the third embodiment, first to third heat exchangers 120, 220, and 320 provided in first to third thermosiphon circuits 10, 20, and 30, respectively, and a water passage 86 configuring a part of a coolant water circuit 80 are integrally formed. The main condenser 40 is configured to exchange a heat between a working fluid flowing through the first to third heat exchangers 120, 220, and 320 and a coolant water flowing through the water passage 86 of the coolant water circuit 80. In other words, in the third embodiment, a predetermined cold energy supply medium that exchanges the heat with the working fluid flowing through the first to third heat exchangers 120, 220, and 320 provided in the first to third passages 12, 22, and 32 is a coolant water that circulates in the coolant water circuit 80. The main condenser 40 is made of a metal having a high thermal conductivity such as aluminum or copper. In the main condenser 40, the working fluid flowing through the first to third heat exchangers 120, 220, and 320 is capable of exchanging the heat with the coolant water circulating in the coolant water circuit 80, and is also capable of exchanging the heat between the working fluids flowing through the first to third heat exchangers 120, 220, and 320.

The coolant water circuit 80 includes a reserve tank 81, a pump 82, a three-way switching valve 83, a radiator 84, a coolant water-refrigerant heat exchanger 85, a water passage 86 in the main condenser 40, and the like. Those components are annularly connected to each other by a pipe 88 to configure the coolant water circuit 80.

The pump 82 pumps the coolant water from the reserve tank 81, and circulates the coolant water in the coolant water circuit 80. The coolant water that has passed through the pump 82 flows into the radiator 84 through the three-way switching valve 83. The coolant water flowing into the radiator 84 is cooled by heat exchange with an outside air blown by a fan 87 when flowing through a flow channel of the radiator 84. In that case, the fan 87 forms an airflow passing through the radiator 84.

The coolant water cooled by the radiator 84 flows into the coolant water-refrigerant heat exchanger 85. When the coolant water flows through the coolant water-refrigerant heat exchanger 85, the coolant water is further cooled by radiating the heat to the refrigerant flowing through the second evaporator 61 of the refrigeration cycle 60. In the third embodiment, the second evaporator 61 included in the refrigeration cycle 60 is configured integrally with the coolant water-refrigerant heat exchanger 85 configuring the circulation circuit of the coolant water, and is not configured integrally with the main condenser 40 of the machine temperature control device 1. The three-way switching valve 83 can switch the flow channel 89 so that the coolant water flowing through the coolant water circuit 80 flows to the coolant water-refrigerant heat exchanger 85 without passing through the radiator 84.

The coolant water cooled by the coolant water-refrigerant heat exchanger 85 flows into the water passage 86 in the main condenser 40, and absorbs the heat from the working fluid flowing through the first to third heat exchangers 120, 220, and 320. The coolant water that has passed through the water passage 86 in the main condenser 40 is returned to the reserve tank 81. As a result, in the main condenser 40, the working fluid flowing through the first to third heat exchangers 120, 220, and 320 is cooled and condensed by radiating the heat to the coolant water flowing through the coolant water circuit 80.

In the third embodiment described above, the machine temperature control device 1 includes the main condenser 40 configured to exchange the heat between the working fluid flowing through the first to third heat exchangers 120, 220, and 320 provided in the first to third passages 12, 22, and 32 and the coolant water flowing through the coolant water circuit 80.

Since the first to third heat exchangers 120, 220, and 320 and the water passage 86 of the coolant water circuit 80 are integrally integrated by the main condenser 40, the configuration of the refrigeration cycle 60 and the configuration of the coolant water circuit 80 can be simplified. In addition, the utilization efficiency of the space is improved, and the vehicle mountability and the flexibility of vehicle mounting in the machine temperature control device 1 can be improved.

Further, since the first to third heat exchangers 120, 220, and 320 and the water passage 86 of the coolant water circuit 80 are integrally formed by the main condenser 40, the temperatures of the working fluids flowing through the first to third heat exchangers 120, 220, and 320 can be brought close to each other. Therefore, the machine temperature control device 1 can substantially uniformly cool the first to third batteries BP1, BP2, and BP3 by the first to third thermosiphon circuits 10, 20, and 30.

Fourth Embodiment

A fourth embodiment will be described. In the fourth embodiment, the configuration of the main condenser 40 is changed from that of the first embodiment, and a sub condenser 44 is provided, and other configurations are the same as those of the first embodiment, and therefore, only portions different from those of the first embodiment will be described.

Figure 9:
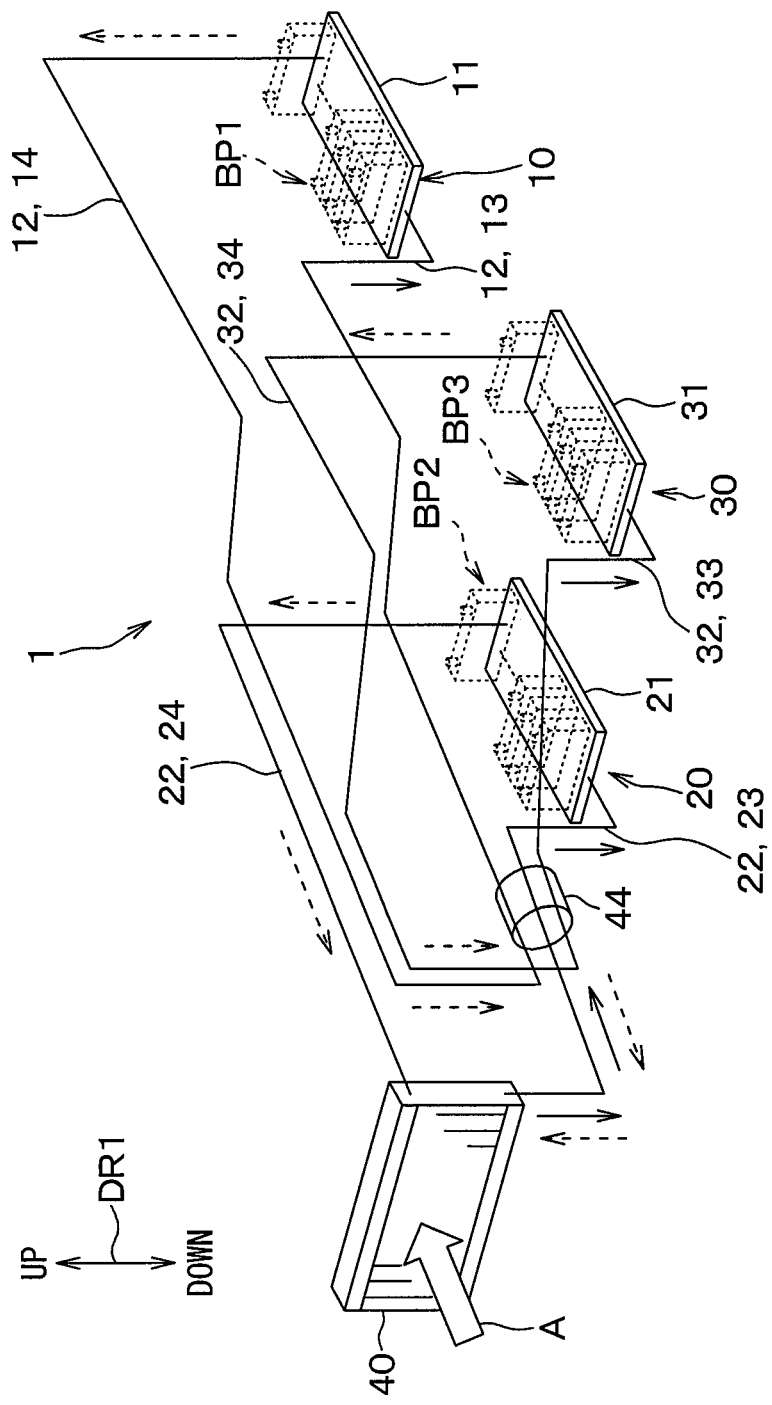
FIG. 9 is a perspective view illustrating a machine temperature control device according to a fourth embodiment.
Figure 10:
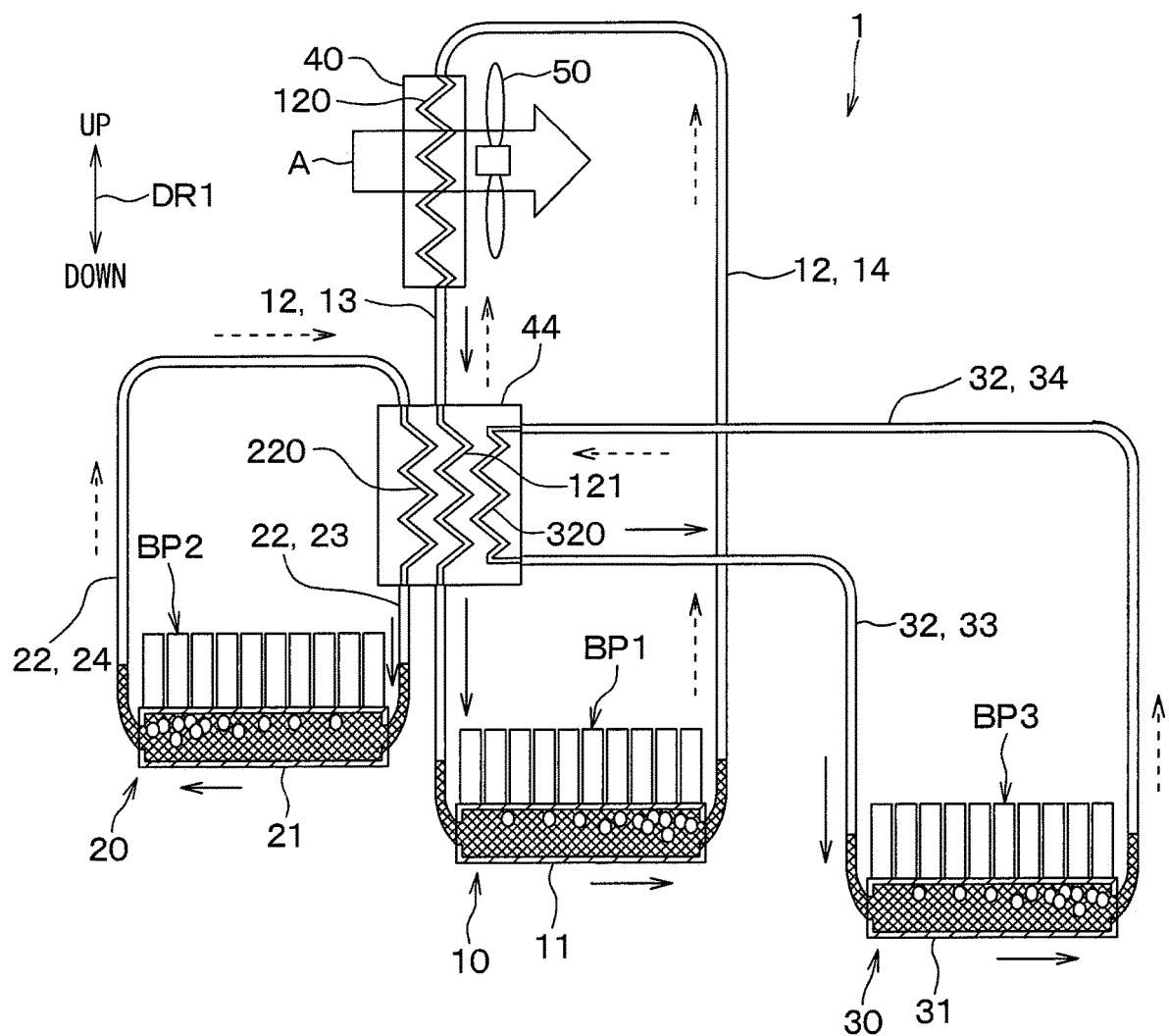
FIG. 10 is a schematic view illustrating the machine temperature control device of the fourth embodiment.

As shown in FIGS. 9 and 10, a main condenser 40 included in a machine temperature control device 1 according to a fourth embodiment includes a first heat exchanger 120 provided in a first passage 12 included in a first thermosiphon circuit 10. In the main condenser 40, a working fluid flowing through the first heat exchanger 120 exchanges a heat with an air as a predetermined cold energy supply medium. The main condenser 40 is provided in front of a vehicle 2, and with the rotation of the fan 50, an outside air can flow to the first heat exchanger 120. For that reason, the working fluid flowing through the first heat exchanger 120 can exchange the heat with the outside air.

Further, the machine temperature control device 1 according to the fourth embodiment includes a sub condenser 44 disposed below the main condenser 40 in a gravitational direction. The sub condenser 44 is made of a metal having a high thermal conductivity such as aluminum or copper.

The sub condenser 44 has a first lower heat exchanger 121 as a lower heat exchanger provided on a lower side of the first heat exchanger 120 in the gravitational direction in the first passage 12 of the first thermosiphon circuit 10. The sub condenser 44 also includes second and third heat exchangers 220, 320 provided in second and third passage units 22 and 32 of second and third thermosiphon circuits 20 and 30. The first lower heat exchanger 121 is provided in a first forward passage 13 of the first passage 12. In the sub condenser 44, the working fluid flowing through the first lower heat exchanger 121 of the first thermosiphon circuit 10 and the working fluid flowing through the second and third heat exchangers 220 and 320 of the second and third thermosiphon circuits 20 and 30 exchange a heat with each other.

In the sub condenser 44, a part of the working fluid of the liquid phase flowing through the first lower heat exchanger 121 absorbs the heat from the working fluid of the gas phase flowing through the second and third heat exchangers 220 and 320, and evaporates into a gas. The working fluid, which has become a gas in the first lower heat exchanger 121, flows backward from the sub condenser 44 toward the main condenser 40 in the first forward passage 13. On the other hand, in the sub condenser 44, another part of the working fluid of the liquid phase flowing through the first lower heat exchanger 121 maintains a state of the liquid phase, and flows down in the first forward passage 13 from the sub condenser 44 toward the first evaporator 11 side by its own weight. In addition, the gas phase working fluid flowing through the second heat exchanger 220 is condensed by radiating the heat to the liquid phase working fluid flowing through the first lower heat exchanger 121, becomes a liquid phase working fluid, and flows down in the second forward passage 23 from the sub condenser 44 toward the second evaporator 21 side by its own weight. The gas phase working fluid flowing through the third heat exchanger 320 is also condensed by radiating the heat to the liquid phase working fluid flowing through the first lower heat exchanger 121, becomes a liquid phase working fluid, and flows down in the third forward passage 33 from the sub condenser 44 toward the third evaporator 31 by its own weight. At this time, since the working fluid flowing through the first lower heat exchanger 121, the working fluid flowing through the second heat exchanger 220, and the working fluid flowing through the third heat exchanger 320 exchange the heat with each other by the sub condenser 44, the temperatures of those working fluids are approximated.

In the fourth embodiment described above, the machine temperature control device 1 includes the sub condenser 44 configured to exchange the heat between the working fluid flowing through the first lower heat exchanger 121 provided in the first forward passage 13 and the working fluid flowing through the second and third heat exchangers 220 and 320 provided in the second and third passages 22 and 32.

As a result, the working fluid flowing through the second and third heat exchangers 220 and 320 is condensed by the sub condenser 44. For that reason, the multiple thermosiphon circuits can be easily mounted on the vehicle 2 without installing a facility for supplying the cold energy supply medium to the second and third thermosiphon circuits 30. In other words, even when the number of batteries BP mounted on the vehicle 2 increases or decreases according to the vehicle type, and the number of thermosiphon circuits increases or decreases according to the increase or decrease in the number of batteries BP, the number of design workloads and the number of components can be reduced according to the vehicle type by installing the heat exchanger provided in a part of the passage of the thermosiphon circuit whose number is increased and decreased in the sub condensers 44. Therefore, the machine temperature control device 1 can improve the vehicle mountability and the flexibility of the vehicle mounting.

Further, the cold energy to be supplied from the air, which is the cold energy supply medium of the main condenser 40, is distributed to the first to third thermosiphon circuits 10, 20, and 30 by the sub condenser 44, and the first to third batteries BP1, BP2, and BP3 can be cooled. Therefore, the number of components of the machine temperature control device 1 can be reduced, and the configuration can be simplified.

Further, the sub condenser 44 makes it possible to bring the temperature of the working fluid flowing through the first lower heat exchanger 121 and the temperature of the working fluid flowing through the second and third heat exchangers 220 and 320 close to each other. Therefore, the machine temperature control device 1 can adjust the temperatures of the first to third batteries BP1, BP2, and BP3 substantially uniformly.

Fifth Embodiment

A fifth embodiment will be described. In the fifth embodiment, the configuration of the main condenser 40 is changed from that of the second embodiment, and a sub condenser 44 is provided, and other configurations are the same as those of the second embodiment, and therefore, only portions different from those of the second embodiment will be described.

Figure 11:
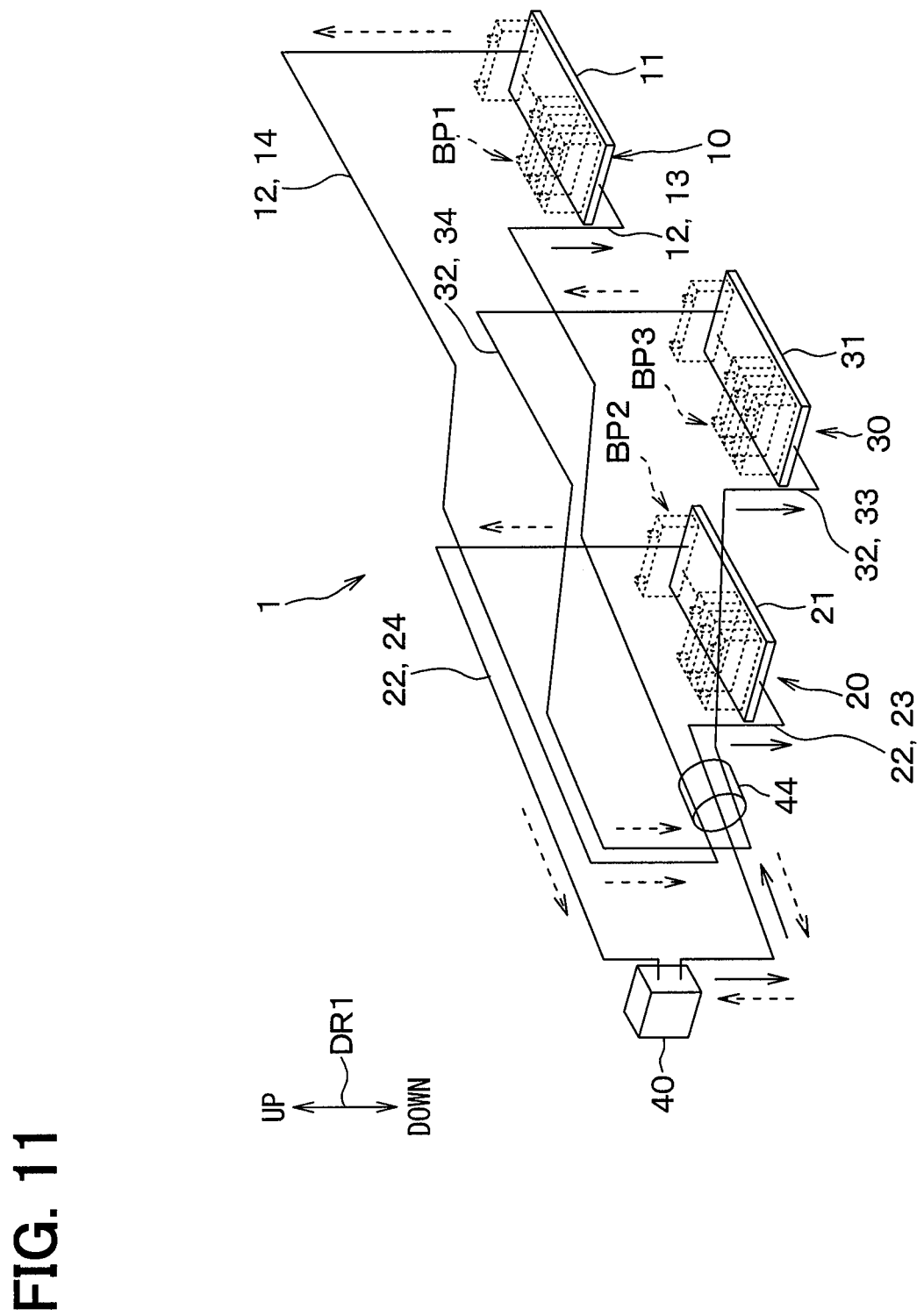
FIG. 11 is a perspective view illustrating a machine temperature control device according to a fifth embodiment.
Figure 12:
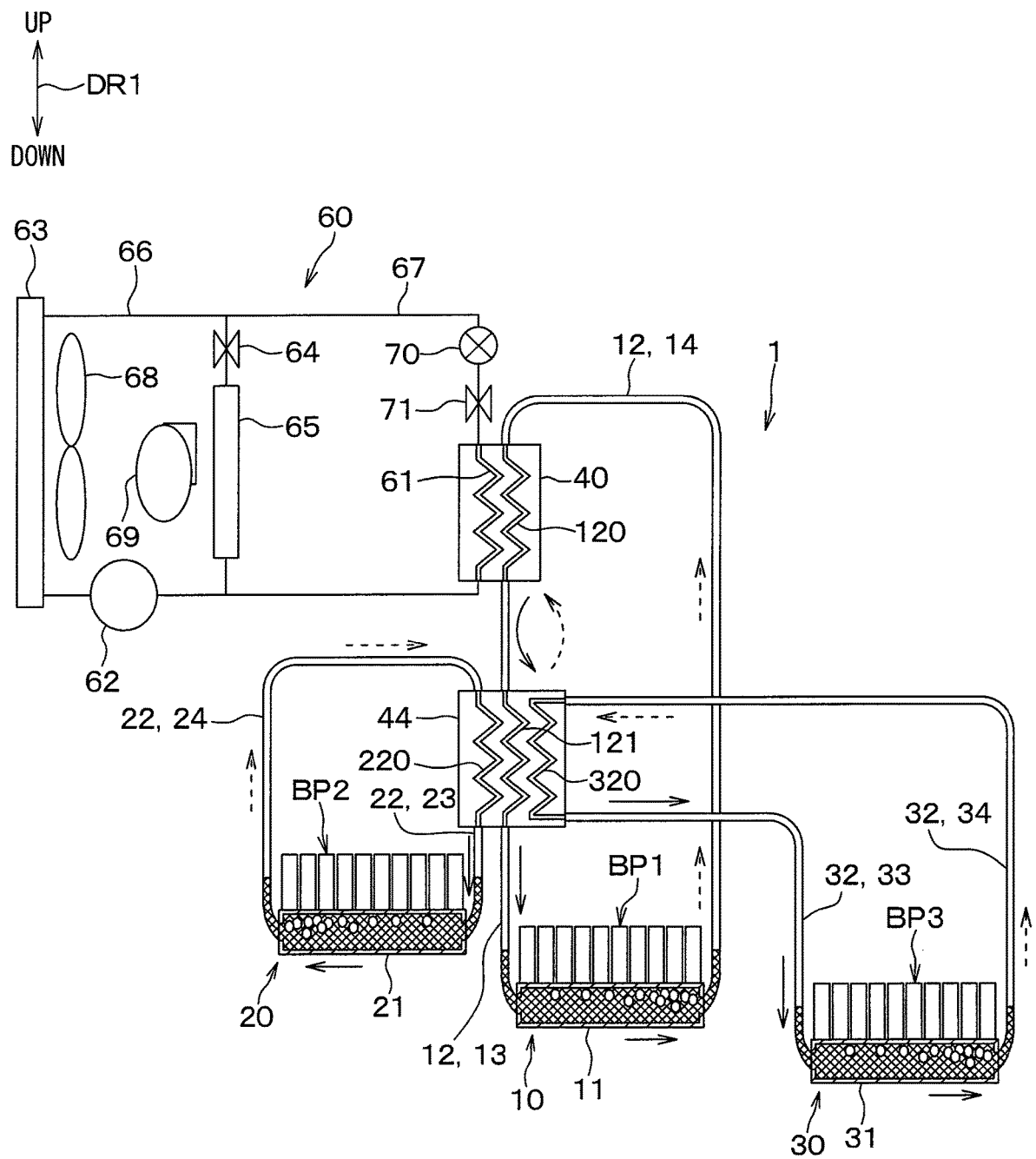
FIG. 12 is a schematic view illustrating the machine temperature control device of the fifth embodiment.

As shown in FIG. 11 and FIG. 12, a main condenser 40 included in a machine temperature control device 1 according to the fifth embodiment is configured such that a first heat exchanger 120 provided in a first passage 12 included in a first thermosiphon circuit 10 and an evaporator 61 included in a refrigeration cycle 60 are integrated with each other. The main condenser 40 is configured to exchange the heat between the working fluid flowing through the first heat exchanger 120 and the refrigerant circulating in the refrigeration cycle 60. In other words, in the fifth embodiment, a predetermined cold energy supply medium that exchanges a heat with the working fluid flowing through the first passage 12 is a refrigerant circulating in the refrigeration cycle 60.

Further, the machine temperature control device 1 according to the fifth embodiment includes a sub condenser 44 that is disposed below the main condenser 40 in a gravitational direction. The configuration of the sub condenser 44 is substantially the same as that described in the fourth embodiment. In the fifth embodiment described above, the same operation and effects as those in the fourth embodiment can be obtained.

Sixth Embodiment

A sixth embodiment will be described. In the sixth embodiment, the configuration of the main condenser 40 is changed from that of the third embodiment, and a sub condenser 44 is provided, and other configurations are the same as those of the third embodiment, and therefore, only portions different from those of the third embodiment will be described.

Figure 13:
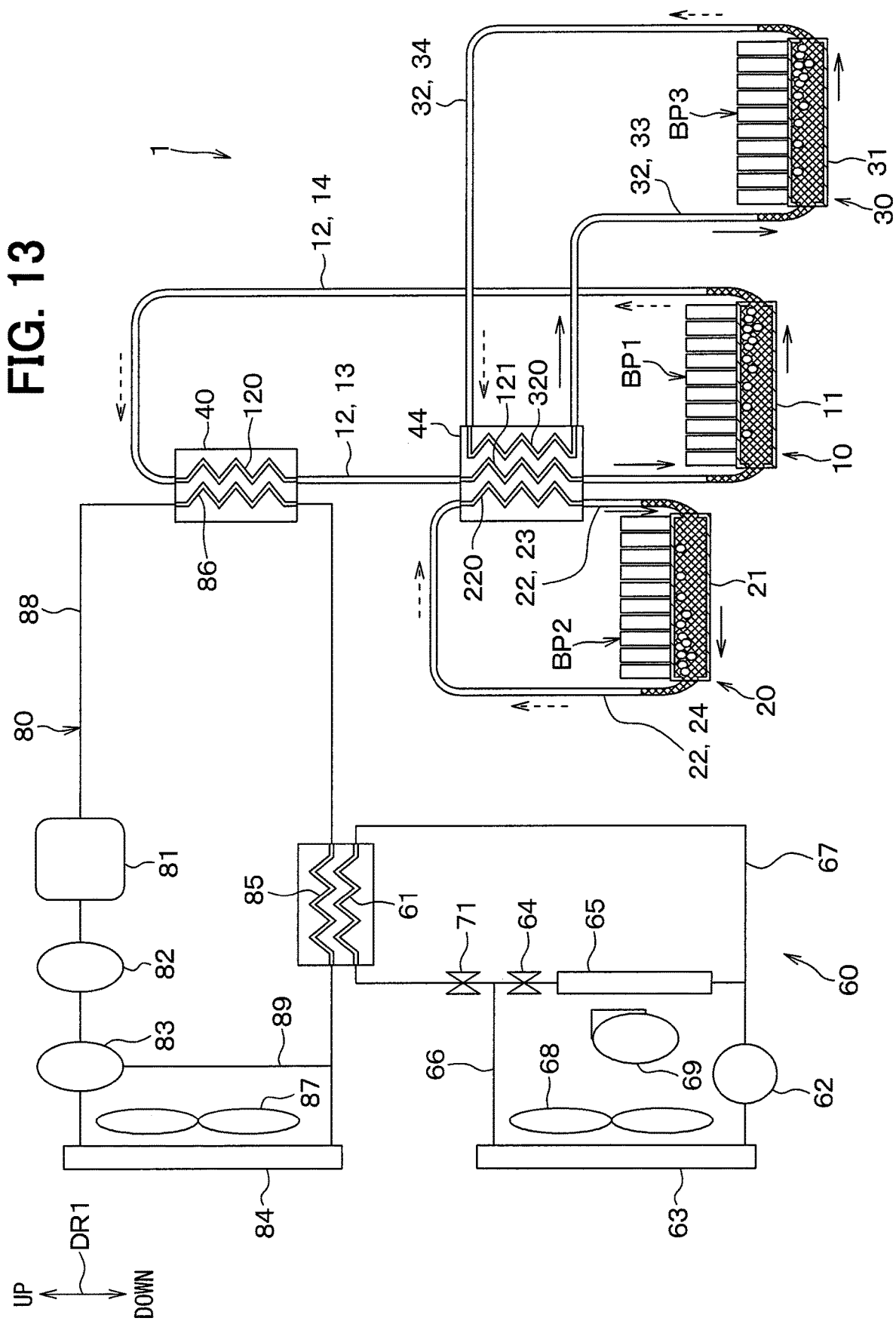
FIG. 13 is a perspective view illustrating a machine temperature control device according to a sixth embodiment.

As shown in FIG. 13, a main condenser 40 included in a machine temperature control device 1 according to the sixth embodiment is configured such that a first heat exchanger 120 provided in a first passage 12 included in a first thermosiphon circuit 10 and a water passage 86 of a coolant water circuit 80 are integrally formed. The main condenser 40 is configured to exchange a heat between a working fluid flowing through the first heat exchanger 120 and a coolant water flowing through the coolant water circuit 80. That is, in the sixth embodiment, the predetermined cold energy supply medium that exchanges heat with the working fluid flowing through the first heat exchanger 120 is a coolant water that circulates in the coolant water circuit 80.

Further, the machine temperature control device 1 according to the sixth embodiment includes a sub condenser 44 on a lower side of the main condenser 40 in a gravitational direction. A configuration of the sub condenser 44 is substantially the same as that described in the fourth and fifth embodiments. In the sixth embodiment described above, the same operation and effects as those in the fourth and fifth embodiments can be achieved.

Seventh Embodiment

A seventh embodiment will be described. The seventh embodiment is obtained by changing the configuration of the main condenser 40 with respect to the fourth and fifth embodiments, and the other configurations are the same as those of the fourth and fifth embodiments, and therefore only portions different from those of the fourth and fifth embodiments will be described.

Figure 14:
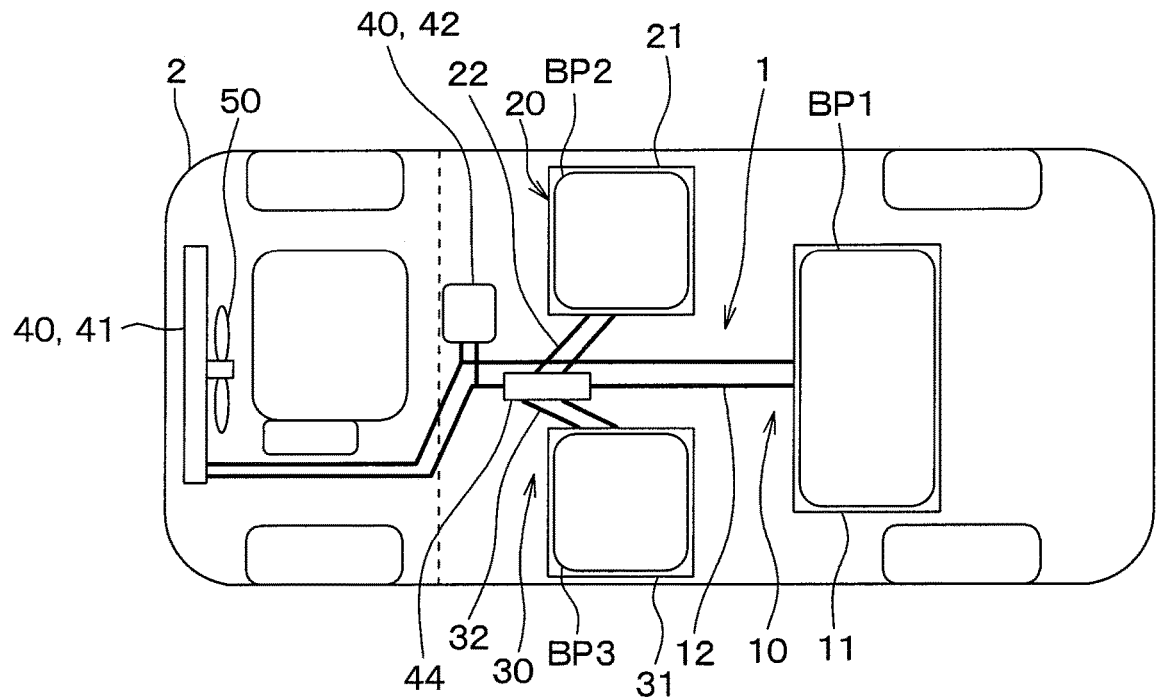
FIG. 14 is a schematic view illustrating a vehicle including a machine temperature control device according to a seventh embodiment, seen from an upper side.
Figure 15:
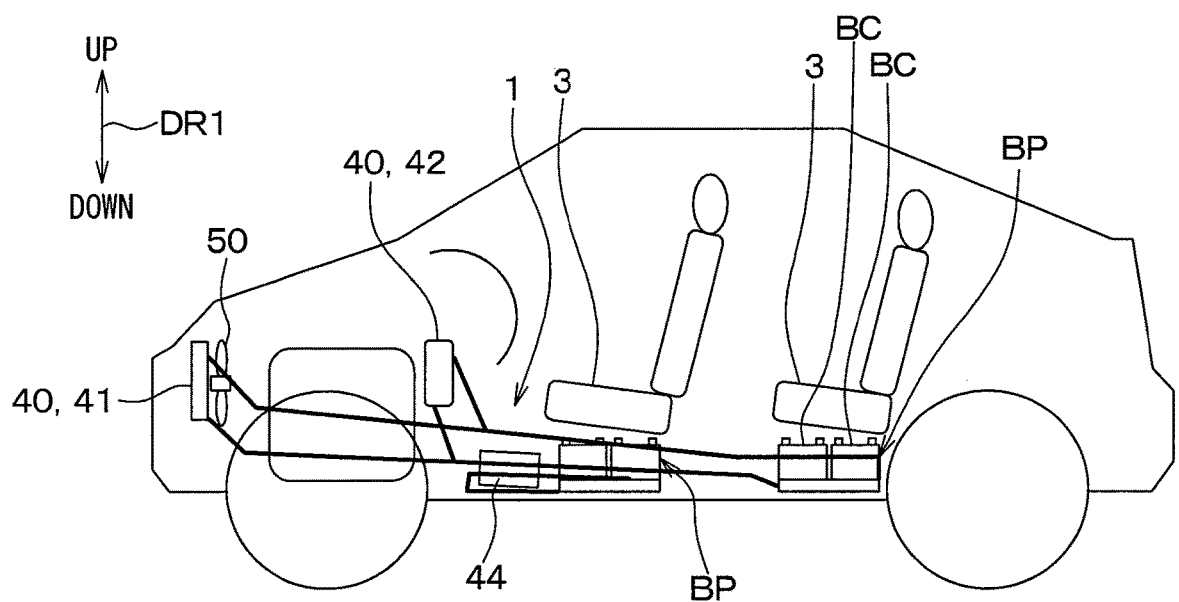
FIG. 15 is a schematic view illustrating the vehicle in FIG. 14, seen from a lateral side.
Figure 16:
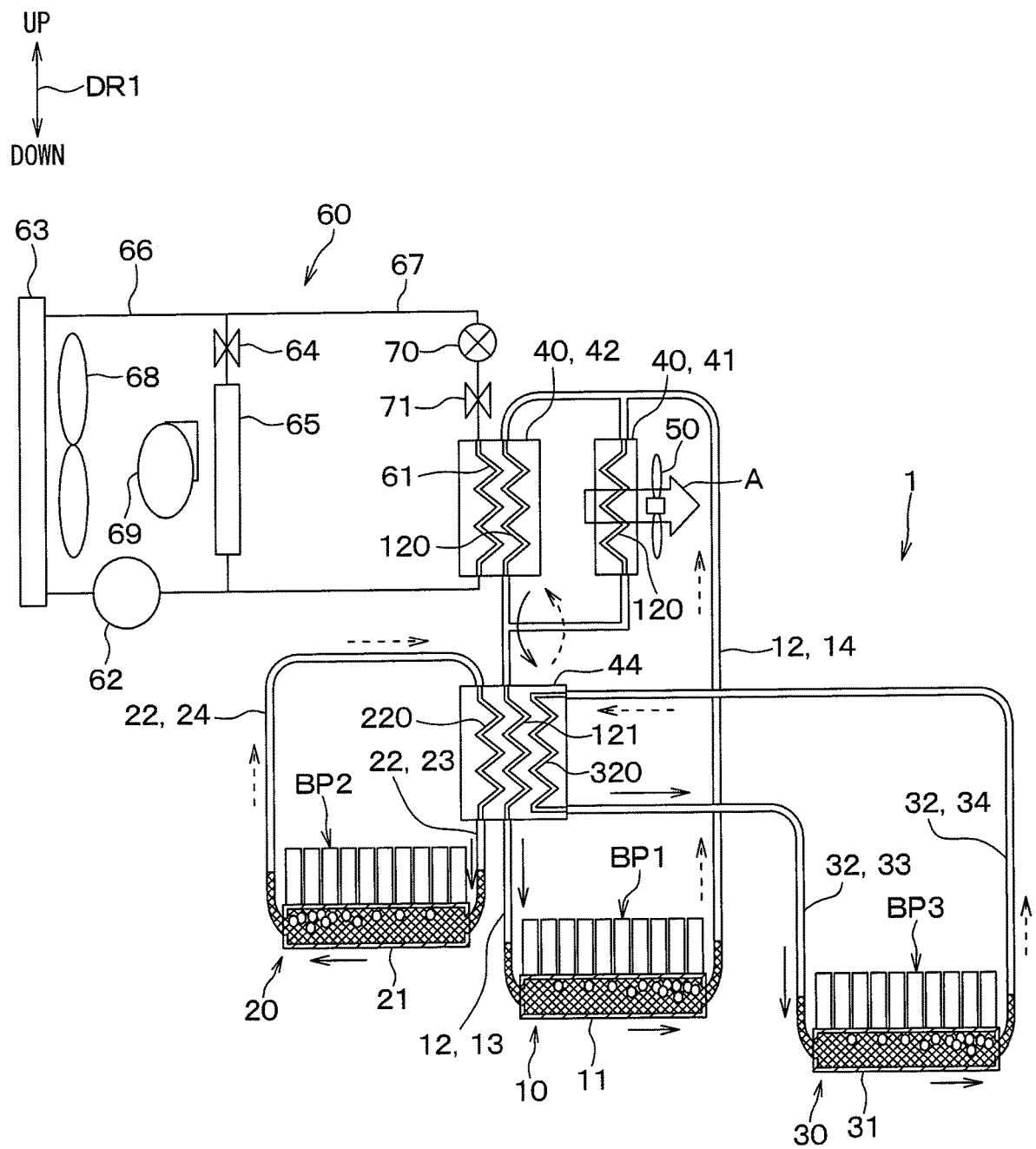
FIG. 16 is a schematic view illustrating the machine temperature control device according to the seventh embodiment.

As shown in FIGS. 14 to 16, the machine temperature control device 1 according to the seventh embodiment includes two main condensers 40. Of the two main condensers 40, one main condenser is referred to as a first main condenser 41 and the other main condenser is referred to as a second main condenser 42.

The first main condenser 41 includes a first heat exchanger 120 provided in the first passage 12 of the first thermosiphon circuit 10. In the first main condenser 41, a working fluid flowing through the first heat exchanger 120 provided in the first passage 12 of the first thermosiphon circuit 10 exchanges a heat with an air as a predetermined cold energy supply medium. The first main condenser 41 is provided in front of the vehicle 2, and with the rotate of the fan 50, an outside air can flow to the first heat exchanger 120. For that reason, the working fluid flowing through the first main condenser 41 can exchange a heat with an outside air.

The second main condenser 42 is formed by integrating another first heat exchanger 120 provided in parallel with the first heat exchanger 120 in the first passage 12 provided in the first thermosiphon circuit 10 and an evaporator 61 provided in the refrigeration cycle 60. The second main condenser 42 is configured to exchange a heat between the working fluid flowing through the other first heat exchanger 120 and the refrigerant circulating in the refrigeration cycle 60. The second main condenser 42 is provided in an engine compartment, and can circulate the refrigerant of the refrigeration cycle 60 to the second main condenser 42 by driving a compressor 62.

In the seventh embodiment, the first main condenser 41 and the second main condenser 42, which are described above, are connected in parallel to each other.

The machine temperature control device 1 according to the seventh embodiment includes a sub condenser 44 disposed below the first main condenser 41 and the second main condenser 42 in a gravitational direction. A configuration of the sub condenser 44 is substantially the same as that described in the fourth to sixth embodiments.

In the seventh embodiment described above, the first main condenser 41 and the second main condenser 42 are provided. This makes it possible to cool the working fluid flowing through the first passage 12 with the use of multiple types of cold energy supply media such as an air and a refrigerant, for example. For that reason, even if the batteries BP cannot be cooled by one of the cold energy supply media because the temperature of the one of the cold energy supply media is high, the working fluid can be condensed by the cold energy of the other cold energy supply media to reliably cool the batteries BP.

Also, with sufficiently cooling of the working fluid flowing through the first passage 12 using the first main condenser 41 and the second main condenser 42, the working fluid flowing through the second and third passages 22 and 32 is also cooled in the sub condenser 44 downstream of the first main condenser 41 and the second main condenser 42. Therefore, the machine temperature control device 1 can enhance a cooling capacity of the first to third batteries BP1, BP2, and BP3.

Eighth Embodiment

An eighth embodiment will be described. In the eighth embodiment, the placement of the first main condenser 41 and the second main condenser 42 is changed in comparison with the seventh embodiment, and a communication passage 45 is added, and other configurations are the same as those in the seventh embodiment, and therefore, only portions different from the seventh embodiment will be described.

Figure 17:
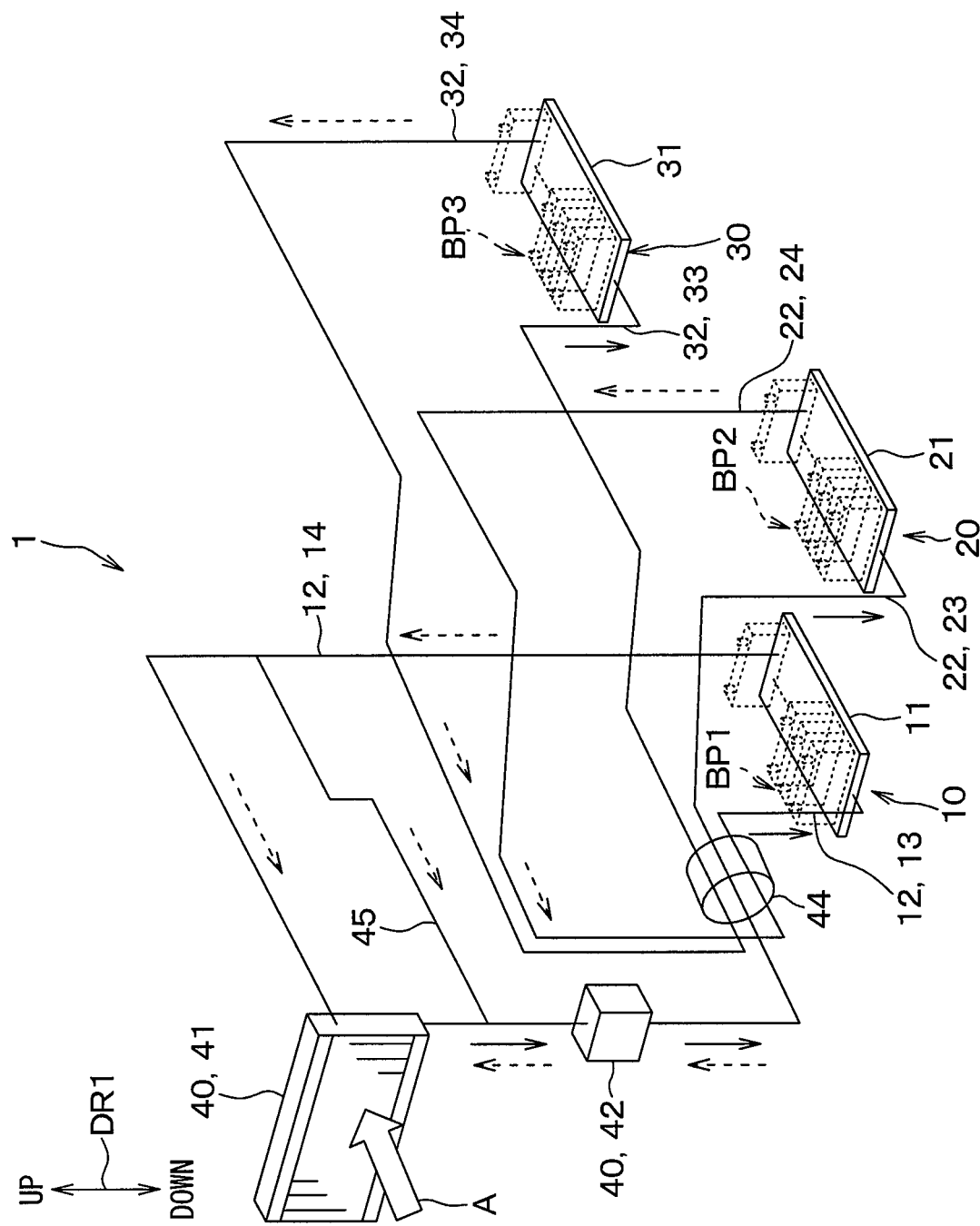
FIG. 17 is a perspective view illustrating a machine temperature control device according to an eighth embodiment.
Figure 18:
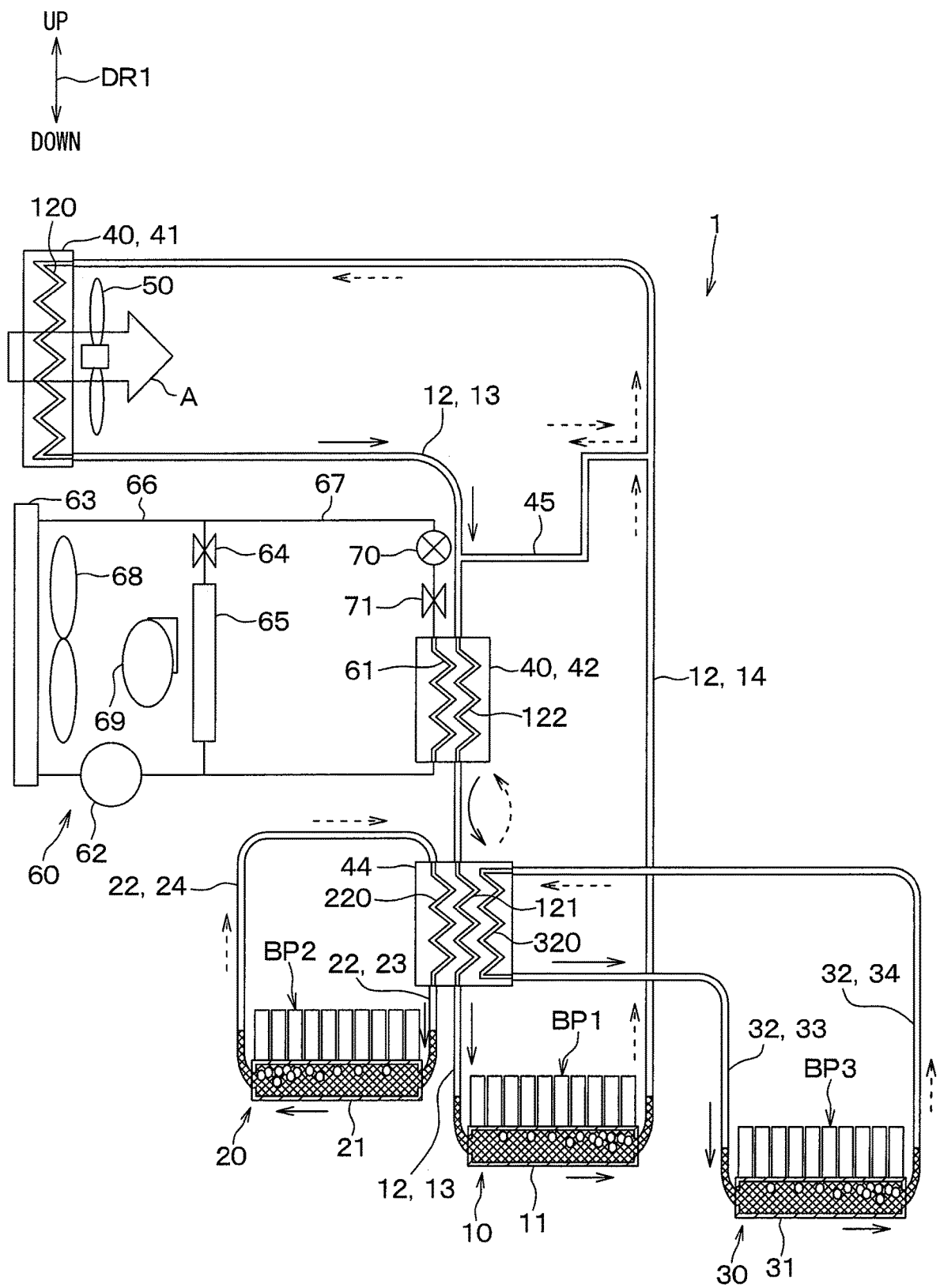
FIG. 18 is a schematic view illustrating the machine temperature control device of the eighth embodiment.

As shown in FIGS. 17 and 18, a first main condenser 41 included in a machine temperature control device 1 according to the eighth embodiment includes a first heat exchanger 120 provided in a first passage 12 included in a first thermosiphon circuit 10. The first main condenser 41 is configured to exchange a heat between a working fluid flowing through the first heat exchanger 120 and an air as a predetermined cold energy supply medium.

The second main condenser 42 is formed by integrating a first intermediate heat exchanger 122 as an intermediate heat exchanger provided below the first heat exchanger 120 in the gravitational direction in the first passage 12 provided in the first thermosiphon circuit 10, and an evaporator 61 provided in the refrigeration cycle 60 together. The first intermediate heat exchanger 122 included in the first thermosiphon circuit 10 is provided in a first forward passage 13 of the first passage 12.

The first main condenser 41 and the second main condenser 42 are connected in series, and the second main condenser 42 is disposed below the first main condenser 41 in the gravitational direction. A working fluid condensed in the first heat exchanger 120 in the first main condenser 41 and put into a liquid phase flows down in the first forward passage 13 by its own weight and flows into the second main condenser 42. Then, the operating fluid is further cooled by the first intermediate heat exchanger 122 in the second main condenser 42.

In the eighth embodiment, the first forward passage 13 of the first thermosiphon circuit 10 communicates from the first main condenser 41 to the first evaporator 11 through the second main condenser 42. The working fluid condensed in the first main condenser 41 by the first forward passage 13 flows to the first evaporator 11 through the second main condenser 42. On the other hand, the first return passage 14 included in the first thermosiphon circuit 10 communicates from the first evaporator 11 to the first main condenser 41 without passing through the second main condenser 42. The working fluid evaporated in the first evaporator 11 flows to the first return passage 14.

The machine temperature control device 1 according to the eighth embodiment includes a communication passage 45 in the first thermosiphon circuit 10. One end of the communication passage 45 communicates with a portion of the first forward passage 13 between the first main condenser 41 and the second main condenser 42, and the other end communicates with the first return passage 14. The end portion of the communication passage 45 on the side communicating with the first forward passage 13 is located at a position lower in the gravitational direction than the end portion on the side communicating with the first return passage 14.

As a result, when the temperature of the outside air for exchanging a heat with the working fluid in the first main condenser 41 is high, the gas phase working fluid flowing through the first return passage 14 can flow through the communication passage 45 to the second main condenser 42 without passing through the first main condenser 41. In this case, the working fluid is prevented from being heated by an outside air in the first main condenser 41. Therefore, the machine temperature control device 1 can cool batteries BP1, BP2, and BP3 with the use of the second main condenser 42 even when the temperature of the outside air is high.

Further, since the end portion of the communication passage 45 on the side communicating with the first forward passage 13 is at a position lower in the gravitational direction than the end portion on the side communicating with the first return passage 14, when the working fluid condensed in the first main condenser 41 flows down in the first forward passage 13 by its own weight, the working fluid in the liquid phase is prevented from flowing into the communication passage 45. Thus, with the above configuration, the working fluid can flow from the first main condenser 41 to the second main condenser 42 through the first forward passage 13.

The machine temperature control device 1 according to the eighth embodiment also includes a sub condenser 44 below the first main condenser 41 and the second main condenser 42 in the gravitational direction. In the sub condenser 44, the working fluid flowing through the first lower heat exchanger 121 provided in the first thermosiphon circuit 10 exchanges a heat with the working fluid flowing through the second and third heat exchangers 220 and 320 provided in the second and third thermosiphon circuits 20 and 30. The first lower heat exchanger 121 is provided below the first intermediate heat exchanger 122 in the gravitational direction. The configuration of the sub condenser 44 is substantially the same as that described in the fourth to seventh embodiments.

The eighth embodiment described above can exhibit the same operation and effects as those in the seventh embodiment.

Ninth Embodiment

A ninth embodiment will be described. The ninth embodiment is the same as the eighth embodiment except that the configuration of the second main condenser 42 is changed from the eighth embodiment, and therefore, only portions different from the eighth embodiment will be described.

Figure 19:
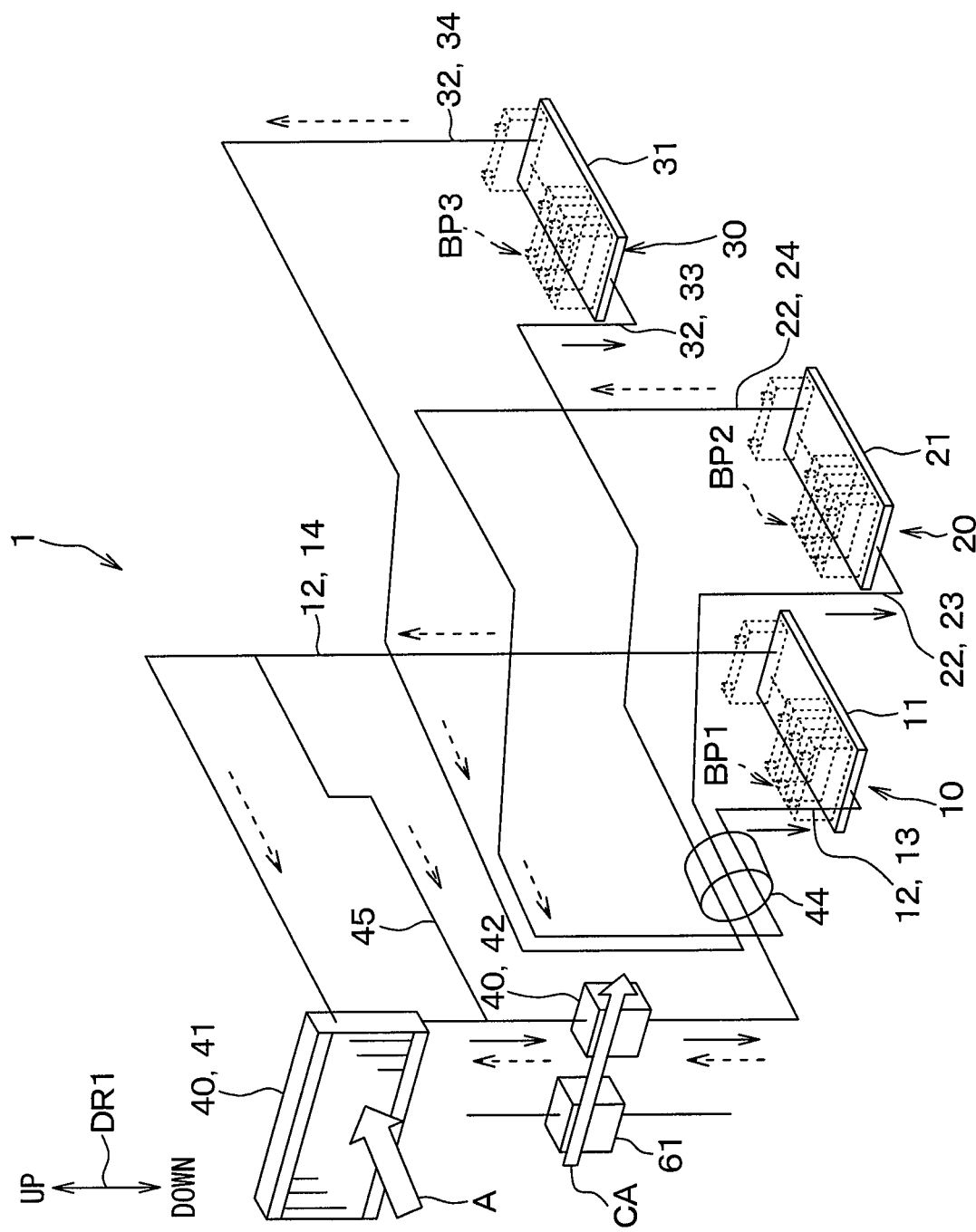
FIG. 19 is a perspective view illustrating a machine temperature control device according to a ninth embodiment.
Figure 20:
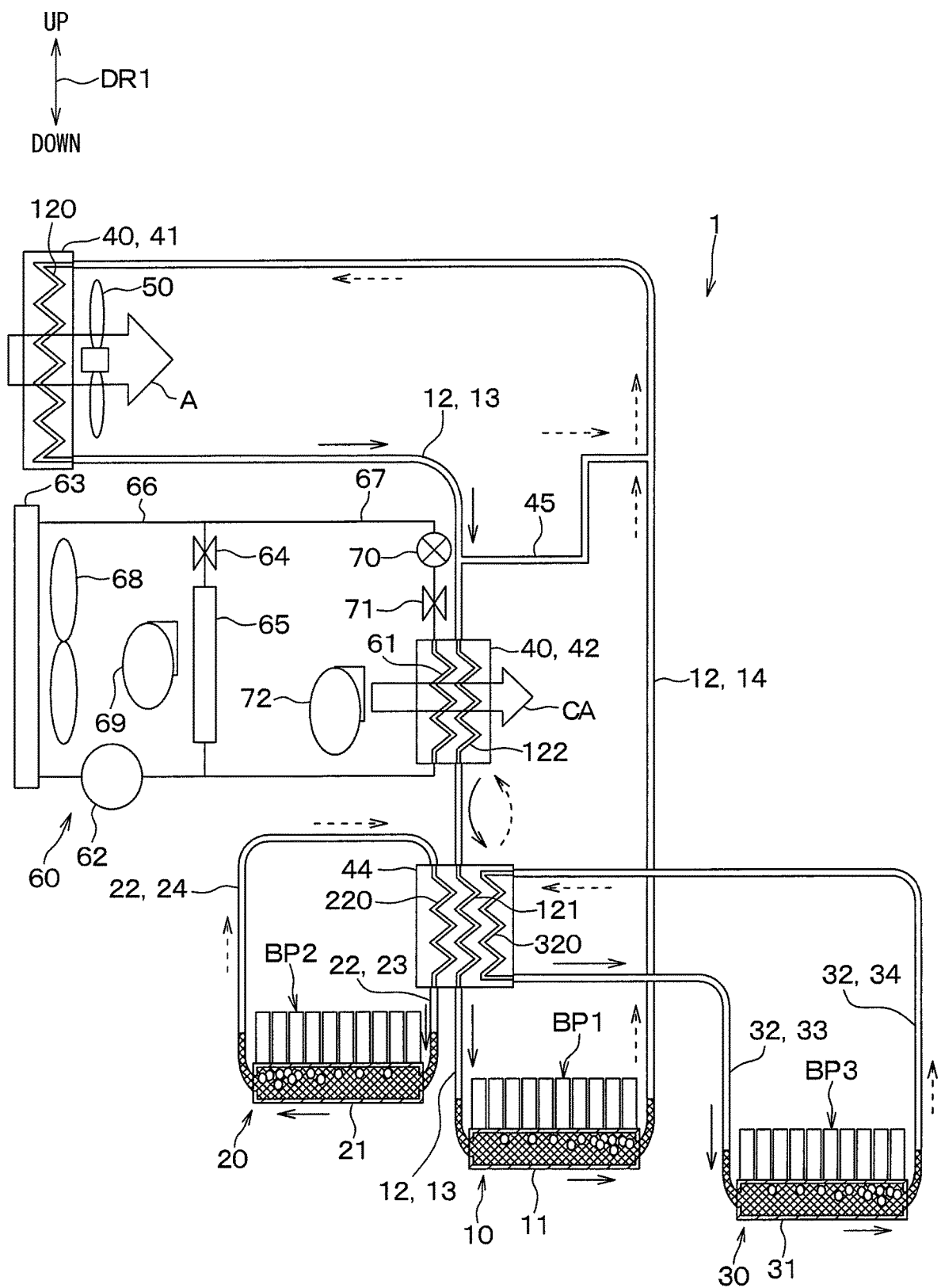
FIG. 20 is a schematic view illustrating the machine temperature control device of the ninth embodiment.
Figure 21:
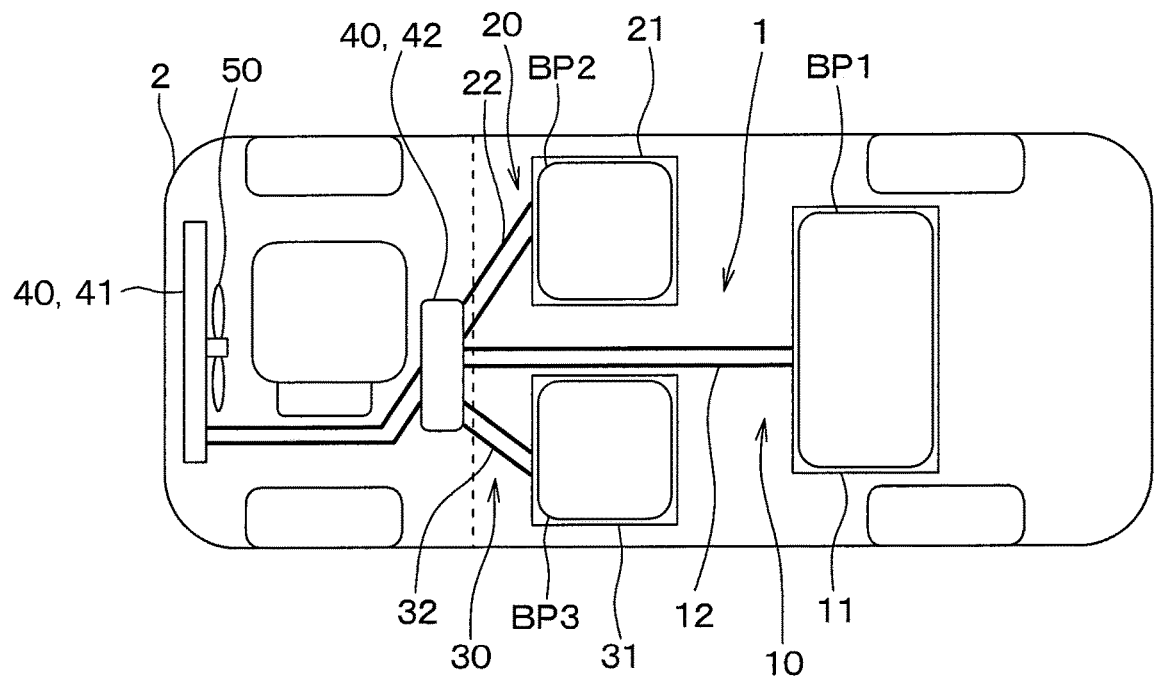
FIG. 21 is a schematic view illustrating a vehicle including a machine temperature control device according to a tenth embodiment, seen from an upper side.
Figure 22:
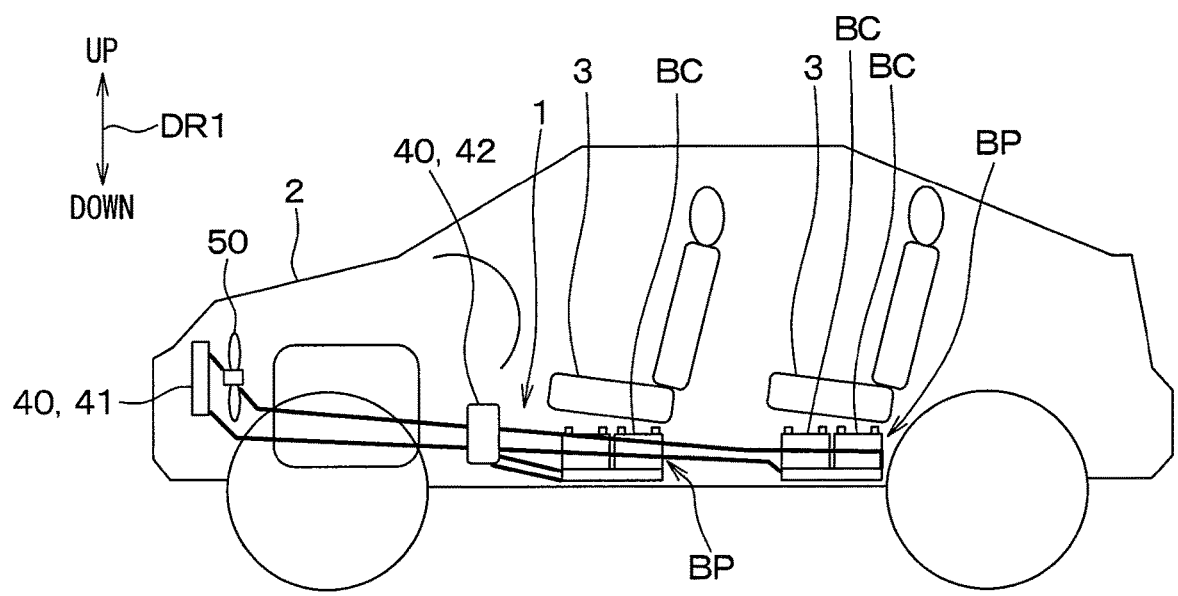
FIG. 22 is a schematic view illustrating the vehicle in FIG. 21, seen from a lateral side.
Figure 23:
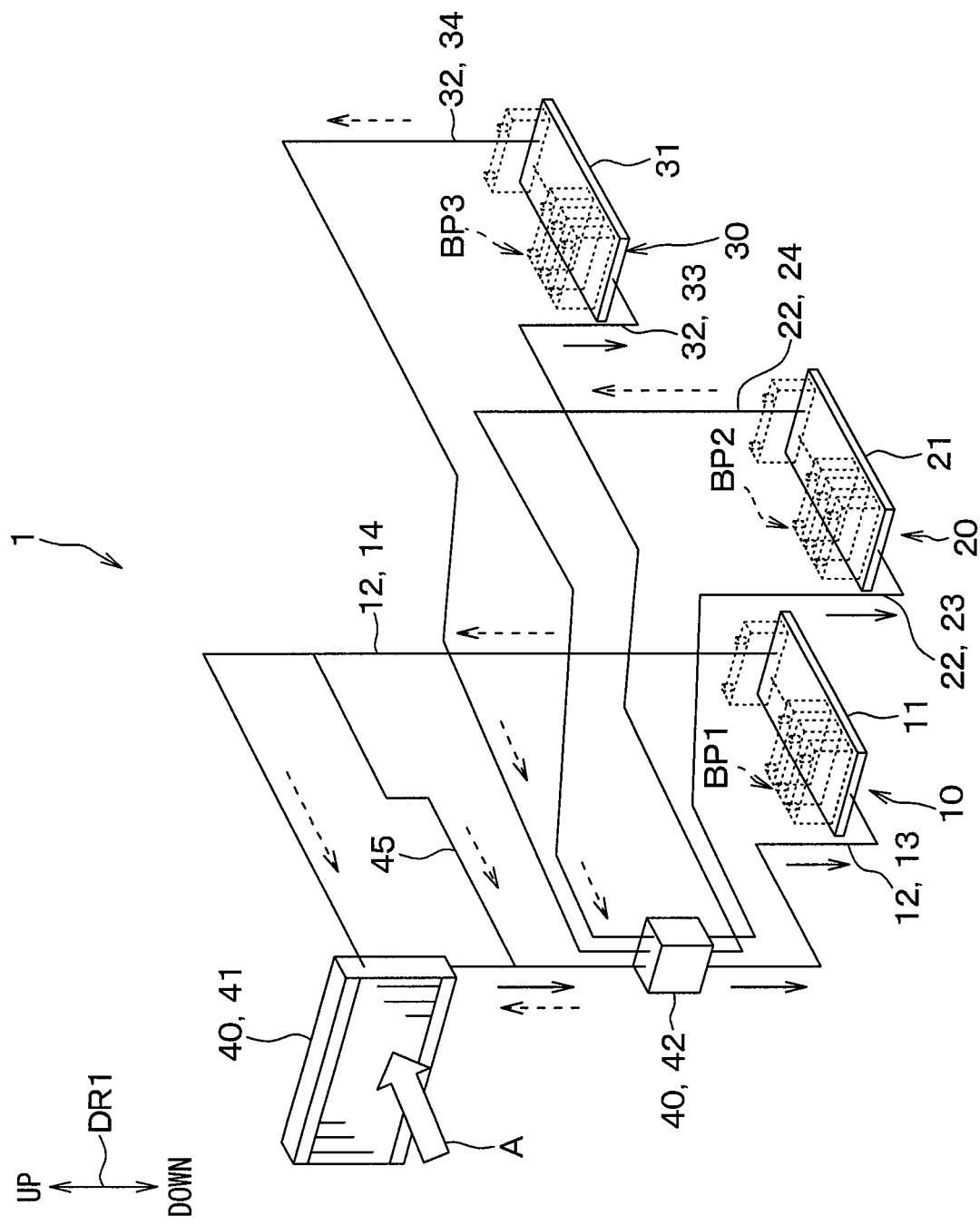
FIG. 23 is a perspective view illustrating a machine temperature control device of the tenth embodiment.
Figure 24:
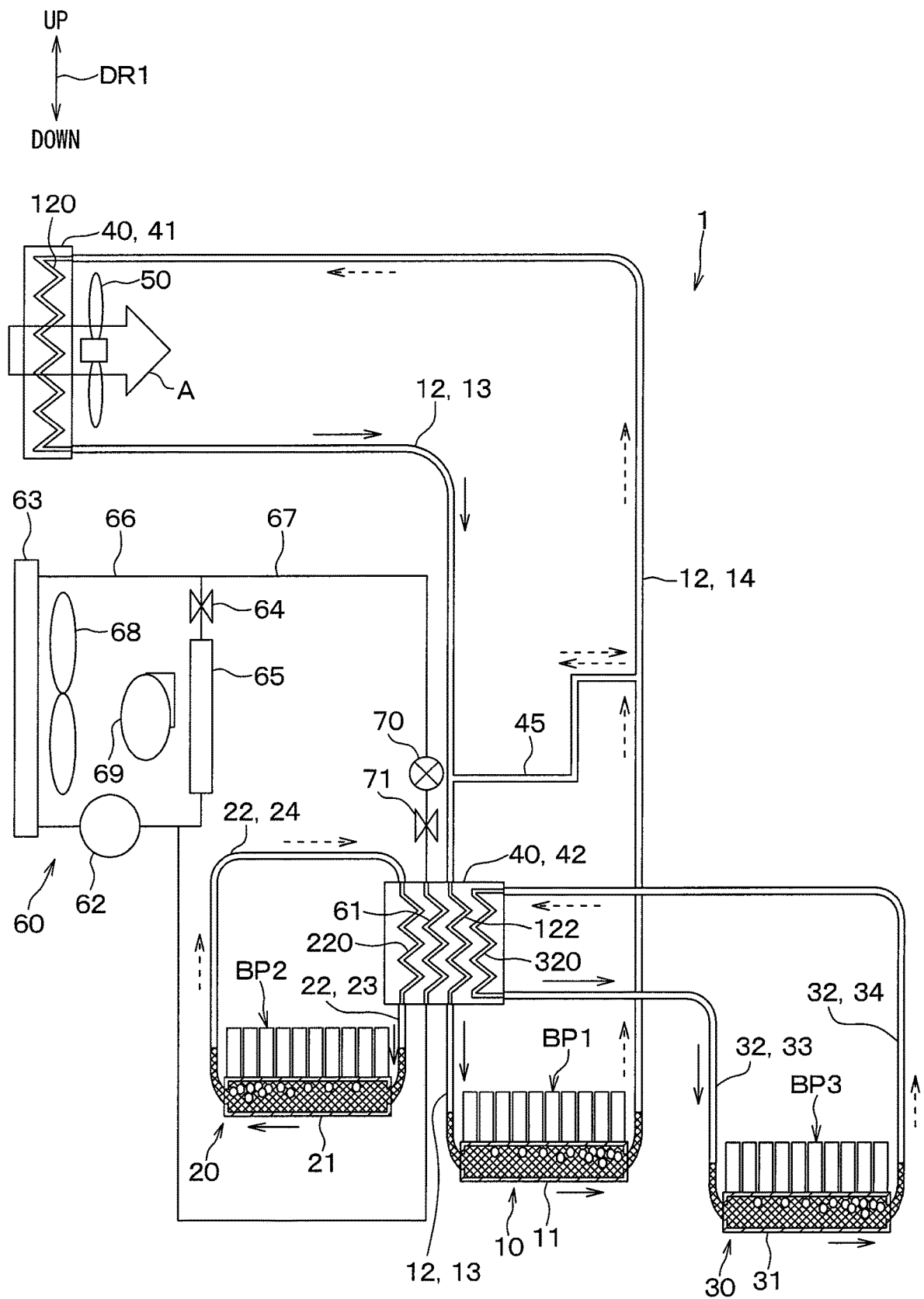
FIG. 24 is a schematic view illustrating the machine temperature control device of the tenth embodiment.

As shown in FIG. 19 and FIG. 20, a second main condenser 42 included in a machine temperature control device 1 according to the ninth embodiment is configured so as to exchange a heat between a working fluid flowing through a first intermediate heat exchanger 122 provided below a first heat exchanger 120 in a gravitational direction in a first passage 12 provided in a first thermosiphon circuit 10 and a cold air blown by a blower 72 through an evaporator 61 provided in a refrigeration cycle 60. In FIGS. 19 and 20, a flow of the cold air is indicated by an arrow CA. Even with the configuration described above, the ninth embodiment can exhibit the same operation and effects as those in the eighth embodiment.

Tenth Embodiment

A tenth embodiment will be described. In the tenth embodiment, the second main condenser 42 also functions as the sub condenser 44 in comparison with the eighth embodiment, and the other configurations are the same as those in the eighth embodiment, and therefore only portions different from the eighth embodiment will be described.

As shown in FIGS. 21 to 24, a first main condenser 41 included in a machine temperature control device 1 according to the tenth embodiment is configured to exchange a heat between a working fluid flowing through a first heat exchanger 120 provided in a first thermosiphon circuit 10 and an air as a predetermined cold energy supply medium.

On the other hand, a second main condenser 42 included in the machine temperature control device 1 according to the tenth embodiment also has the function of the sub condenser 44. The second main condenser 42 is formed by integrating a first intermediate heat exchanger 122 provided in the first thermosiphon circuit 10, second and third heat exchangers 220 and 320 provided in second and third thermosiphon circuits 20 and 30, and an evaporator 61 provided in a refrigeration cycle 60. The first intermediate heat exchanger 122 included in the first thermosiphon circuit 10 is provided below the first heat exchanger 120 in the gravitational direction in a first forward passage 13 included in the first passage 12. The second main condenser 42 is configured to exchange a heat among the working fluid flowing through the first intermediate heat exchanger 122, the working fluid flowing through the second and third heat exchangers 220 and 320, and the refrigerant of the refrigeration cycle 60 as another cold energy supply medium.

The first main condenser 41 and the second main condenser 42 are connected in series with each other, and the second main condenser 42 is disposed below the first main condenser 41 in the gravitational direction.

The working fluid condensed in the first main condenser 41 and put into in a liquid phase flows down through the first forward passage 13 by its own weight and flows into the second main condenser 42. In the second main condenser 42, the working fluid flowing through the first intermediate heat exchanger 122, the refrigerant of the refrigeration cycle 60, and the working fluid flowing through the second and third heat exchangers 220 and 320 exchange the heat with each other. Therefore, the working fluid flowing through the first intermediate heat exchanger 122 is further cooled by a heat exchange with the refrigerant of the refrigeration cycle 60 in the second main condenser 42. The working fluid flowing through the second and third heat exchangers 220 and 320 is also cooled and condensed by exchanging the heat with the working fluid flowing through the first intermediate heat exchanger 122 and by exchanging the heat with the refrigerant of the refrigeration cycle 60.

The machine temperature control device 1 according to the tenth embodiment includes a communication passage 45 in the first thermosiphon circuit 10. One end of the communication passage 45 communicates with a portion of the first forward passage 13 between the first main condenser 41 and the second main condenser 42, and the other end communicates with the first return passage 14. The end portion of the communication passage 45 on the side communicating with the first forward passage 13 is located at a position lower in the gravitational direction than the end portion on the side communicating with the first return passage 14.

As a result, when the temperature of the outside air for exchanging a heat with the working fluid in the first main condenser 41 is high, the gas phase working fluid flowing through the first return passage 14 can flow through the communication passage 45 to the second main condenser 42 without passing through the first main condenser 41. In this case, the working fluid is prevented from being heated by an outside air in the first main condenser 41. Therefore, the machine temperature control device 1 can cool the batteries BP1, BP2, and BP3 with the use of the second main condenser 42 even when the temperature of the outside air is high.

Further, since the end portion of the communication passage 45 on the side communicating with the first forward passage 13 is at a position lower in the gravitational direction than the end portion on the side communicating with the first return passage 14, when the working fluid condensed in the first main condenser 41 flows down in the first forward passage 13 by its own weight, the working fluid in the liquid phase is prevented from flowing into the communication passage 45. Thus, the above configuration allows the working fluid to flow from the first main condenser 41 to the second main condenser 42.

The tenth embodiment described above can achieve the same operation and effects as those in the eighth embodiment. Further, with simplification of the configuration as compared with the eighth embodiment, the utilization efficiency of the space is improved, and the vehicle mountability and the flexibility of vehicle mounting in the machine temperature control device 1 can be improved.

Eleventh Embodiment

An eleventh embodiment will be described. The eleventh embodiment is the same as the tenth embodiment except that the configuration of the second main condenser 42 is changed from the tenth embodiment, and therefore, only portions different from the tenth embodiment will be described.

Figure 25:
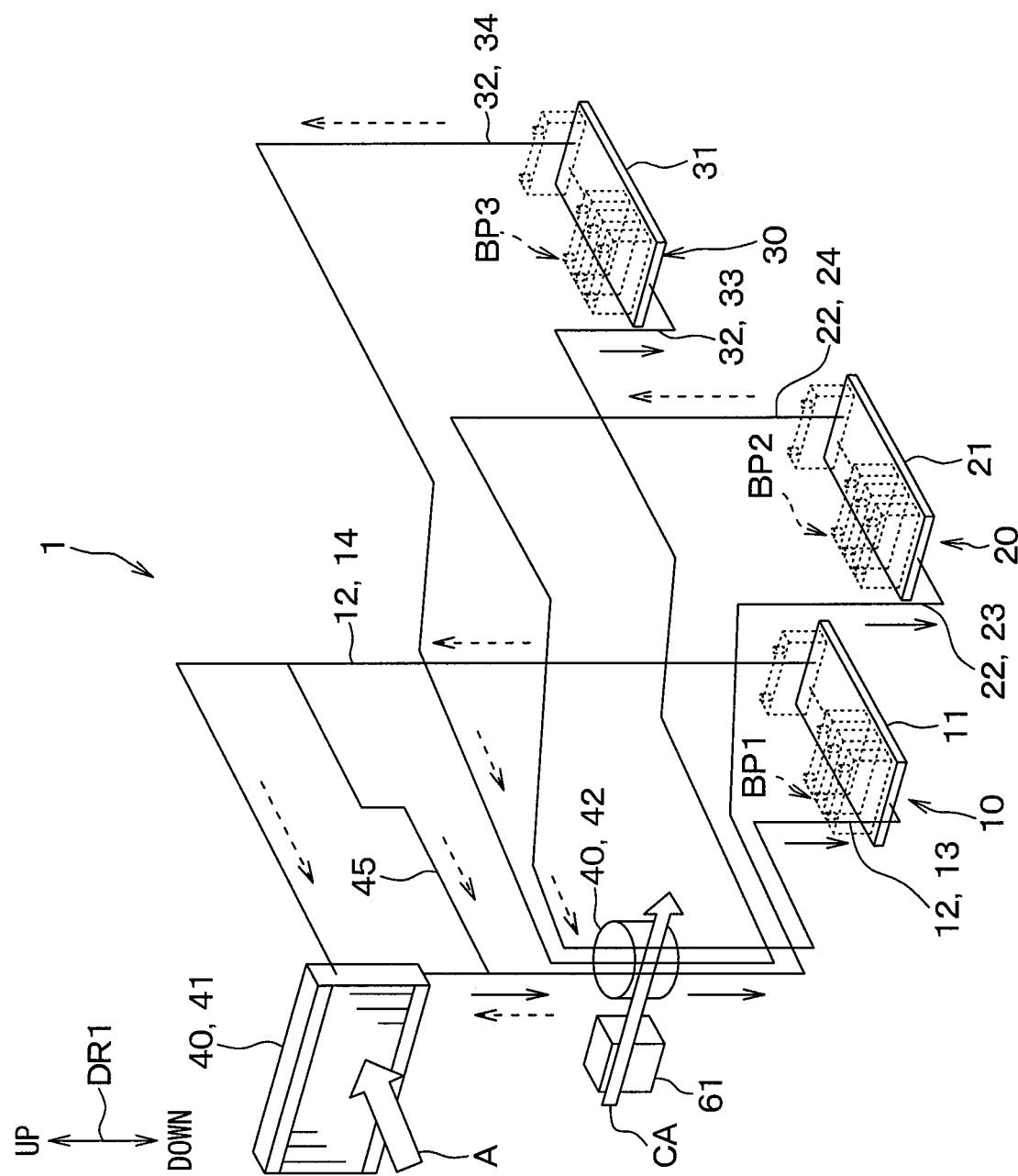
FIG. 25 is a perspective view illustrating a machine temperature control device according to an eleventh embodiment.
Figure 26:
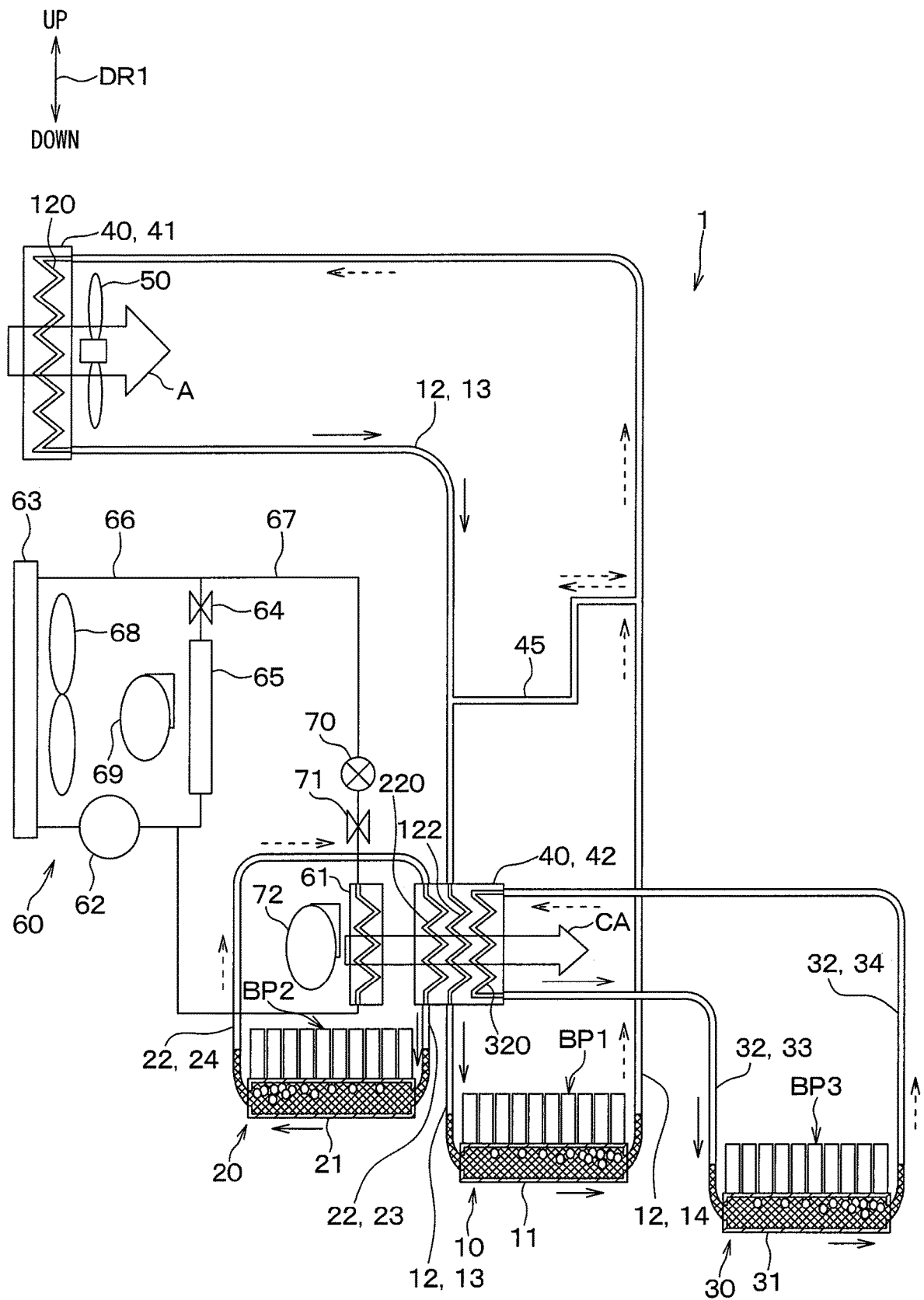
FIG. 26 is a schematic view illustrating the machine temperature control device of the eleventh embodiment.

As shown in FIG. 25 and FIG. 26, a second main condenser 42 included in a machine temperature control device 1 according to the eleventh embodiment is formed by integrating a first intermediate heat exchanger 122 provided in a first thermosiphon circuit 10 and second and third heat exchanger 220 and 320 provided in second and third thermosiphon circuits 20 and 30. The second main condenser 42 is configured so as to exchange a heat among a cold air blown by a blower 72 through an evaporator 61 included in a refrigeration cycle 60, a working fluid flowing through the first intermediate heat exchanger 122, and a working fluid flowing through the second and third heat exchangers 220 and 320. Even with the configuration described above, the eleventh embodiment can exhibit the same operation and effects as those in the tenth embodiment.

Twelfth Embodiment

A twelfth embodiment will be described. In the twelfth embodiment, the configuration of the pipe 66 is changed from that of the fourth embodiment, and the other configurations are the same as those in the fourth embodiment, and therefore only portions different from those of the fourth embodiment will be described.

Figure 27:
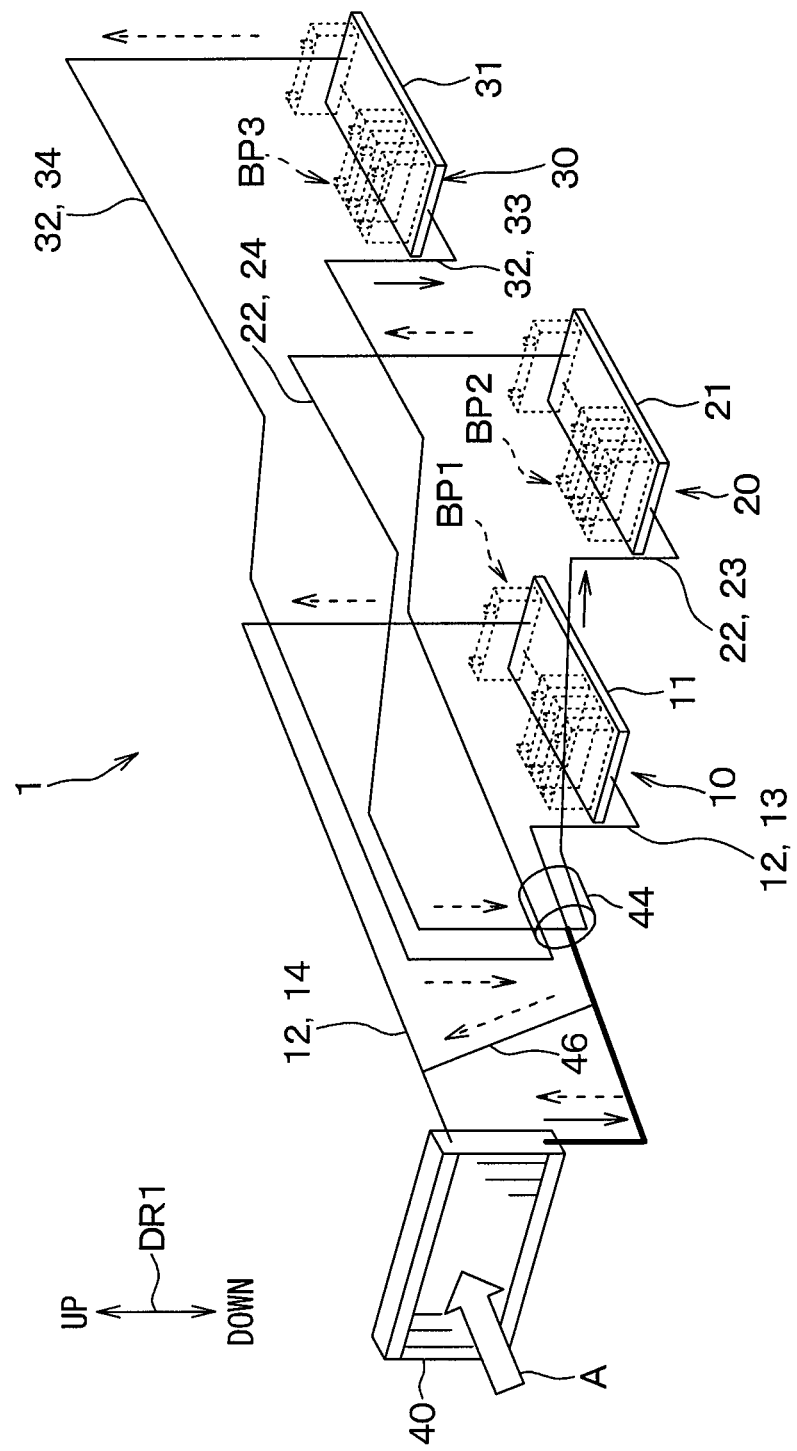
FIG. 27 is a perspective view illustrating a machine temperature control device according to a twelfth embodiment.
Figure 28:
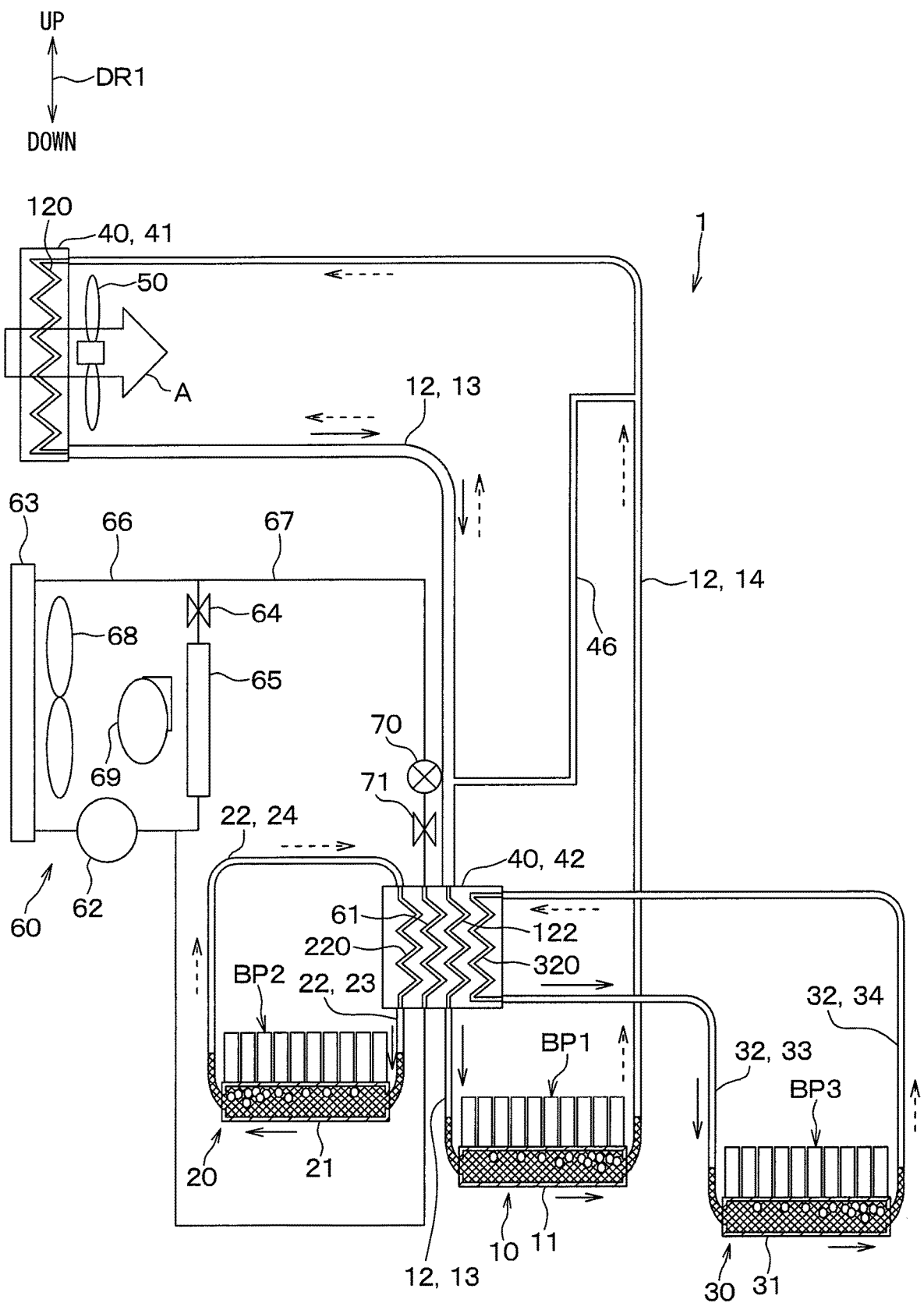
FIG. 28 is a schematic view illustrating a machine temperature control device according to a thirteenth embodiment.

As shown in FIG. 27, in a machine temperature control device 1 according to the twelfth embodiment, an inner diameter of a portion between a main condenser 40 and a sub condenser 44 in a first forward passage 13 provided in a first thermosiphon circuit 10 is larger than an inner diameter of a portion between the sub condenser 44 and a first evaporator 11 in the first forward passage 13. Alternatively, the inner diameter of the portion of the first forward passage 13 between the main condenser 40 and the sub condenser 44 is larger than an inner diameter of a first return passage 14 and an inner diameter of a second or third passages 22 and 32. In FIG. 27, a portion of the first forward passage 13 having a large inner diameter is indicated by a thick line. In FIG. 28, a portion of the first forward passage 13 having a large inner diameter is represented by widening an interval between two main lines indicating a passage.

As a result, when the working fluid flowing through the first lower heat exchanger 121 in the sub condenser 44 absorbs a heat from the working fluid flowing through the second or third heat exchanger 220 or 320 and evaporates into a gas, the gas phase working fluid passes through the portion of the first forward passage 13 having the large inner diameter and flows to the main condenser 40. For that reason, a flow of the liquid phase working fluid condensed by the main condenser 40 and flowing down through the first forward passage 13 by its own weight is prevented from being inhibited by the gas phase working fluid flowing backward from the sub condenser 44, and the liquid phase working fluid smoothly flows into the sub condenser 44. Therefore, the machine temperature control device 1 can enhance the cooling capacity of the batteries BP1, BP2, and BP3.

Further, the machine temperature control device 1 according to the twelfth embodiment includes a bypass passage 46 in the first thermosiphon circuit 10. One end of the bypass passage 46 communicates with a portion of the first forward passage 13 between the main condenser 40 and the sub condenser 44, and the other end communicates with the first return passage 14. In addition, an end portion of the bypass passage 46 on a side communicating with the first forward passage 13 is located at a position lower than an end portion on a side communicating with the first return passage 14 in the gravitational direction and at a position close to the sub condenser 44.

As a result, when the working fluid flowing through the first lower heat exchanger 121 in the sub condenser 44 absorbs the heat from the working fluid flowing through the second or third heat exchanger 220 or 320 and evaporates into a gas, the gas phase working fluid flows through the bypass passage 46 to the first return passage 14. For that reason, a flow of the liquid phase working fluid condensed by the main condenser 40 and flowing down through the first forward passage 13 by its own weight is prevented from being inhibited by the gas phase working fluid flowing backward from the sub condenser 44, and the liquid phase working fluid smoothly flows into the sub condenser 44. In addition, since the gas phase working fluid flowing backward from the sub condenser 44 flows from the first forward passage 13 to the bypass passage 46 to prevent the gas phase working fluid from bursting in the first forward passage 13, the generation of abnormal noise can be prevented.

Thirteenth Embodiment

A thirteenth embodiment will be described. In the thirteenth embodiment, the sub condenser 44 described in the twelfth embodiment is replaced with the second main condenser 42 described in the tenth embodiment, and the other configurations are the same as those in the twelfth embodiment, and therefore, only portions different from the twelfth embodiment will be described.

As shown in FIG. 28, a second main condenser 42 included in a machine temperature control device 1 according to the thirteenth embodiment also functions as a sub condenser 44. The second main condenser 42 is formed by integrating a first intermediate heat exchanger 122 provided in the first thermosiphon circuit 10, second and third heat exchangers 220 and 320 provided in second and third thermosiphon circuits 20 and 30, and an evaporator 61 provided in a refrigeration cycle 60. The second main condenser 42 is configured to exchange a heat among the working fluid flowing through the first intermediate heat exchanger 122, the working fluid flowing through the second and third heat exchangers 220 and 320, and the refrigerant of the refrigeration cycle 60 as another cold energy supply medium.

In the machine temperature control device 1 according to the thirteenth embodiment, an inner diameter of a portion between a first main condenser 41 and the second main condenser 42 in a first forward passage 13 provided in the first thermosiphon circuit 10 is larger than an inner diameter of a portion between the second main condenser 42 and the first evaporator 11 in the first forward passage 13. Alternatively, the inner diameter of the portion of the first forward passage 13 between the first main condenser 41 and the second main condenser 42 is larger than an inner diameter of the first return passage 14 and an inner diameter of the second or third passages 22 and 32.

As a result, when the working fluid flowing through the first intermediate heat exchanger 122 in the second main condenser 42 absorbs the heat from the working fluid flowing through the second and third heat exchangers 220 and 320, and evaporates into a gas, the gas phase working fluid passes through the portion of the first forward passage 13 having the large inner diameter and flows to the first main condenser 41. For that reason, a flow of the liquid phase working fluid condensed by the first main condenser 41 and flowing down through the first forward passage 13 by its own weight is prevented from being inhibited by the gas phase working fluid flowing backward from the second main condenser 42, and the liquid phase working fluid smoothly flows into the second main condenser 42. Therefore, the machine temperature control device 1 can enhance the cooling capacity of the batteries BP1, BP2, and BP3.

The machine temperature control device 1 according to the thirteenth embodiment includes a bypass passage 46 in the first thermosiphon circuit 10. One end of the bypass passage 46 communicates with a portion of the first forward passage 13 between the first main condenser 41 and the second main condenser 42, and the other end communicates with the first return passage 14. In addition, the bypass passage 46 is located at a position where the end portion on the side communicating with the first forward passage 13 is lower in the gravitational direction than the end portion on the side communicating with the first return passage 14, and at a position close to the second main condenser 42.

As a result, when the working fluid flowing through the first intermediate heat exchanger 122 in the second main condenser 42 absorbs the heat from the working fluid flowing through the second and third heat exchangers 220 and 320 and evaporates into a gas, the gas phase working fluid flows through the bypass passage 46 to the first return passage 14. For that reason, a flow of the liquid phase working fluid condensed by the first main condenser 41 and flowing down through the first forward passage 13 by its own weight is prevented from being inhibited by the gas phase working fluid flowing backward from the second main condenser 42, and the liquid phase working fluid smoothly flows into the second main condenser 42. In addition, since the gas phase working fluid flowing backward from the second main condenser 42 flows from the first forward passage 13 to the bypass passage 46 so that the gas phase working fluid is prevented from bursting in the first forward passage 13, the generation of abnormal noise can be prevented.

Fourteenth Embodiment

A fourteenth embodiment will be described. In the fourteenth embodiment, the function of the sub condenser 44 is separated from that of the second main condenser 42 in the thirteenth embodiment, and a communication passage 45 is further provided. Since the other configuration is the same as that of the thirteenth embodiment, only portions different from those of the thirteenth embodiment will be described.

Figure 29:
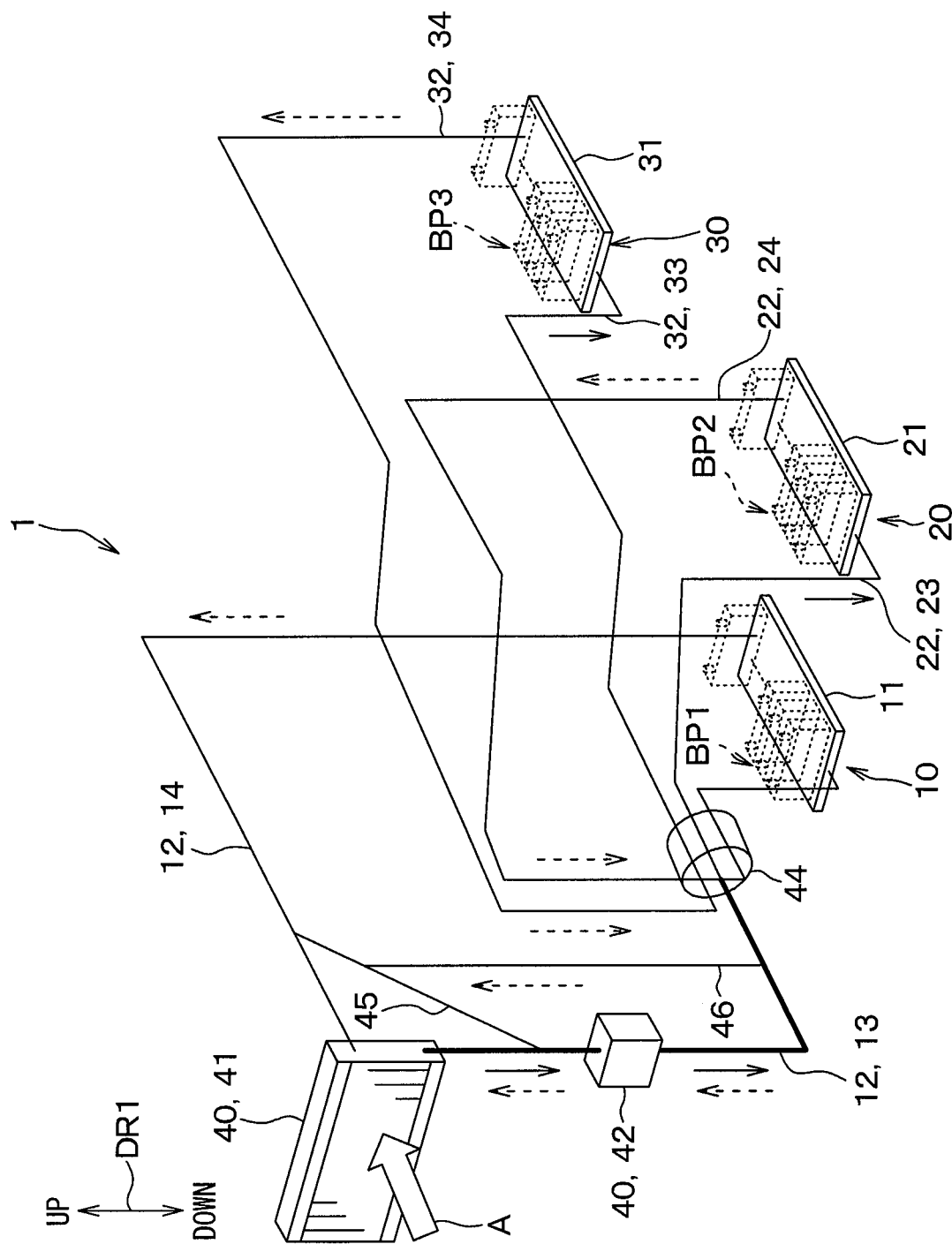
FIG. 29 is a perspective view illustrating a machine temperature control device according to a fourteenth embodiment.
Figure 30:
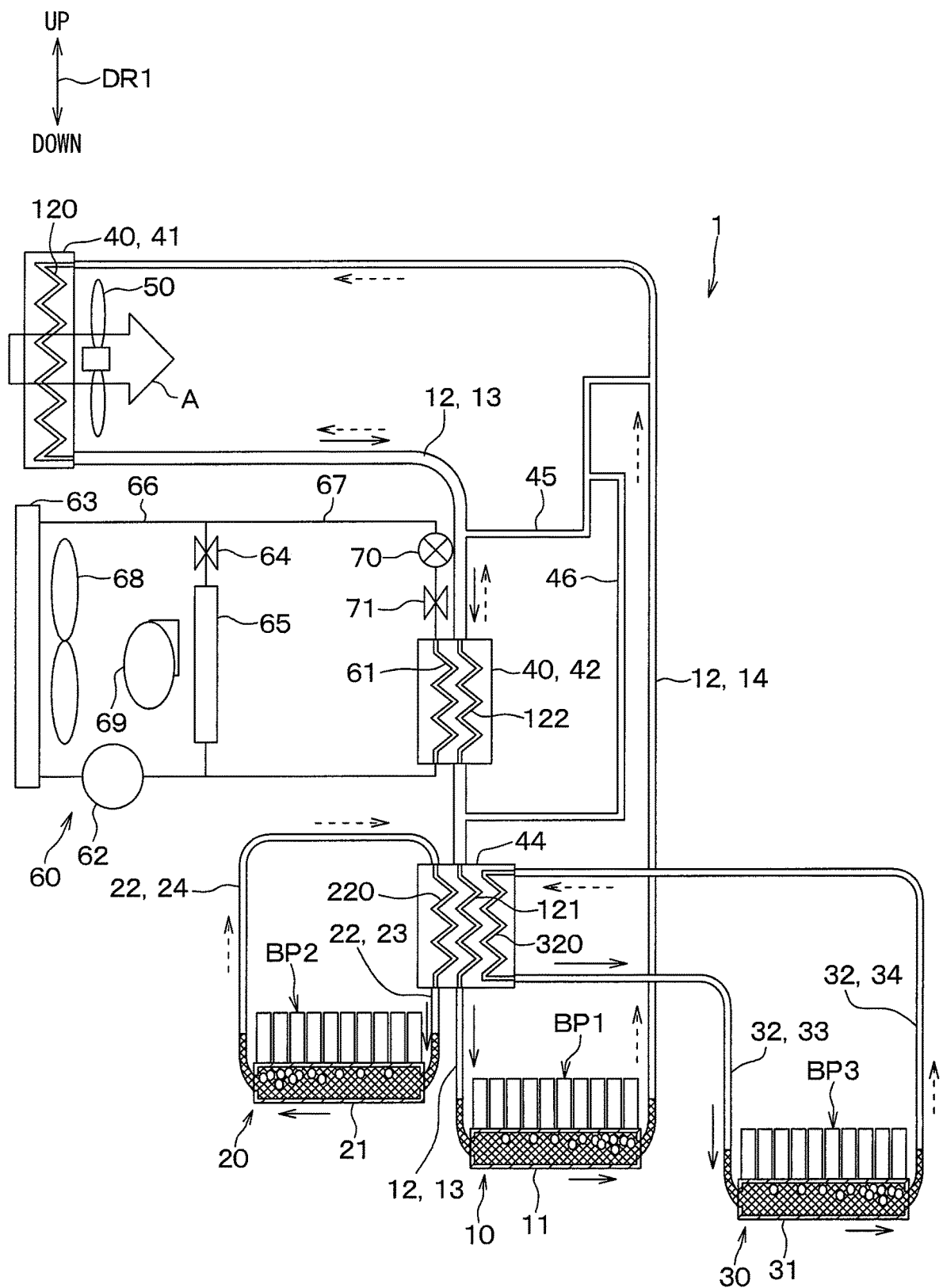
FIG. 30 is a schematic view illustrating the machine temperature control device of the fourteenth embodiment.

As shown in FIG. 29 and FIG. 30, in the machine temperature control device 1 according to the fourteenth embodiment, an inner diameter of a portion between a first main condenser 41 and a sub condenser 44 in a first forward passage 13 provided in a first thermosiphon circuit 10 is larger than an inner diameter of a portion between the sub condenser 44 and a first evaporator 11. Alternatively, an inner diameter of a portion of the first forward passage 13 between the first main condenser 41 and the sub condenser 44 is larger than an inner diameter of the first return passage 14 and an inner diameter of the second or third passages 22 and 32.

As a result, when the working fluid flowing through the first lower heat exchanger 121 in the sub condenser 44 absorbs the heat from the working fluid flowing through the second or third heat exchanger 220 or 320 and evaporates into a gas, a part of the working fluid in the gas phase passes through a portion having a large inner diameter in the first forward passage 13 and flows to the first main condenser 41 through the second main condenser 42. For that reason, a flow of the liquid phase working fluid condensed by the first main condenser 41 and the second main condenser 42 and flowing down through the first forward passage 13 by its own weight is prevented from being inhibited by the gas phase working fluid flowing backward from the sub condenser 44, and the liquid phase working fluid smoothly flows into the sub condenser 44. Therefore, the machine temperature control device 1 can enhance the cooling capacity of the batteries BP1, BP2, and BP3.

The machine temperature control device 1 according to the fourteenth embodiment includes a communication passage 45 in the first thermosiphon circuit 10. One end of the communication passage 45 communicates with a portion of the first forward passage 13 between the first main condenser 41 and the second main condenser 42, and the other end communicates with the first return passage 14. The end portion of the communication passage 45 on the side communicating with the first forward passage 13 is located at a position lower in the gravitational direction than the end portion on the side communicating with the first return passage 14.

As a result, when the temperature of the outside air for exchanging a heat with the working fluid in the first main condenser 41 is high, the gas phase working fluid flowing through the first return passage 14 can flow through the communication passage 45 to the second main condenser 42 without passing through the first main condenser 41. In this case, the working fluid is prevented from being heated by an outside air in the first main condenser 41. Therefore, the machine temperature control device 1 can cool the batteries BP1, BP2, and BP3 with the use of the second main condenser 42 even when the temperature of the outside air is high.

Further, since the end portion of the communication passage 45 on the side communicating with the first forward passage 13 is at a position lower in the gravitational direction than the end portion on the side communicating with the first return passage 14, when the working fluid condensed in the first main condenser 41 flows down in the first forward passage 13 by its own weight, the working fluid in the liquid phase is prevented from flowing into the communication passage 45. Thus, the above configuration allows the working fluid to flow from the first main condenser 41 to the second main condenser 42.

Further, the machine temperature control device 1 according to the fourteenth embodiment includes a bypass passage 46 in the first thermosiphon circuit 10. One end of the bypass passage 46 communicates with a portion of the first forward passage 13 between the second main condenser 42 and the sub condenser 44, and the other end communicates with the communication passage 45. In addition, the bypass passage 46 is located at a position where the end portion on the side communicating with the first forward passage 13 is lower than the end portion on the side communicating with the communication passage 45 in the gravitational direction, and at a position close to the sub condenser 44.

As a result, when the working fluid flowing through the first lower heat exchanger 121 absorbs the heat from the working fluid flowing through the second or third heat exchanger 220 or 320 in the sub condenser 44 and evaporates into a gas, a part of the working fluid in the gas phase flows from the communication passage 45 to the first return passage 14 through the bypass passage 46. For that reason, a flow of the liquid phase working fluid condensed by the first main condenser 41 and the second main condenser 42 and flowing down through the first forward passage 13 by its own weight is prevented from being inhibited by the gas phase working fluid flowing backward from the sub condenser 44, and the liquid phase working fluid smoothly flows into the sub condenser 44. In addition, since the gas phase working fluid flowing backward from the sub condenser 44 flows from the first forward passage 13 to the bypass passage 46 to prevent the gas phase working fluid from bursting in the first forward passage 13, the generation of abnormal noise can be prevented.

Fifteenth Embodiment

A fifteenth embodiment will be described. The fifteenth embodiment is a combination of the first embodiment and the fourth embodiment.

Figure 31:
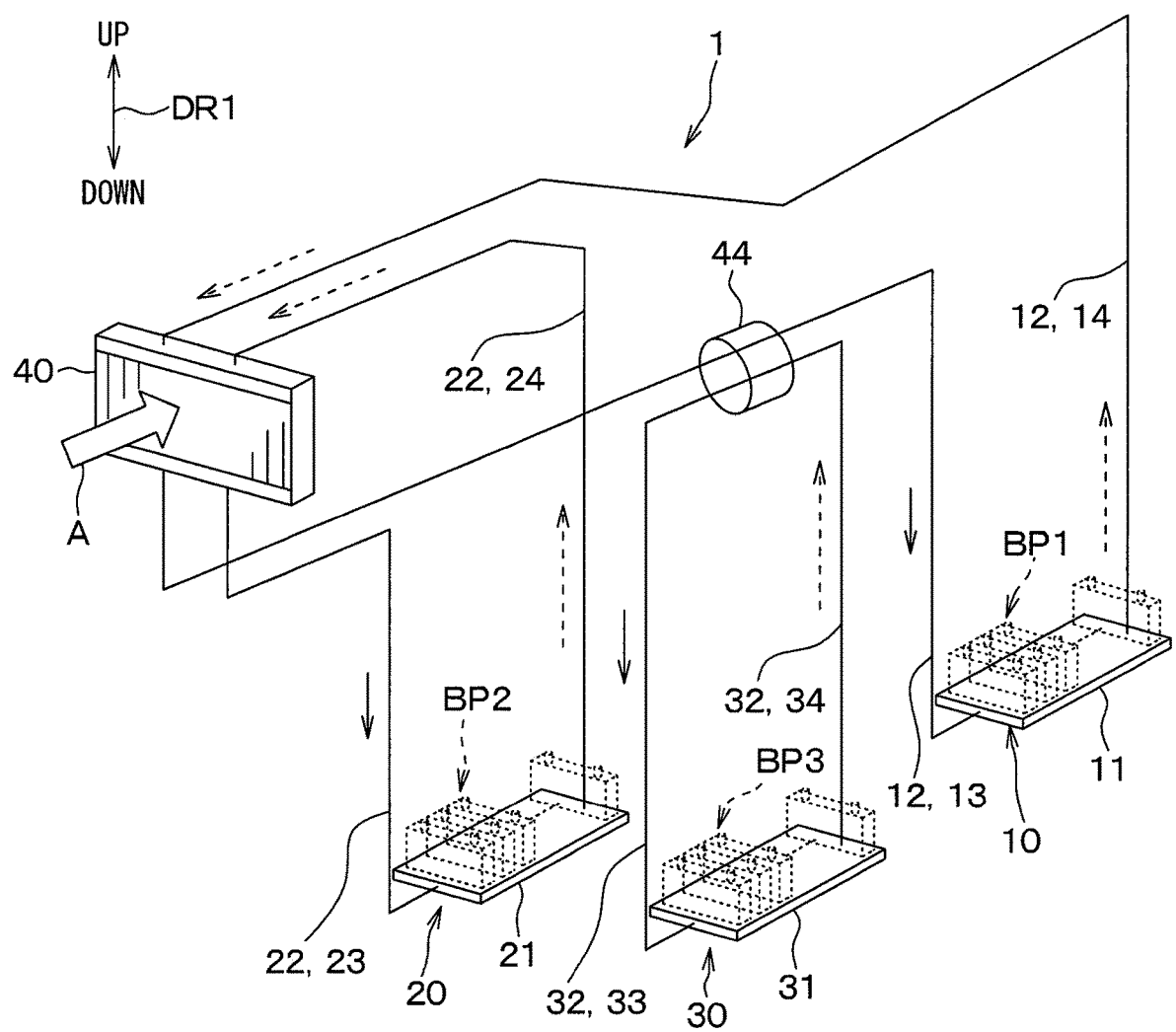
FIG. 31 is a perspective view illustrating a machine temperature control device according to a fifteenth embodiment.
Figure 32:
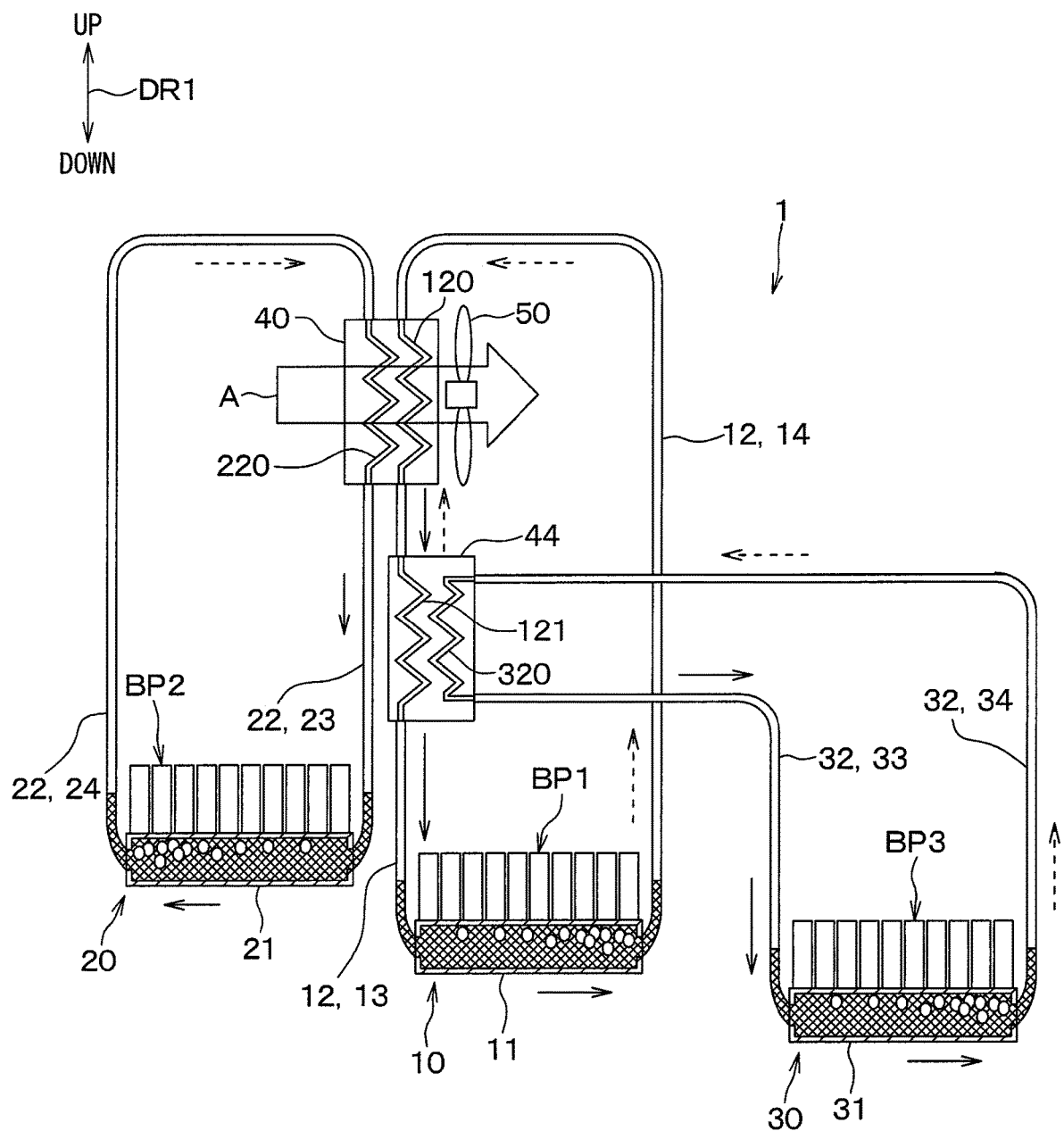
FIG. 32 is a schematic view illustrating the machine temperature control device of the fifteenth embodiment.

As shown in FIGS. 31 and 32, a machine temperature control device 1 according to the fifteenth embodiment includes a main condenser 40 that is configured to exchange a heat between a working fluid flowing through first and second passages 12 and 22 and an air as a predetermined cold energy supply medium. In the main condenser 40, a first heat exchanger 120 provided in the first passage 12 and a second heat exchanger 220 provided in the second passage 22 are integrally formed. The main condenser 40 is capable of allowing an outside air to flow to the first and second heat exchangers 120 and 220 by the rotation of a fan 50. The main condenser 40 is made of a metal having a high thermal conductivity such as aluminum or copper. In the main condenser 40, the first and second heat exchangers 120 and 220 are disposed so as to be thermally conductive. For that reason, a working fluid flowing through the first and second heat exchangers 120 and 220 can exchange the heat with the outside air, and can also exchange the heat between the working fluids flowing through the first and second heat exchangers 120 and 220.

Further, the machine temperature control device 1 according to the fifteenth embodiment includes a sub condenser 44 that is disposed below the main condenser 40 in the gravitational direction. The sub condenser 44 is made of a metal having a high thermal conductivity such as aluminum or copper. The sub condenser 44 includes a first lower heat exchanger 121 provided in the first thermosiphon circuit 10 and a third heat exchanger 320 provided in the third thermosiphon circuit 30. The first lower heat exchanger 121 is provided below the first heat exchanger 120 in the first forward passage 13 in the gravitational direction. In the sub condenser 44, the working fluid flowing through the first lower heat exchanger 121 and the working fluid flowing through the third heat exchanger 320 exchange the heat with each other.

For that reason, a part of the liquid phase working fluid flowing through the first lower heat exchanger 121 absorbs the heat from the gas phase working fluid flowing through the third heat exchanger 320, evaporates into a gas, and flows back toward the main condenser 40 in the first forward passage 13. Another part of the liquid phase working fluid flowing through the first lower heat exchanger 121 maintains the liquid phase state, and flows down through the first forward passage 13 toward the first evaporator 11 by its own weight. The gas phase working fluid flowing through the third heat exchanger 320 is condensed by radiating the heat to the liquid phase working fluid flowing through the first lower heat exchanger 121, becomes a liquid phase working fluid, and flows down through the third forward passage 33 toward the third evaporator 31 by its own weight. At this time, since the working fluid flowing through the first lower heat exchanger 121 and the working fluid flowing through the third heat exchanger 320 are heat-exchanged with each other by the sub condenser 44, the temperatures of those working fluids are approximated.

Hereinafter, comparative examples to the multiple embodiments described above will be described.

First Comparative Example

Figure 33:
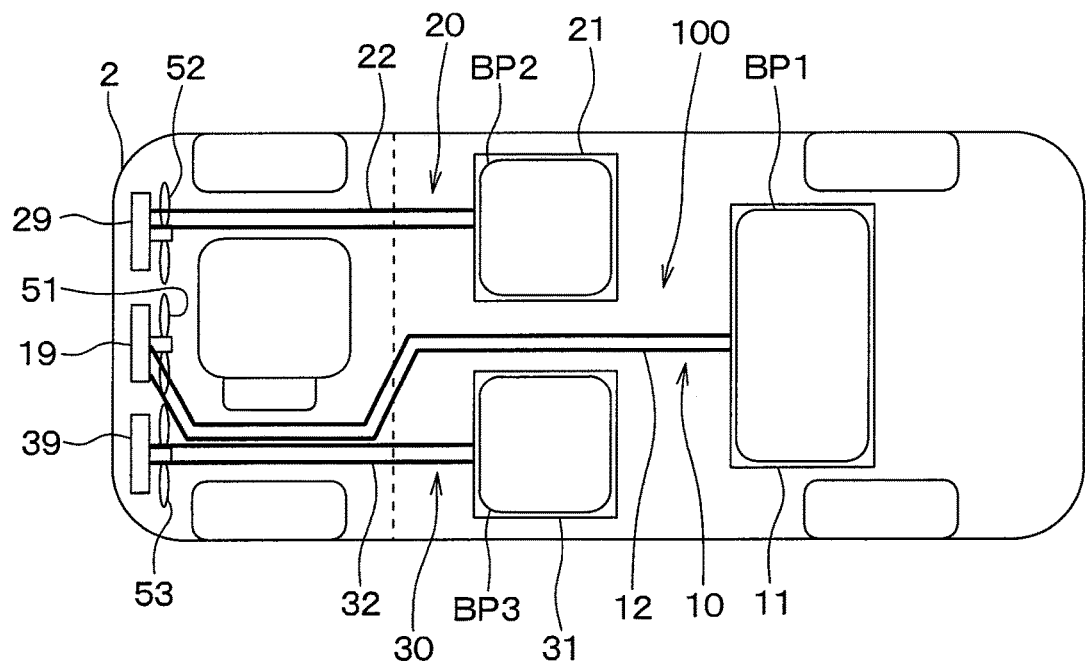
FIG. 33 is a schematic view illustrating a vehicle including a machine temperature control device of a first comparative example, seen from an upper side.
Figure 34:
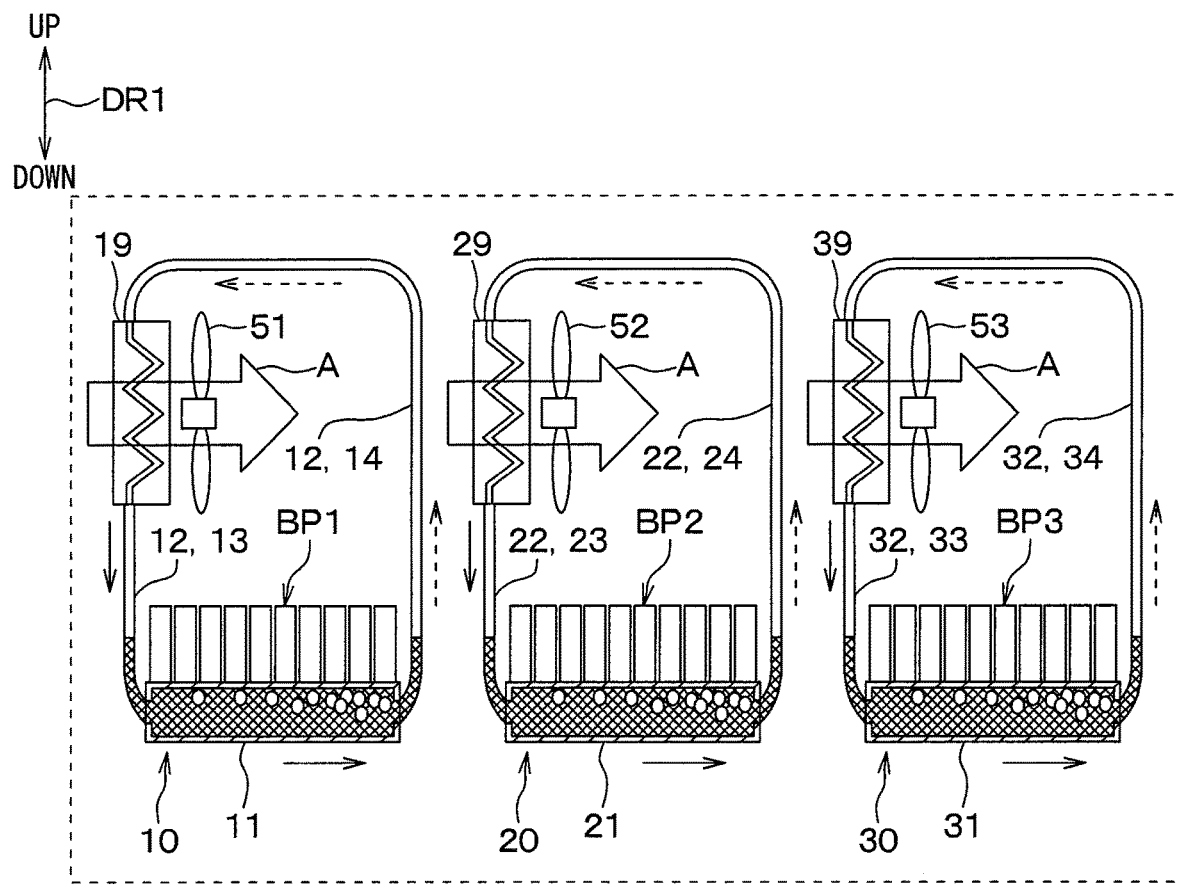
FIG. 34 is a schematic view illustrating the machine temperature control device of the first comparative example.

As shown in FIG. 33 and FIG. 34, in a machine temperature control device 100 according to a first comparative example, first to third thermosiphon circuits 10, 20, and 30 are individually disposed at multiple positions of a vehicle body. The respective first to third thermosiphon circuits 10, 20, and 30 include separate condensers 19, 29, and 39. In detail, the first to third condensers 19, 29, and 39 provided in the first to third thermosiphon circuits 10, 20, and 30, respectively, are disposed at predetermined intervals. The first to third condensers 19, 29, and 39 are respectively provided with corresponding fans 51, 52, and 53. As a result, in the machine temperature control device 100 of the first comparative example, spaces for mounting the condensers 19, 29, and 39 provided in the first to third thermosiphon circuits 10, 20, and 30, respectively, are required in an engine compartment. In addition, fans 51, 52, and 53 corresponding to the first to third condensers 19, 29, and 39, respectively, are required.

Further, in the configuration of the first comparative example, pipes forming the passages 12, 22, and 32 for connecting the evaporators 11, 21, and 31 of the first to third thermosiphon circuits 10, 20, and 30 to the condensers 19, 29, and 39 are all long. For that reason, the pipe is complicated to be routed in consideration of the vertical positional relationship so that the liquid phase working fluid flows.

Further, in the configuration of the first comparative example, when the number of batteries BP mounted on the vehicle 2 increases or decreases according to the vehicle type, the number of components and the number of design workloads of the multiple thermosiphon circuits increase according to the increase or decrease in the number of the batteries BP. Therefore, the machine temperature control device 100 in the first comparative example has a problem that the number of components increases, the vehicle mountability is poor due to the complexity of the configuration, and the flexibility of mounting the vehicle is limited.

Second Comparative Example

Figure 35:
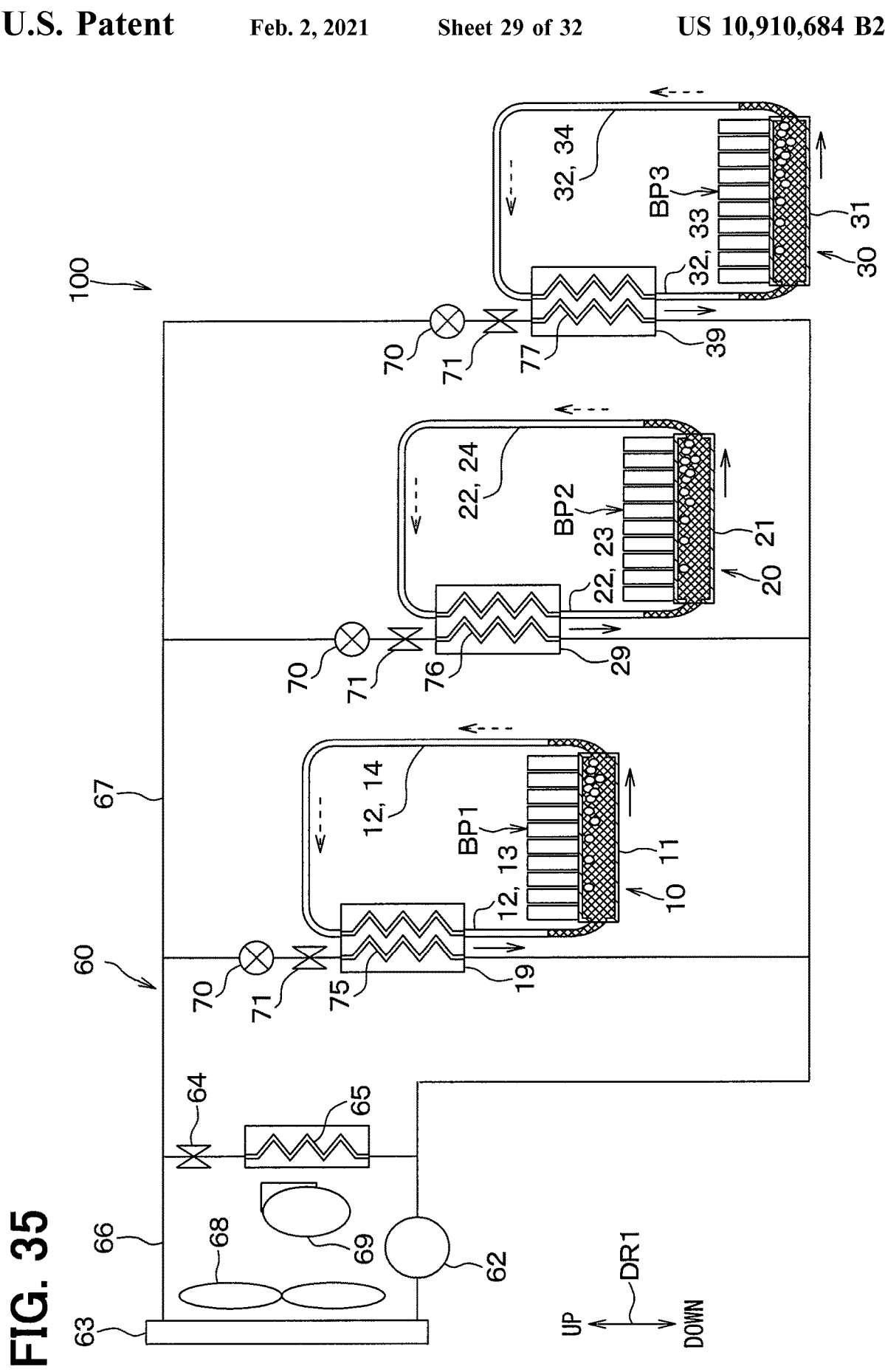
FIG. 35 is a schematic view illustrating a machine temperature control device of a second comparative example.

As shown in FIG. 35, in a second comparative example, first to third thermosiphon circuits 10, 20, and 30 are individually placed. The respective first to third thermosiphon circuits 10, 20, and 30 include separate condensers 19, 29, and 39. Each of the first to third condensers 19, 29, and 39 is integrally formed with evaporators 75, 76, and 77 included in a refrigeration cycle 60. As a result, in the machine temperature control device 100 according to the second comparative example, spaces for mounting the condensers 19, 29, and 39 provided in the first to third thermosiphon circuits 10, 20, and 30, respectively, are required in an engine compartment. In addition, evaporators 75, 76, and 77 corresponding to the first to third condensers 19, 29, and 39, respectively, are required. Therefore, the machine temperature control device 100 according to the second comparative example has the same problem as that of the machine temperature control device 100 in the first comparative example.

Third Comparative Example

Figure 36:
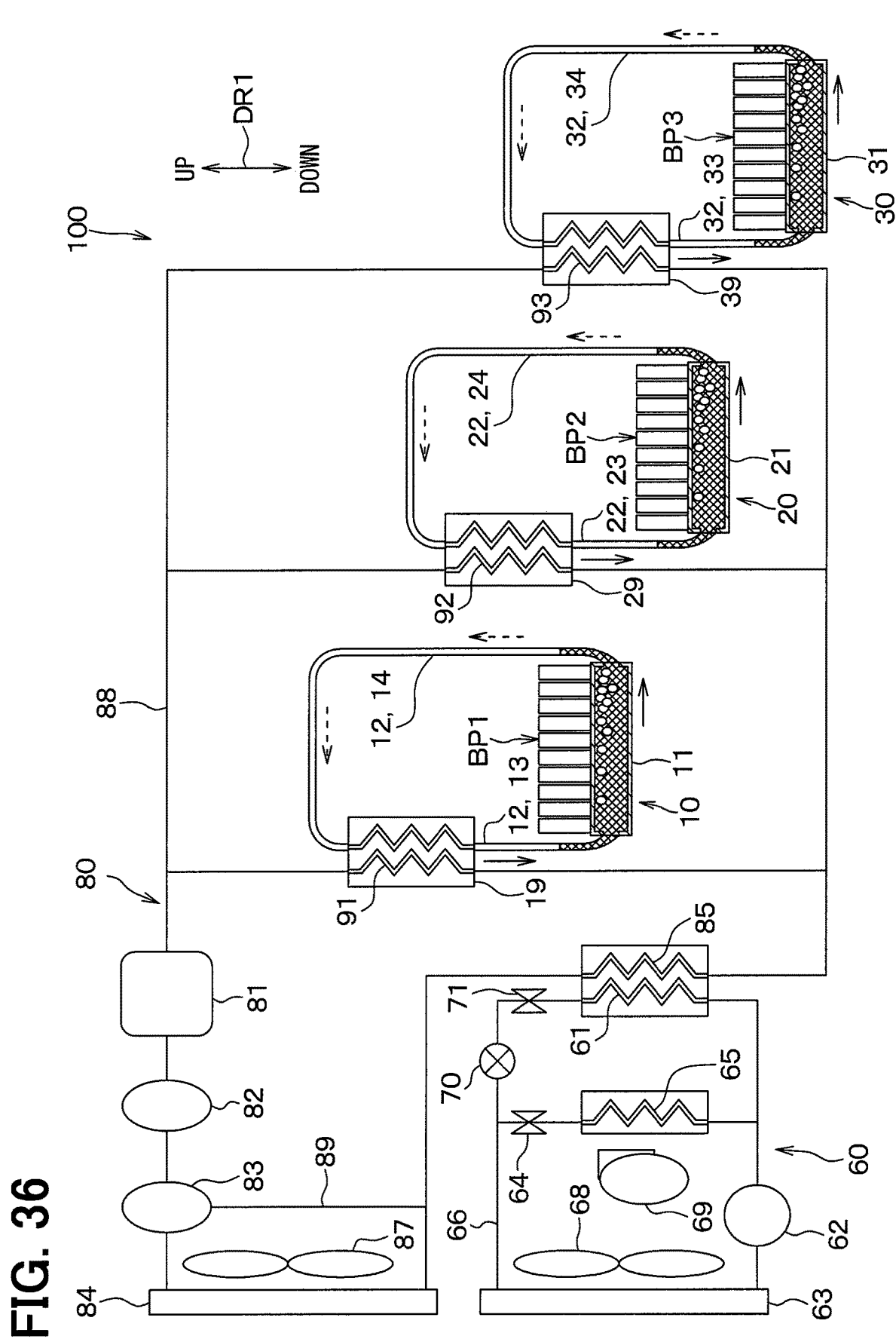
FIG. 36 is a schematic view illustrating a machine temperature control device of a third comparative example.

As shown in FIG. 36, also in a third comparative example, first to third thermosiphon circuits 10, 20, and 30 are individually placed. The respective first to third thermosiphon circuits 10, 20, and 30 include separate condensers 19, 29, and 39. The first to third condensers 19, 29, and 39 are all integrally formed with water passages 91, 92, and 93 of the coolant water circuit 80. As a result, in the machine temperature control device 100 of the third comparative example, spaces for mounting the condensers 19, 29, and 39 included in the first to third thermosiphon circuits 10, 20, and 30, respectively, are required in an engine compartment. In addition, water passages 91, 92, and 93 of the coolant water circuit 80 corresponding to the first to third condensers 19, 29, and 39, respectively, are required. Therefore, the machine temperature control device 100 according to the third comparative example has the same problem as that in the machine temperature control devices 100 according to the first and second comparative examples.

Fourth Comparative Example

Figure 37:
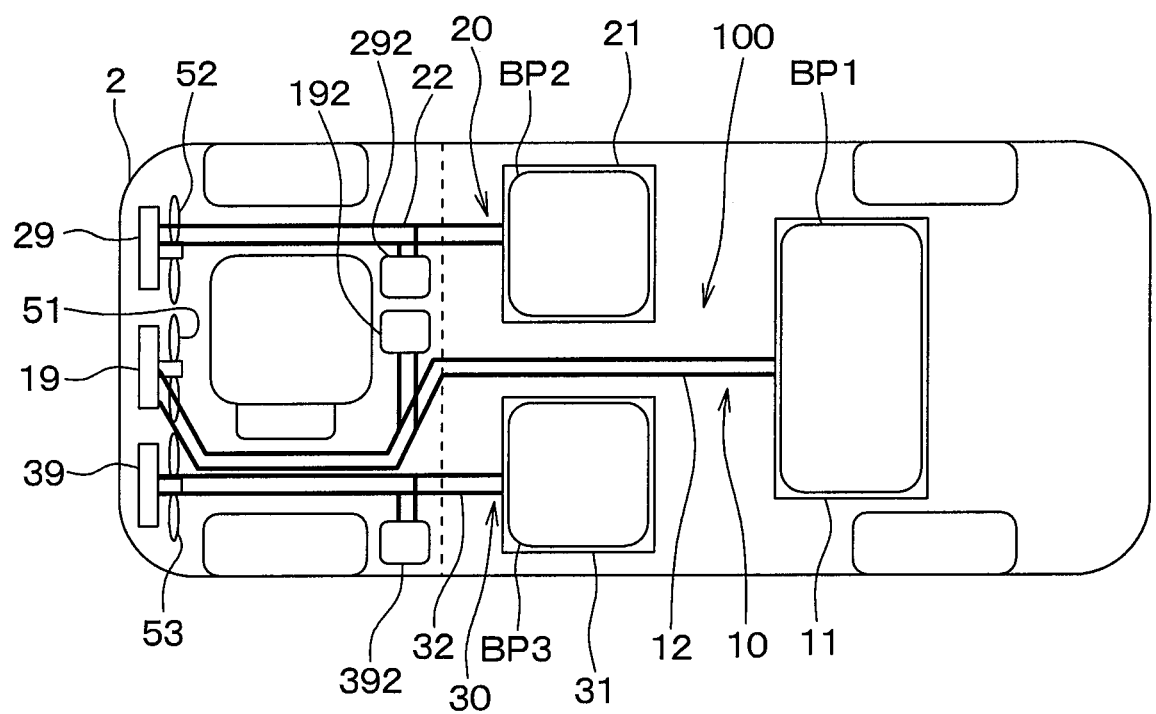
FIG. 37 is a schematic view illustrating a vehicle including a machine temperature control device of a fourth comparative example, seen from an upper side.
Figure 38:
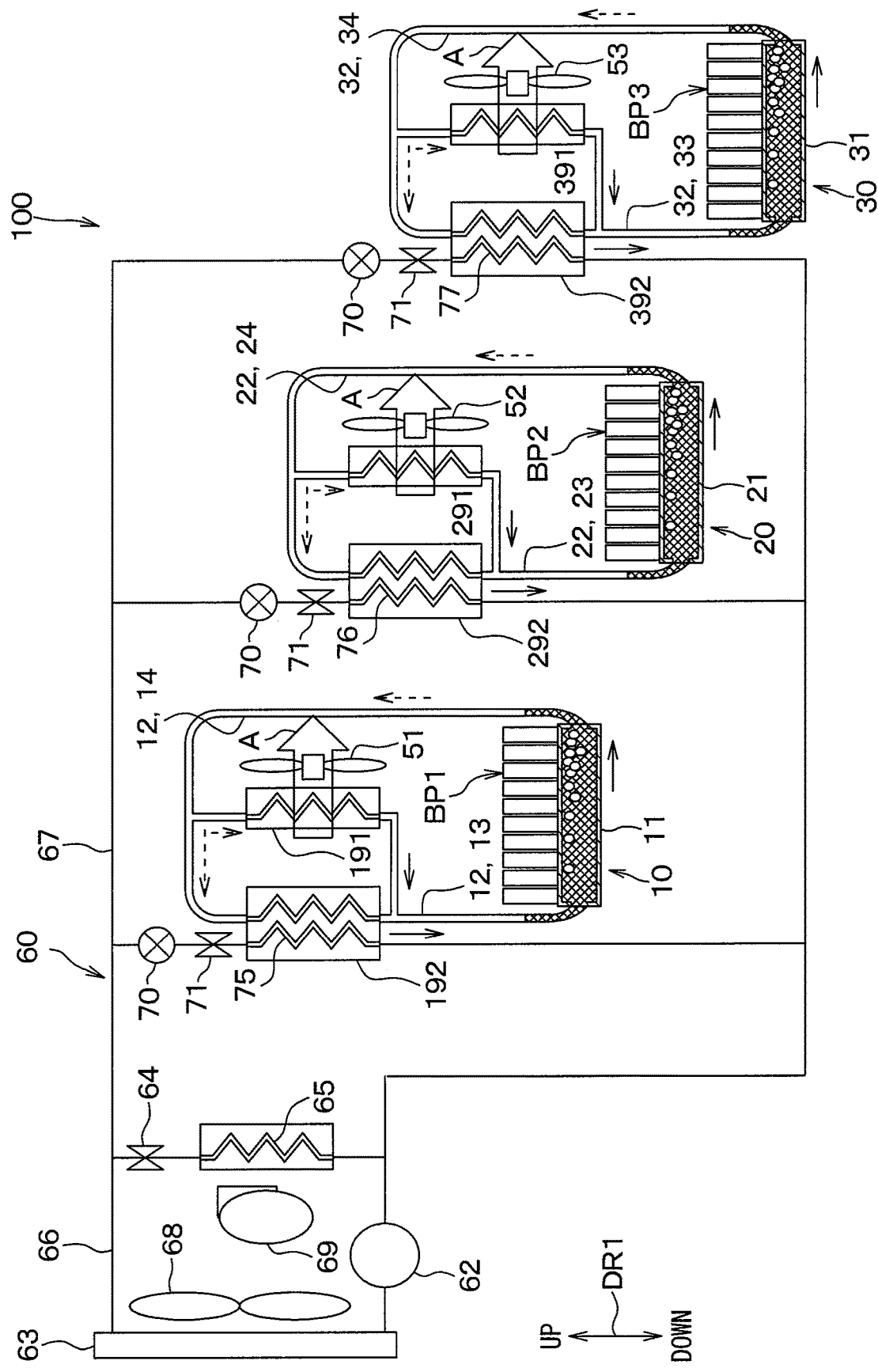
FIG. 38 is a schematic view illustrating the machine temperature control device of the fourth comparative example.

As shown in FIGS. 37 and 38, also in a fourth comparative example, first to third thermosiphon circuits 10, 20, and 30 are individually placed. First to third thermosiphon circuits 10, 20, and 30 each include separate first condensers 191, 291, 391, and second condensers 192, 292, and 392. In the respective thermosiphon circuits 10, 20, 30, the first condensers 191, 291, 391 and the second condensers 192, 292, 392 are all placed in parallel. More specifically, the first condensers 191, 291, and 391 of the first to third thermosiphon circuits 10, 20, and 30 are provided with fans 51, 52, and 53, respectively. The second condensers 192, 292, and 392 of the first to third thermosiphon circuits 10, 20, and 30 are all integrally formed with evaporators 75, 76, and 77 of the refrigeration cycle 60, respectively. Therefore, the machine temperature control device 100 according to the fourth comparative example has the same problem as that of the machine temperature control device 100 according to the first to third comparative examples.

Other Embodiments (1) In each of the embodiments described above, the target device to be cooled by the machine temperature control device 1 is described as the secondary batteries BP, but the target device is not limited to the secondary batteries BP. For example, the target device may be an electric device other than the secondary batteries BP, such as a motor, an inverter, or a charger, or may be a simple heating element. The target device is not limited to a vehicle-mounted device, and may be a device such as a base station that needs to be cooled in a fixed position.

(2) In each of the embodiments described above, the working fluid filled in the thermosiphon circuit is described as, for example, a fluorocarbon refrigerant, but the working fluid is not limited to the fluorocarbon refrigerant. For example, the working fluids may be other medium that changes phase, such as propane or $CO_2$.

(3) In each of the embodiments described above, the evaporator included in the thermosiphon circuit has been described as a case formed in a flat shape, but in other embodiments, the evaporator may include a heat exchange tube. The evaporator is not limited to being installed on the lower surface of the batteries BP, and may be disposed on the side surface or the upper surface of the batteries BP.

(4) In each of the embodiments described above, the machine temperature control device 1 has been described as including the first to third thermosiphon circuits 10, 20, and 30, but a plurality of thermosiphon circuits may be provided in the machine temperature control device 1. In other words, the machine temperature control device 1 may include, for example, a fourth or more thermosiphon circuits. Each thermosiphon circuit may also include a third or more main condenser 40, or a second or more sub condenser 44.

(5) In each of the embodiments described above, all of the multiple thermosiphon circuits included in the machine temperature control device 1 have been described as a loop type, but the thermosiphon circuit included in the machine temperature control device 1 is not limited to a loop type, and may have a single passage. In that case, the thermosiphon circuit may eliminate one of the forward passage and the return passage.

It should be appreciated that the present disclosure is not limited to the embodiments described above and can be modified appropriately within the scope of the appended claims. The embodiments above are not irrelevant to one another and can be combined appropriately unless a combination is obviously impossible. In the respective embodiments above, it goes without saying that elements forming the embodiments are not necessarily essential unless specified as being essential or deemed as being apparently essential in principle. In a case where a reference is made to the components of the respective embodiments as to numerical values, such as the number, values, amounts, and ranges, the components are not limited to the numerical values unless specified as being essential or deemed as being apparently essential in principle. Also, in a case where a reference is made to the components of the respective embodiments above as to shapes and positional relations, the components are not limited to the shapes and the positional relations unless explicitly specified or limited to particular shapes and positional relations in principle.

Conclusion

According to the first aspect represented by a part or all of the above embodiments, a machine temperature control device controls temperature of plural target devices, and includes: a first thermosiphon circuit, a second thermosiphon circuit, and a main condenser. The first thermosiphon circuit includes a first evaporator configured to cool a first target device by a latent heat of evaporation of a working fluid that absorbs a heat from the first target device, and a first passage communicating with the first evaporator. The second thermosiphon circuit includes a second evaporator configured to cool a second target device by a latent heat of evaporation of a working fluid that absorbs a heat from the second target device, and a second passage (22) communicating with the second evaporator. The main condenser includes a first heat exchanger provided in the first passage and a second heat exchanger provided in the second passage, and is configured to allow the working fluid flowing through the first heat exchanger, the working fluid flowing through the second heat exchanger, and a predetermined cold energy supply medium to exchange heat with each other. According to the second aspect, the machine temperature control device further includes a third thermosiphon circuit and a sub condenser. The third thermosiphon circuit includes a third evaporator configured to cool a third target device by a latent heat of evaporation of a working fluid that absorbs a heat from the third target device, and a third passage communicating with the third evaporator. The sub condenser is disposed below the main condenser in the gravitational direction. The sub condenser includes a lower heat exchanger provided below the first heat exchanger in the gravitational direction in the first passage and a third heat exchanger disposed in the third passage, to exchange heat between the working fluid flowing through the lower heat exchanger and the working fluid flowing through the third heat exchanger.

Accordingly, the sub condenser condenses the working fluid in the third passage. Therefore, plural thermosiphon circuits can be easily mounted in a vehicle without providing a configuration for supplying the cold energy supply medium to the third thermosiphon circuit. Thus, the machine temperature control device can improve efficiency and flexibility for being mounted in a vehicle.

Further, the cold energy supplied from the cold energy supply medium of the main condenser can be distributed to the third thermosiphon circuit by the sub condenser to cool the third target device. Therefore, the number of components can be reduced to form the machine temperature control device to simplify the structure.

Moreover, the sub condenser can make the temperature of the working fluid flowing through the lower heat exchanger and the temperature of the working fluid flowing through the third heat exchanger to be close to each other. Therefore, the temperatures of the first to third target devices can be controlled approximately uniformly.

According to the third aspect, a machine temperature control device for controlling temperature of plural target devices includes a first thermosiphon circuit, a second thermosiphon circuit, a main condenser, and a sub condenser. The first thermosiphon circuit includes a first evaporator configured to cool a first target device by a latent heat of evaporation of a working fluid that absorbs a heat from the first target device, and a first passage communicating with the first evaporator. The second thermosiphon circuit includes a second evaporator configured to cool a second target device by a latent heat of evaporation of a working fluid that absorbs a heat from the second target device, and a second passage communicating with the second evaporator. The main condenser includes a first heat exchanger provided in the first passage and is configured to exchange the heat between the working fluid flowing through the first heat exchanger and a predetermined cold energy supply medium. The sub condenser is disposed below the main condenser in the gravitational direction to include a lower heat exchanger provided below the first heat exchanger in the gravitational direction in the first passage and a second heat exchanger provided in the second passage, to exchange heat between the working fluid flowing through the lower heat exchanger and the working fluid flowing through the second heat exchanger.

Accordingly, the sub condenser condenses the working fluid in the thermosiphon circuits except for the first thermosiphon circuit. Therefore, plural thermosiphon circuits can be easily mounted in a vehicle without providing a configuration for supplying the cold energy supply medium to the thermosiphon circuits except for the first thermosiphon circuit. That is, if the number of batteries mounted in the vehicle, depending on the kind of vehicle, is increased or decreased, and if the number of thermosiphon circuits is correspondingly increased or decreased, the passages of the thermosiphon circuits can be arranged in the sub condenser, so as to reduce the design workload in accordance with the kind of vehicle. Thus, the machine temperature control device can improve efficiency and flexibility for being mounted in a vehicle.

Further, the cold energy supplied from the cold energy supply medium of the main condenser can be distributed to the plural thermosiphon circuits by the sub condenser to cool the plural target devices. Therefore, the number of components can be reduced to form the machine temperature control device to simplify the structure.

Moreover, the sub condenser can make the temperature of the working fluid flowing through the first passage and the temperature of the working fluid flowing through the second passage to be close to each other. Therefore, the temperatures of the plural target devices can be controlled approximately uniformly.

According to the fourth aspect, the first passage of the first thermosiphon circuit includes a first forward passage, a first return passage, and a bypass passage. In the first forward passage, the working fluid condensed by the main condenser flows to the first evaporator through the sub condenser. In the first return passage, the working fluid evaporated by the first evaporator flows to the main condenser without passing through the sub condenser. The bypass passage has one end communicated with a portion of the first forward passage between the main condenser and the sub condenser and the other end communicated with the first return passage or the main condenser.

When the working fluid flowing in the first forward passage evaporates in the sub condenser, the gas phase working fluid flows from the bypass passage to the first return passage or the main condenser. Therefore, the liquid phase working fluid condensed in the main condenser can smoothly flow downward in the first forward passage into the sub condenser without being affected by the gas phase working fluid flowing backwards from the sub condenser.

Moreover, abnormal sound can be reduced because the gas phase working fluid flowing backwards from the sub condenser is restricted from bursting in the first forward passage when the gas phase working fluid flows from the first forward passage to the bypass passage.

According to the fifth aspect, the machine temperature control device has the main condenser which is defined as a first main condenser, and further includes a second main condenser disposed below the first main condenser in the gravitational direction. The second main condenser including an intermediate heat exchanger disposed below the first heat exchanger in the gravitational direction in the first passage, and is configured to exchange heat between the working fluid flowing through the intermediate heat exchanger and another cold energy supply medium.

Thus, the working fluid flowing through the first passage can be cooled by the plural kinds of cold energy supply medium. Therefore, if the temperature of one cold energy supply medium is too high to cool the target device, it is possible to cool the target device by condensing the working fluid with the cold energy of the other cold energy supply medium. Since the working fluid can be sufficiently cooled by the first main condenser and the second main condenser, the working fluid in the second passage can be cooled by the sub condenser at the downstream side. Accordingly, the cooling ability of the machine temperature control device can be raised to the plural target devices.

According to the sixth aspect, the second main condenser includes the intermediate heat exchanger provided in the first passage and the second heat exchanger provided in the second passage, to exchange heat among the working fluid flowing through the intermediate heat exchanger, the working fluid flowing through the second heat exchanger, and another cold energy supply medium.

Since the second main condenser has the function of the sub condenser, the number of components can be reduced to simplify the structure, compared with a case where the second main condenser and the sub condenser are respectively provided. Moreover, the machine temperature control device can be downsized to improve the efficiency and flexibility for being mounted on a vehicle.

According to the seventh aspect, the first passage of the first thermosiphon circuit includes: a first forward passage through which the working fluid condensed by the first main condenser flows to the first evaporator through the second main condenser; a first return passage through which the working fluid evaporated by the first evaporator flows to the first main condenser without passing through the second main condenser; and a communication passage having one end communicated with a portion of the first forward passage between the first main condenser and the second main condenser and the other end communicated with the first return passage.

When the temperature of the predetermined cold energy supply medium that exchanges heat with the working fluid in the first main condenser is high, the gas phase working fluid flowing in the first forward passage passes through the communication passage without passing through the first main condenser, and can flow into the second main condenser. In this case, the working fluid can be restricted from being heated by the predetermined cold energy supply medium in the first main condenser. Therefore, the target device can be cooled using the second main condenser of the machine temperature control device when the temperature of the predetermined cold energy supply medium is high.

According to the eighth aspect, the one end of the communication passage is located at a position lower than the other end of the communication passage in the gravitational direction.

When the working fluid is condensed by the first main condenser and flows through the first forward passage in the first evaporator, the liquid phase working fluid can be restricted flowing into the communication passage. Thus, the working fluid can certainly flow from the first main condenser to the second main condenser.

According to the ninth aspect, the first passage of the first thermosiphon circuit includes a bypass passage having one end communicated with a portion of the first forward passage between the main condenser and the sub condenser, and the other end communicated with the first return passage, the main condenser, or the communication passage.

When the working fluid flowing in the first forward passage evaporates in the sub condenser, the gas phase working fluid flows from the bypass passage to the first return passage, the main condenser or the communication passage. Therefore, the liquid phase working fluid condensed in the main condenser can smoothly flow downward in the first forward passage into the sub condenser without being affected by the gas phase working fluid flowing backwards from the sub condenser. Moreover, abnormal sound can be reduced because the gas phase working fluid flowing backwards from the sub condenser is restricted from bursting in the first forward passage when the gas phase working fluid flows from the first forward passage to the bypass passage.

According to the tenth aspect, an inner diameter of a portion of the first passage between the main condenser and the sub condenser is larger than an inner diameter of another portion of the first passage between the sub condenser and the first evaporator or is larger than an inner diameter of the second passage.

When the working fluid flowing in the first passage is evaporated in the sub condenser, the gas phase working fluid flows in the large diameter portion of the first passage to the main condenser. Therefore, the liquid phase working fluid condensed in the main condenser can smoothly flow downward in the first forward passage into the sub condenser without being affected by the gas phase working fluid flowing backwards from the sub condenser. Thus, the cooling ability of the machine temperature control device for cooling the target device can be raised.

What is claimed is:

1. A machine temperature control device for controlling a temperature of a plurality of target devices, the machine temperature control device comprising:
   a first thermosiphon circuit that includes a first evaporator configured to cool a first target device by a latent heat of evaporation of a working fluid that absorbs a heat from the first target device, and a first passage communicating with the first evaporator;
   a second thermosiphon circuit that includes a second evaporator configured to cool a second target device by a latent heat of evaporation of a working fluid that absorbs a heat from the second target device, and a second passage communicating with the second evaporator;
   a main condenser that includes a first heat exchanger provided in the first passage and a second heat exchanger provided in the second passage, and is configured to allow the working fluid flowing through the first heat exchanger, the working fluid flowing through the second heat exchanger, and a predetermined cold energy supply medium to exchange heat with each other;

a third thermosiphon circuit that includes a third evaporator configured to cool a third target device by a latent heat of evaporation of a working fluid that absorbs a heat from the third target device, and a third passage communicating with the third evaporator; and a sub condenser disposed below the main condenser in the gravitational direction, the sub condenser including a lower heat exchanger provided in the first passage below the first heat exchanger in the gravitational direction and a third heat exchanger disposed in the third passage, to exchange heat between the working fluid flowing through the lower heat exchanger and the working fluid flowing through the third heat exchanger.

2. A machine temperature control device for controlling a temperature of a plurality of target devices, the machine temperature control device comprising:

a first thermosiphon circuit that includes a first evaporator configured to cool a first target device by a latent heat of evaporation of a working fluid that absorbs a heat from the first target device, and a first passage communicating with the first evaporator;

a second thermosiphon circuit that includes a second evaporator configured to cool a second target device by a latent heat of evaporation of a working fluid that absorbs a heat from the second target device, and a second passage communicating with the second evaporator;

a main condenser that includes a first heat exchanger provided in the first passage to exchange heat between the working fluid flowing through the first heat exchanger and a predetermined cold energy supply medium; and a sub condenser disposed below the main condenser in the gravitational direction, wherein the sub condenser includes a lower heat exchanger provided in the first passage below the first heat exchanger in the gravitational direction and a second heat exchanger provided in the second passage, to exchange heat between the working fluid flowing through the lower heat exchanger and the working fluid flowing through the second heat exchanger.

3. The machine temperature control device according to claim 2, wherein the first passage of the first thermosiphon circuit includes:

a first forward passage through which the working fluid condensed by the main condenser flows to the first evaporator through the sub condenser;

a first return passage through which the working fluid evaporated by the first evaporator flows to the main condenser without passing through the sub condenser, and a bypass passage having one end communicated with a portion of the first forward passage between the main condenser and the sub condenser and the other end communicated with the first return passage or the main condenser.

4. The machine temperature control device according to claim 2, wherein the main condenser is defined as a first main condenser, the machine temperature control device further comprising:

a second main condenser disposed below the first main condenser in the gravitational direction, the second main condenser including an intermediate heat exchanger disposed in the first passage below the first heat exchanger in the gravitational direction, to exchange heat between the working fluid flowing through the intermediate heat exchanger and another cold energy supply medium.

5. The machine temperature control device according to claim 4, wherein the second main condenser includes the intermediate heat exchanger provided in the first passage and the second heat exchanger provided in the second passage, to exchange heat among the working fluid flowing through the intermediate heat exchanger, the working fluid flowing through the second heat exchanger, and another cold energy supply medium.

6. The machine temperature control device according to claim 4, wherein the first passage of the first thermosiphon circuit includes:

a first forward passage through which the working fluid condensed by the first main condenser flows to the first evaporator through the second main condenser;

a first return passage through which the working fluid evaporated by the first evaporator flows to the first main condenser without passing through the second main condenser; and a communication passage having one end communicated with a portion of the first forward passage between the first main condenser and the second main condenser and the other end communicated with the first return passage.

7. The machine temperature control device according to claim 6, wherein the one end of the communication passage is located at a position lower than the other end of the communication passage in the gravitational direction.

8. The machine temperature control device according to claim 6, wherein the first passage of the first thermosiphon circuit includes a bypass passage having one end communicated with a portion of the first forward passage between the main condenser and the sub condenser, and the other end communicated with the first return passage, the main condenser, or the communication passage.

9. The machine temperature control device according to claim 2, wherein an inner diameter of a portion of the first passage between the main condenser and the sub condenser is larger than an inner diameter of another portion of the first passage between the sub condenser and the first evaporator or is larger than an inner diameter of the second passage.

* * * * *